US012013354B2

(12) United States Patent
Yao et al.

(10) Patent No.: US 12,013,354 B2
(45) Date of Patent: Jun. 18, 2024

(54) DIAMOND ANVIL CELL HAVING AN INTEGRATED SENSOR

(71) Applicant: The Regents of the University of California, Oakland, CA (US)

(72) Inventors: Norman Ying Yao, Berkeley, CA (US); Raymond Jeanloz, Berkeley, CA (US); Thomas Mittiga, Berkeley, CA (US); Prabudhya Bhattacharyya, Berkeley, CA (US); Thomas J. Smart, Berkeley, CA (US); Francisco Machado, Berkeley, CA (US); Bryce Kobrin, Berkeley, CA (US); Soonwon Choi, Berkeley, CA (US); Joel Moore, Berkeley, CA (US); Satcher Hsieh, Berkeley, CA (US); Chong Zu, Berkeley, CA (US)

(73) Assignee: The Regent of the University of California, Oakland, CA (US)

( * ) Notice: Subject to any disclaimer, the term of this patent is extended or adjusted under 35 U.S.C. 154(b) by 327 days.

(21) Appl. No.: 17/312,893

(22) PCT Filed: Dec. 19, 2019

(86) PCT No.: PCT/US2019/067503
§ 371 (c)(1),
(2) Date: Jun. 10, 2021

(87) PCT Pub. No.: WO2020/132257
PCT Pub. Date: Jun. 25, 2020

(65) Prior Publication Data
US 2022/0011249 A1 Jan. 13, 2022

Related U.S. Application Data

(60) Provisional application No. 62/782,262, filed on Dec. 19, 2018.

(51) Int. Cl.
*G01N 23/20041* (2018.01)
*C01B 32/28* (2017.01)
(Continued)

(52) U.S. Cl.
CPC ....... *G01N 23/20041* (2013.01); *C01B 32/28* (2017.08); *G01N 3/12* (2013.01); *G01R 33/46* (2013.01); *G01N 2203/0488* (2013.01)

(58) Field of Classification Search
None
See application file for complete search history.

(56) References Cited

U.S. PATENT DOCUMENTS 5,295,402 A * 3/1994 Bovenkerk .............. G01N 3/40
425/77
9,194,824 B1 * 11/2015 Qian ................ G01N 23/20041
(Continued)

FOREIGN PATENT DOCUMENTS

DE 10014048 A1 * 10/2001 ............. G01K 7/003

*Primary Examiner* — Rodney E Fuller
(74) *Attorney, Agent, or Firm* — Venable LLP; Henry J. Daley

(57) ABSTRACT

A pressure chamber has a chamber wall. The chamber wall includes a sensor integrated within the chamber wall, wherein the sensor integrated in the chamber wall comprises defects. A method of determining an effect of pressure on a material is further described. The method includes applying pressure to a material within a pressure chamber and to a pressure chamber wall of the pressure chamber, where the pressure chamber wall has defects. A signal from the defects is sensed while the material and the pressure chamber wall are under pressure. A property of the material is determined based on the sensed signal.

16 Claims, 38 Drawing Sheets

(51) Int. Cl.
*G01N 3/12* (2006.01)
*G01R 33/46* (2006.01)

(56) References Cited

U.S. PATENT DOCUMENTS

| | | | |
|---|---|---|---|
| 10,459,041 B2* | 10/2019 | Hahn | G01R 33/032 |
| 10,677,953 B2* | 6/2020 | Stetson | G01V 3/101 |
| 2011/0129614 A1* | 6/2011 | Pauzauskie | C01B 33/1585 |
| | | | 252/500 |
| 2016/0365705 A1* | 12/2016 | Wang | H01S 5/32341 |

* cited by examiner

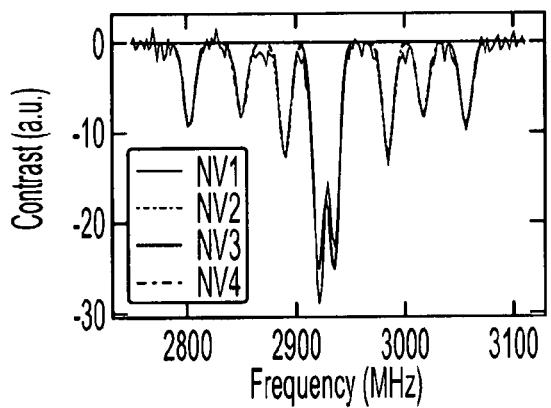
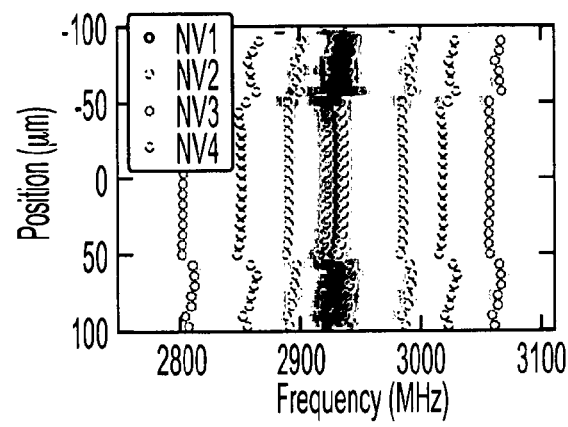
FIG. 10A    FIG. 10B
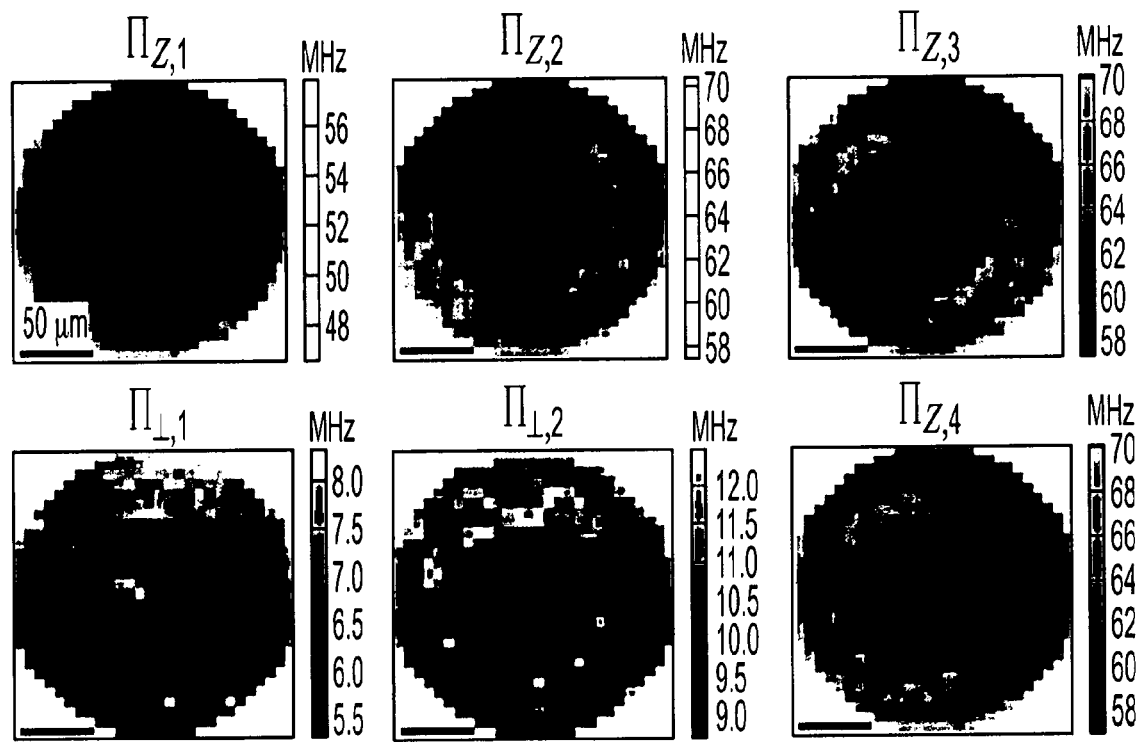
FIG. 10C

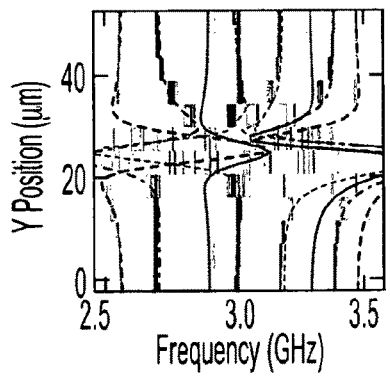
FIG. 31A
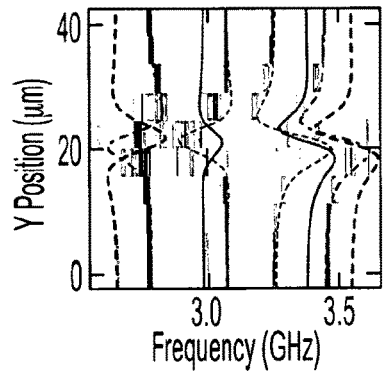
FIG. 31B
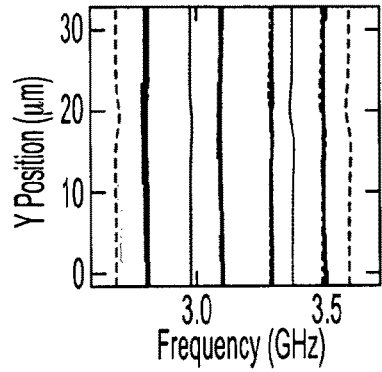
FIG. 31C
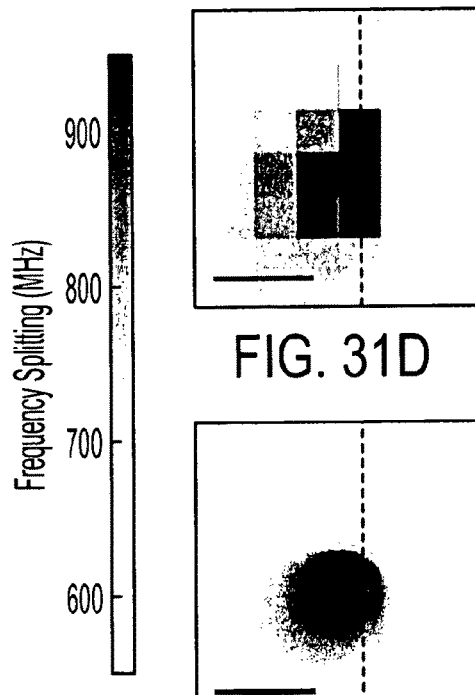
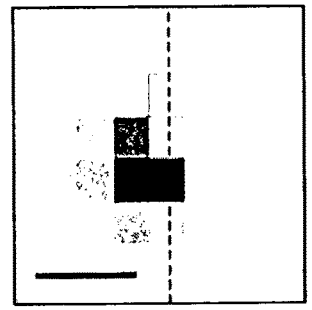
FIG. 31D
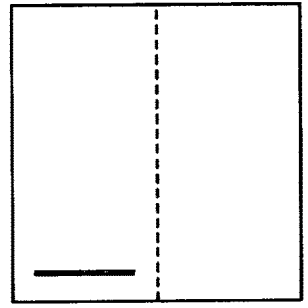
FIG. 31E
FIG. 31F
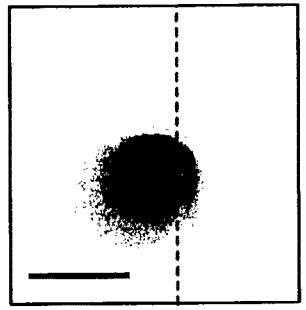
FIG. 31G
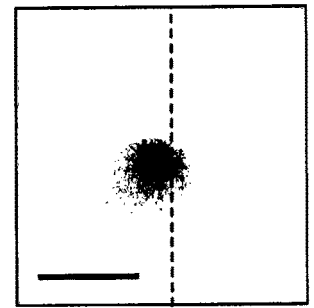
FIG. 31H
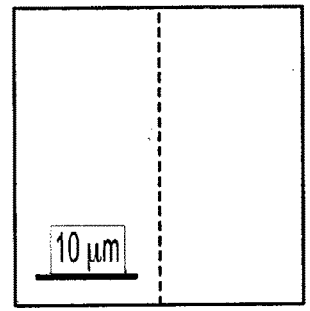
FIG. 31I

DIAMOND ANVIL CELL HAVING AN INTEGRATED SENSOR

RELATED APPLICATIONS

This application is a U.S. National Stage Application under 35 U.S.C. § 371 of PCT/US2019/067503, filed Dec. 19, 2019, which claims the benefit of U.S. Provisional Patent Application No. 62/782,262 filed Dec. 19, 2018, the entire contents of which are incorporated by reference.

FEDERAL FUNDING

This invention was made with government support under grant number DE-AC02-05CH11231 awarded by the U.S. Department of Energy and grant number 1654740 awarded by the National Science Foundation. The government has certain rights in the invention.

BACKGROUND

Technical Field

The field of the currently claimed embodiments of this invention relates to diamond anvil cells, and more particularly to diamond anvil cells that have an integrated sensor.

Discussion of Related Art

Pressure alters the physical, chemical and electronic properties of matter. The development of the diamond anvil cell (DAC) enables tabletop experiments to investigate a diverse landscape of high-pressure phenomena ranging from the properties of planetary interiors to transitions between quantum mechanical phases. A long-standing goal has been to instrument diamond anvil cells with sensors capable of in situ measurements.

SUMMARY

According to some embodiments there is provided a diamond anvil cell comprising a diamond culet. The diamond culet comprises a sensor integrated therein, wherein the sensor integrated in said diamond culet comprises at least one diamond crystal defect.

According to some embodiments there is provided a pressure chamber having a chamber wall. The chamber wall comprising a sensor integrated within the chamber wall, wherein the sensor integrated in the chamber wall comprises defects.

According to some embodiments there is provided a method of determining an effect of pressure on a material. The method includes applying pressure to a material within a pressure chamber and to a pressure chamber wall of the pressure chamber, the pressure chamber wall having defects; sensing a signal from the defects while the material and the pressure chamber wall are under pressure; and determining a property of the material based on the sensed signal.

DETAILED DESCRIPTION OF THE DRAWINGS

Further objectives and advantages will become apparent from a consideration of the description, drawings, and examples.

FIG. 10A is a typical ODMR spectrum under an applied magnetic field according to some embodiments.

FIG. 10B is a linecut indicating fitted resonance energies superimposed on a measured spectra according to some embodiments.

FIG. 10C are 2D maps of shifting and splitting parameters for each NV orientation across the culet according to some embodiments.

Figure 20:
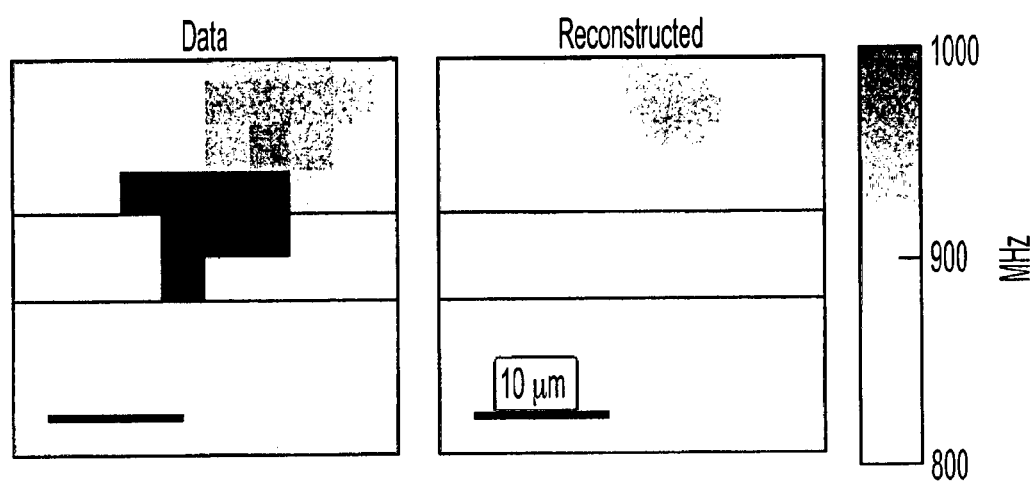

FIG. 20 illustrates a measured map of the splittings of one of the NV orientations (left) according to some embodiments. Near the top of the plot there is observed a much stronger splitting compared to the bottom of the plot. Throughout the measurement, the shift in the pressure induced a shift in the dipole moment of the sample. Three different regions (separated by horizontal lines) corresponding to 3 different dipole moment and its error were considered. The black bar corresponds to 10 µm.

Figure 21A:
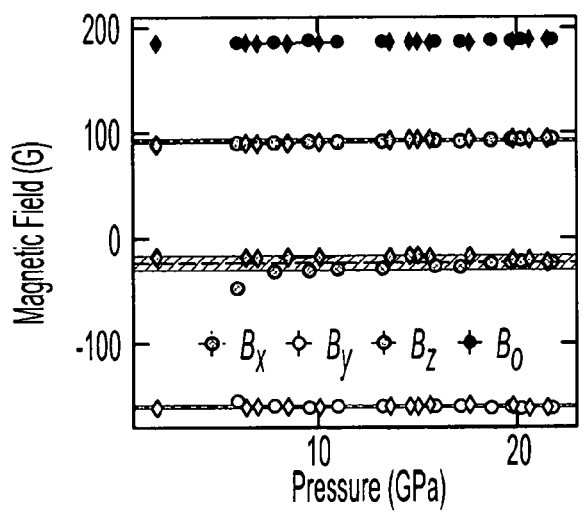
Figure 21B:
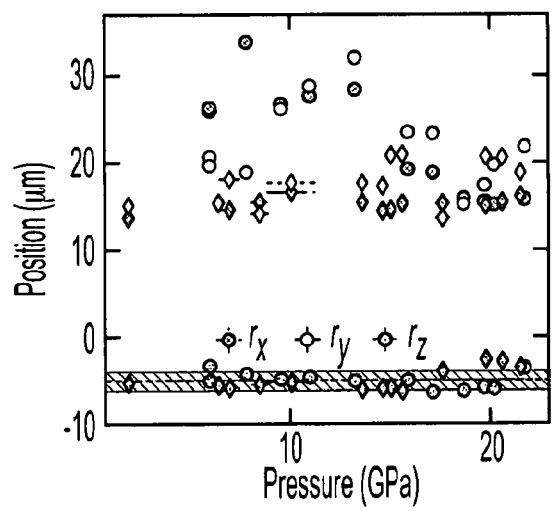
Figure 21C:
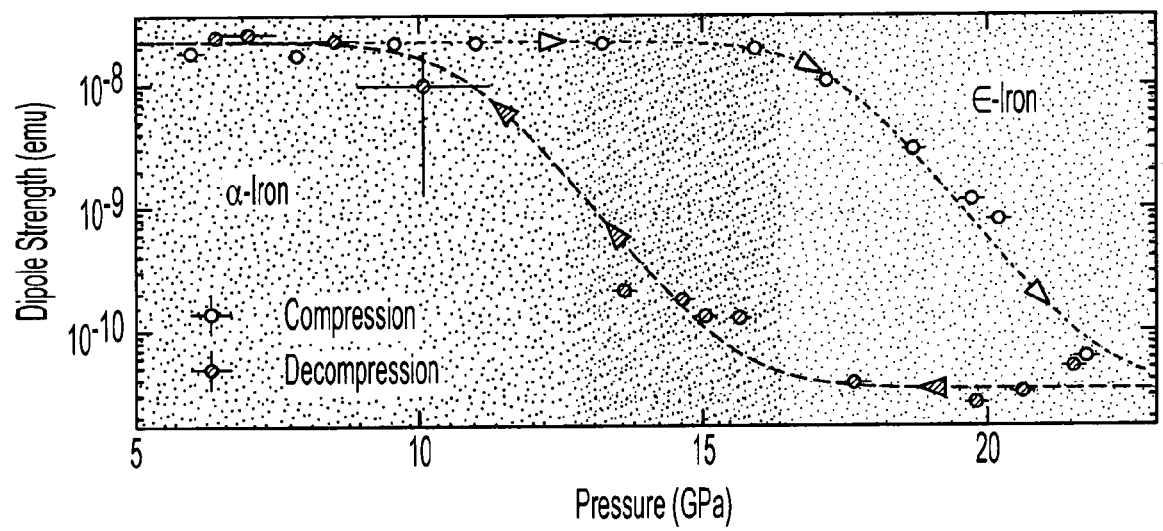

FIGS. 21A-21C illustrate magnetic field, pellet position, and dipole strength, respectively, and a result of fitting procedures when the external magnetic field and the depth of the iron pellet is allowed to vary at each pressure according to some embodiments.

Figure 22A:
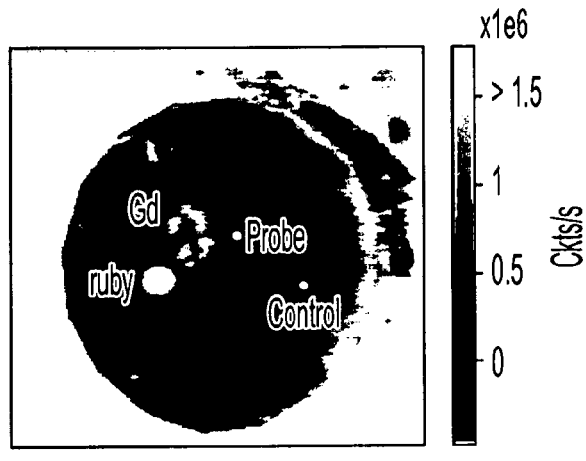

FIG. 22A shows the protocol for obtaining the P-T phase map of Gd relying on monitoring the ODMR spectrum versus temperature and pressure at a point of interest (probe) near the sample according to some embodiments. To verify that the observed signal is from the Gd flake, one can perform the same measurement on a control point further away from the sample according to some embodiments.

Figure 22B:
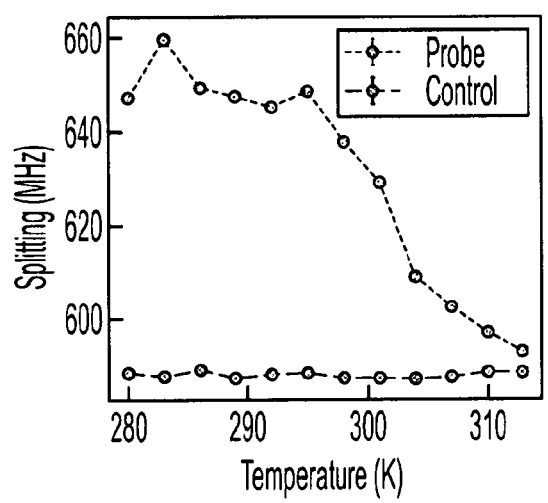

FIG. 22B shows the difference in the splitting between the probe and control points isolates the magnetic field generated by the Gd sample, which allows for monitoring the magnetic behavior of the sample according to some embodiments.

Figure 23A:
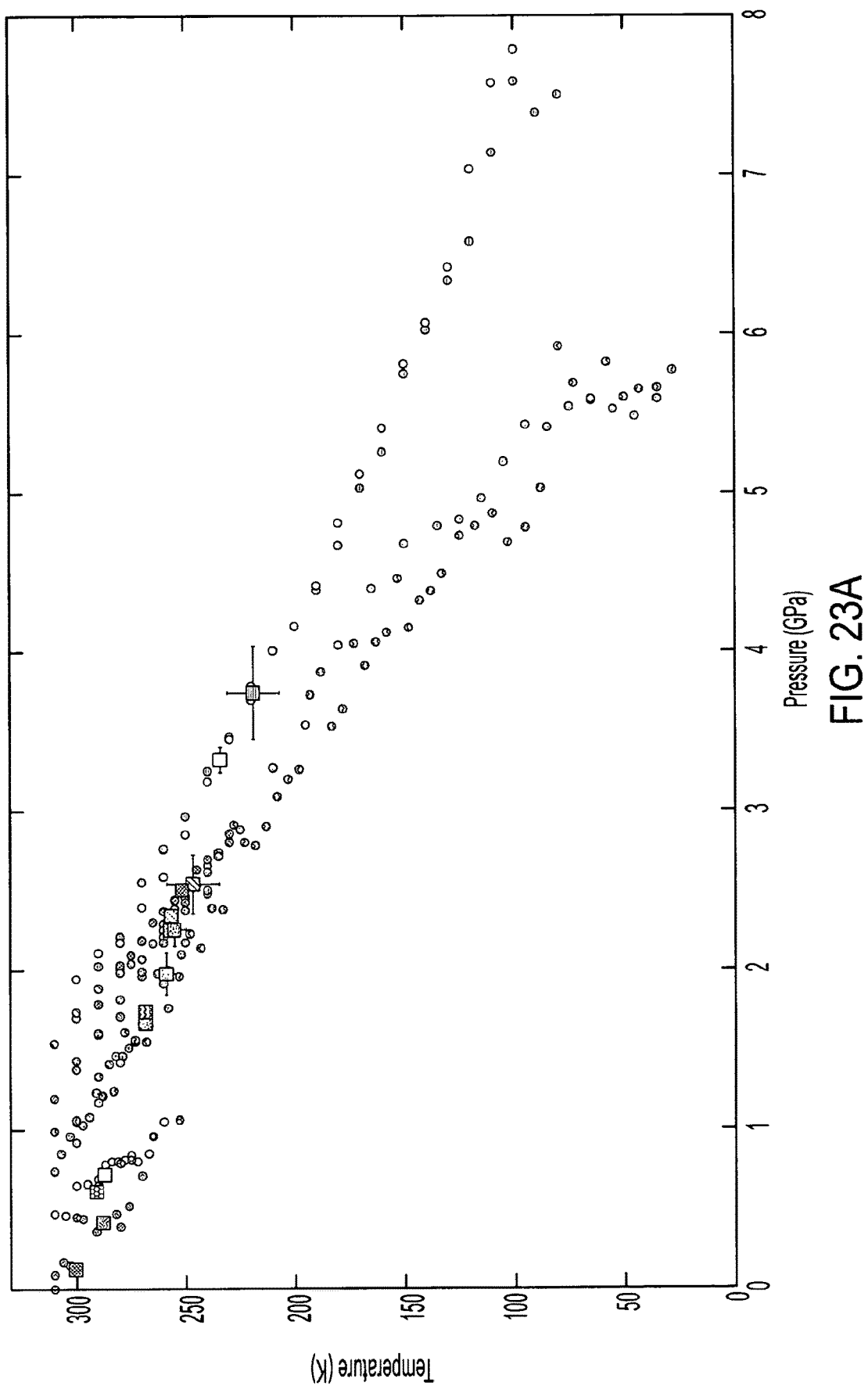

FIG. 23A shows paths in the P-T phase space that inform about the hcp PM phase to the hcp FM phase according to some embodiments. The resulting transition temperatures are highlighted with squares.

Figure 23B:
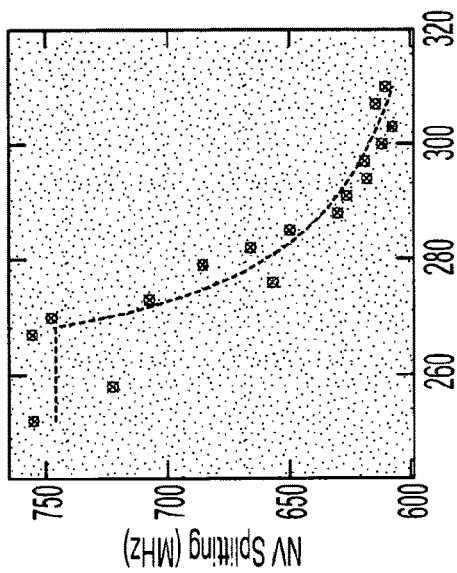
Figure 23C:
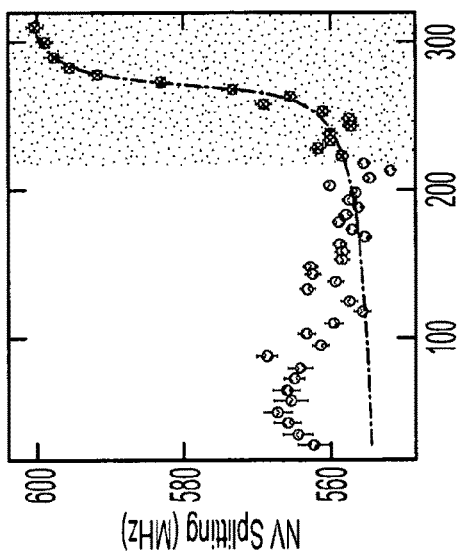
Figure 23D:
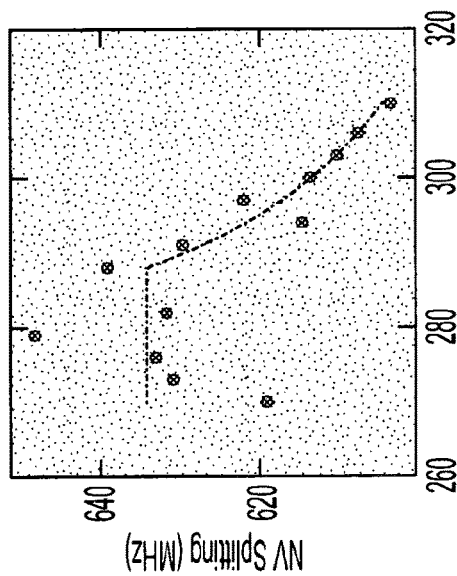
Figure 23E:
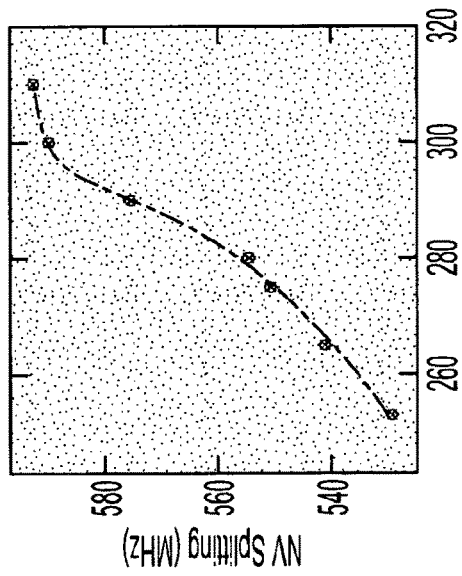
Figure 23F:
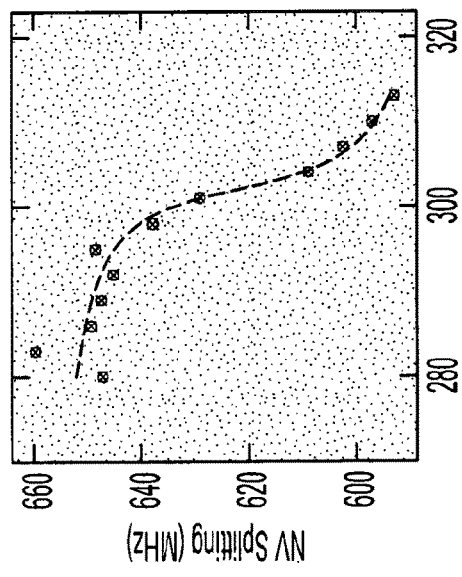
Figure 23G:
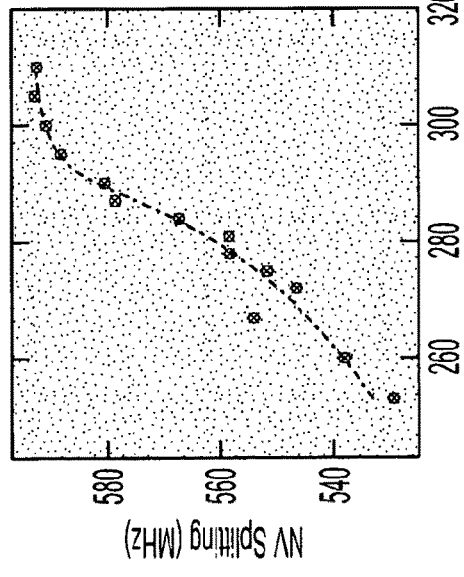
Figure 23H:
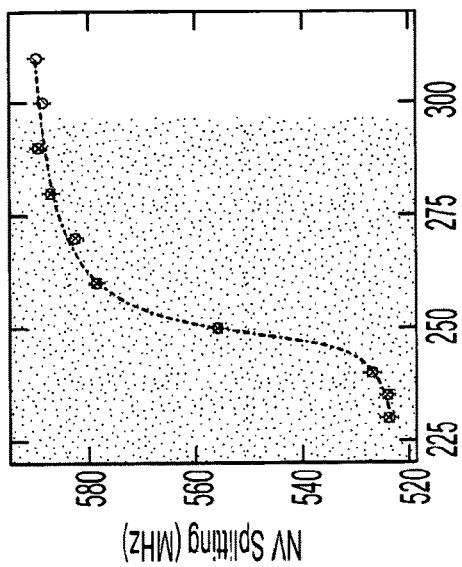
Figure 23I:
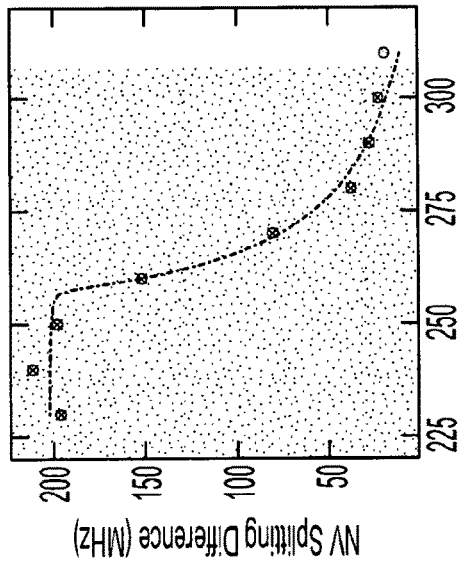
Figure 23J:
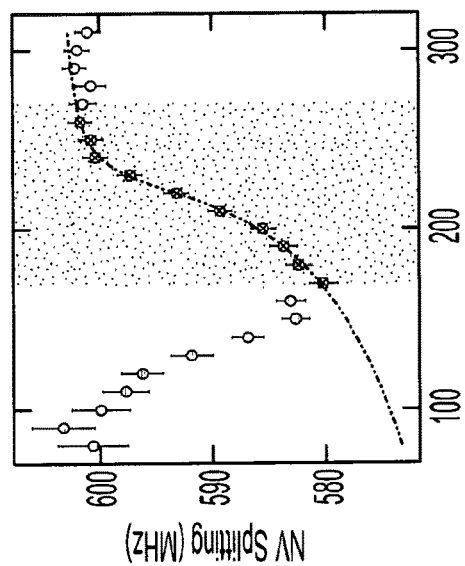
Figure 23K:
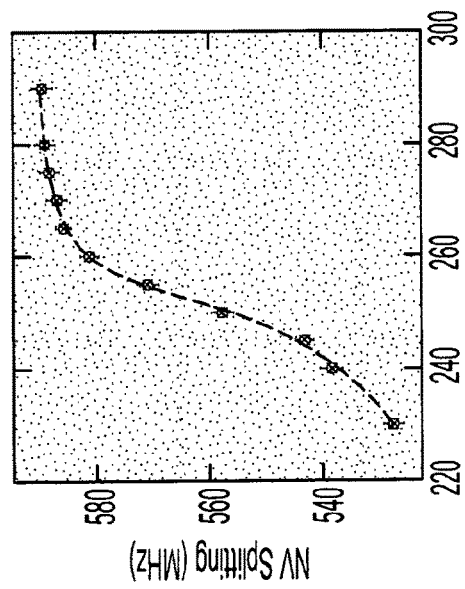
Figure 23L:
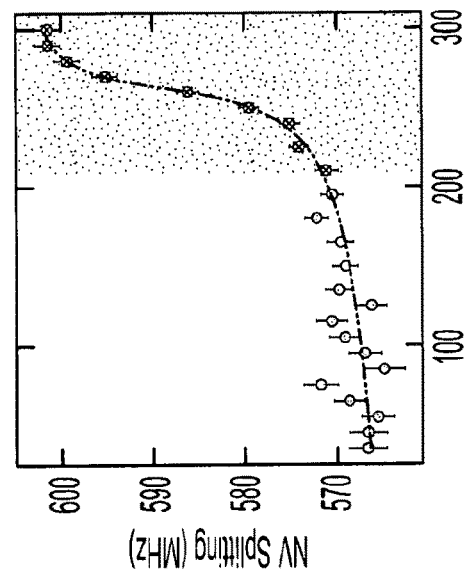
Figure 23M:
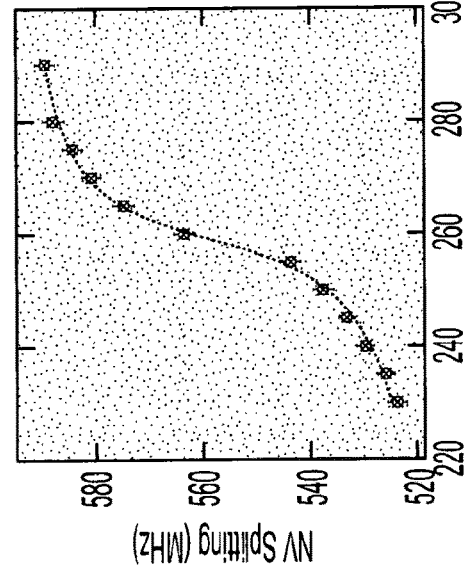
Figure 23N:
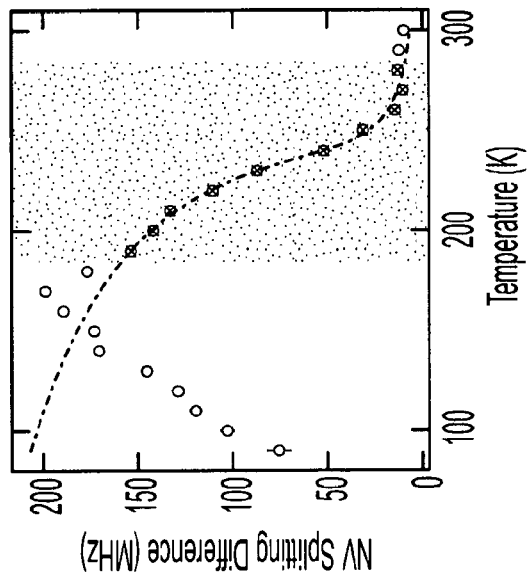
Figure 23O:
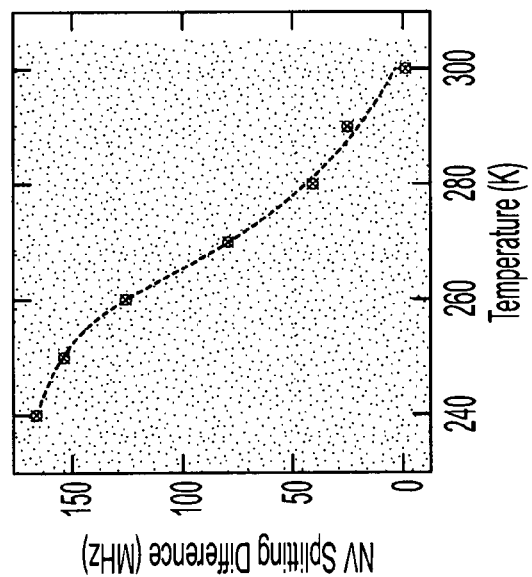

FIGS. 23B-23O illustrate measured NV splitting and corresponding fit according to some embodiments, where the shaded region corresponds to the part of the spectrum fitted.

Figure 24A:
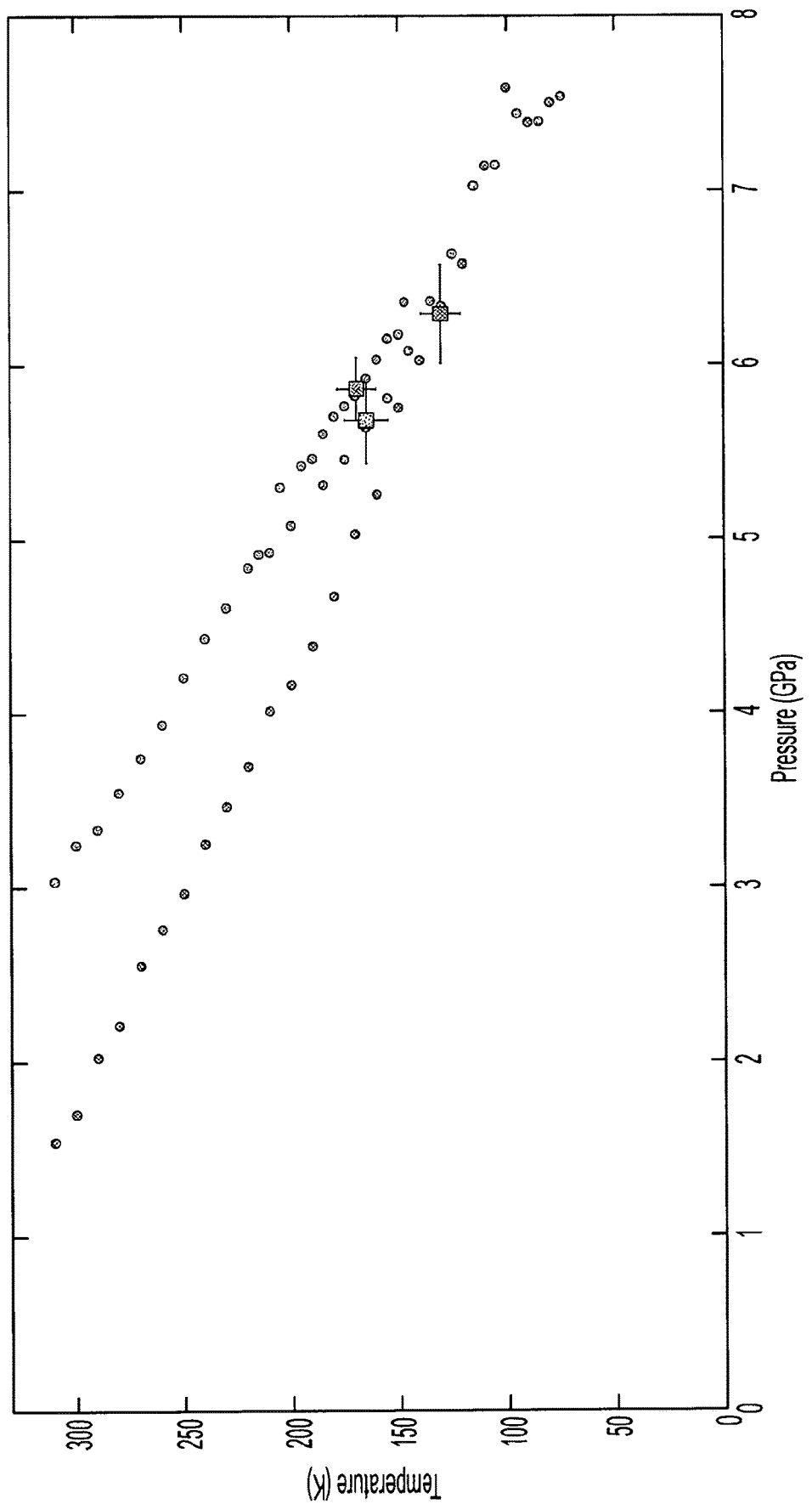

FIG. 24A shows paths in the P-T phase space that inform about the hcp PM phase to the hcp FM phase according to some embodiments. The resulting transition temperatures are highlighted with squares.

Figure 24D:
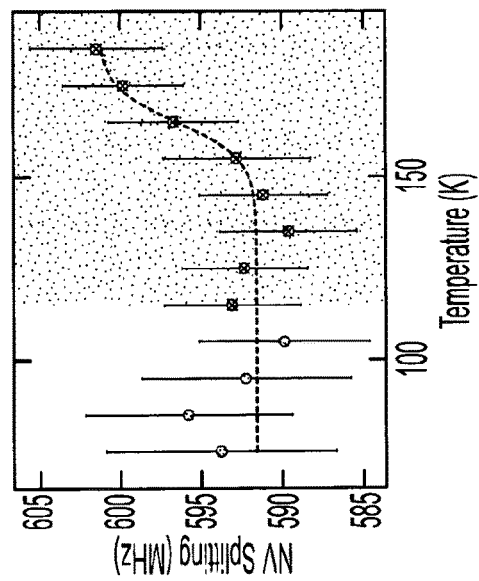
Figure 24C:
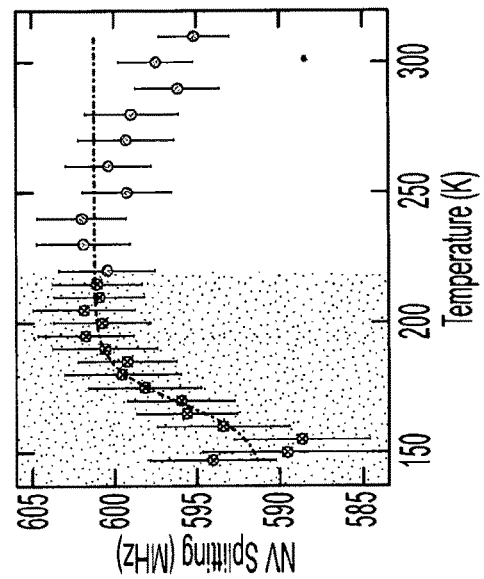
Figure 24B:
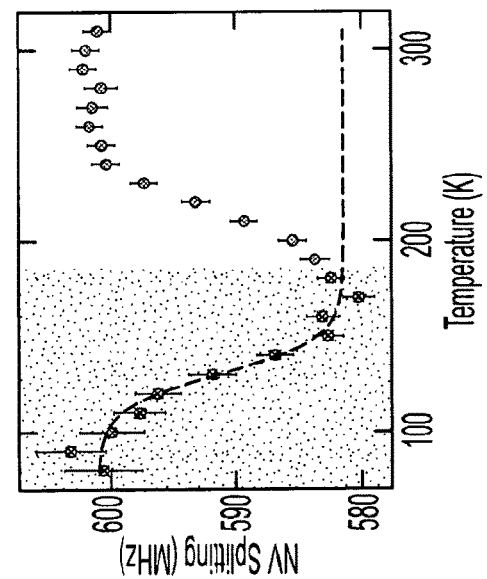

FIGS. 24B-24D illustrate measured NV splitting and corresponding fit according to some embodiments, where the shaded region corresponds to the part of the spectrum fitted. FIG. 24B is interpreted as a transition from FM hcp to PM dhcp, while FIGS. 24C and 24D as a transition from PM Sm-type to PM dhcp.

Figure 25A:
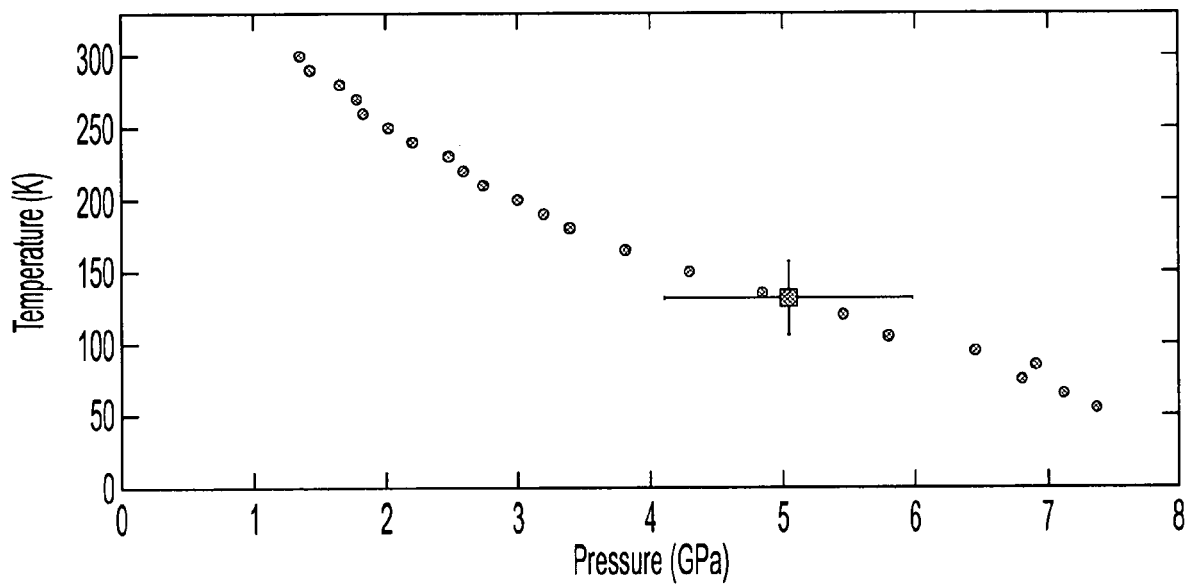

FIG. 25A illustrates a path in the P-T phase space where a signal consistent with the purported AFM transition in Sm-type Gd is seen according to some embodiments.

Figure 25B:
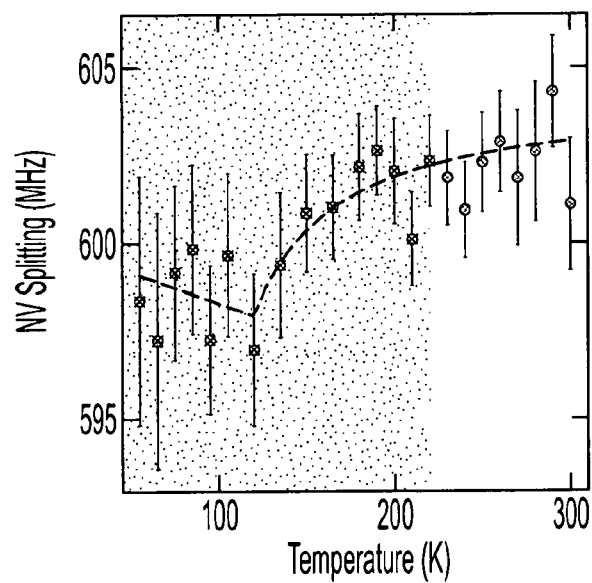

FIG. 25B illustrates measured NV splitting and corresponding fit according to some embodiments, where the shaded region corresponds to the part of the spectrum fitted.

Figure 26:
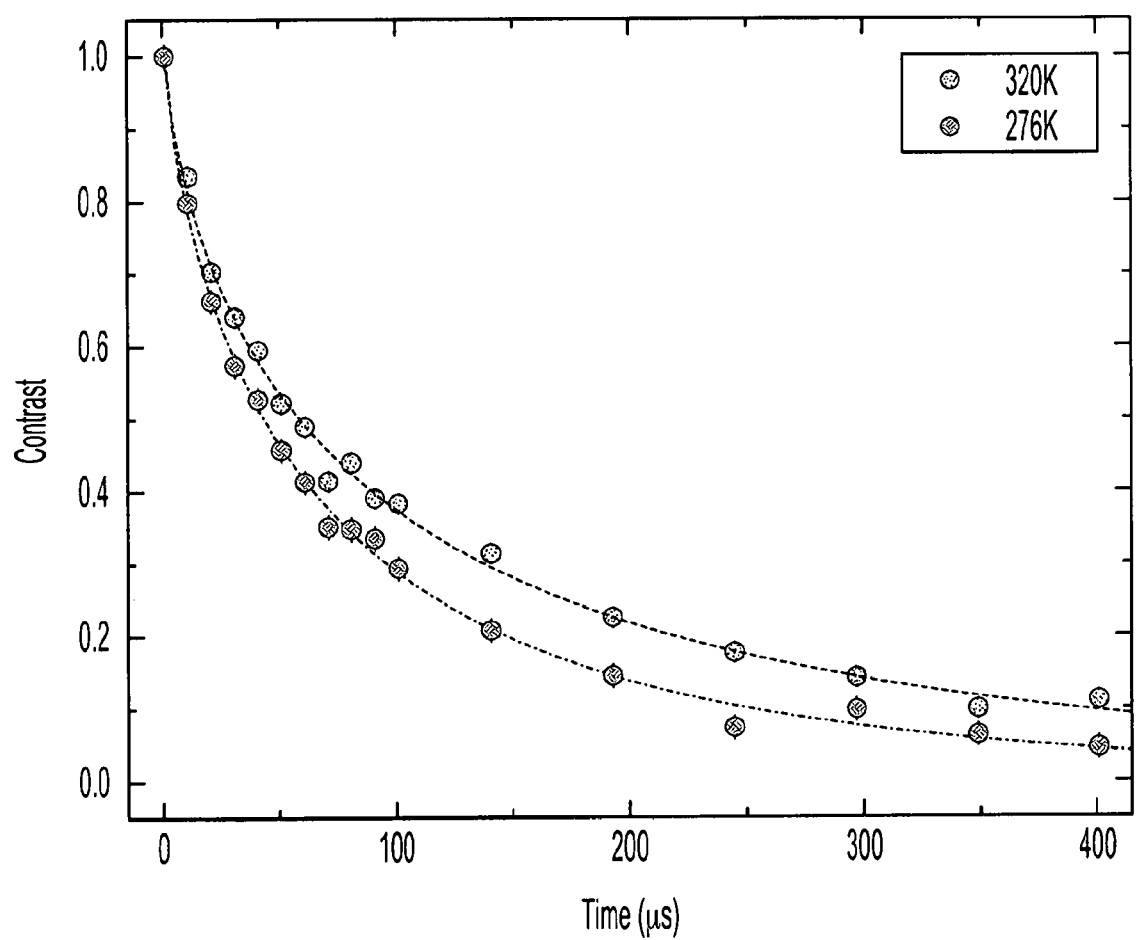

FIG. 26 shows plots of $T_1$ measurements below and above the magnetic phase transition in Gd according to some embodiments. The upper (lower) curve was measured at 320 K (276 K) and yields $T_1$=91±4 µs (66±3 µs), indicating a clear reduction of the spin polarization lifetime in the ferromagnetic phase. A stretched exponential function with exponent $\alpha$=0.6 (0.65) was used for fitting.

Figure 27:
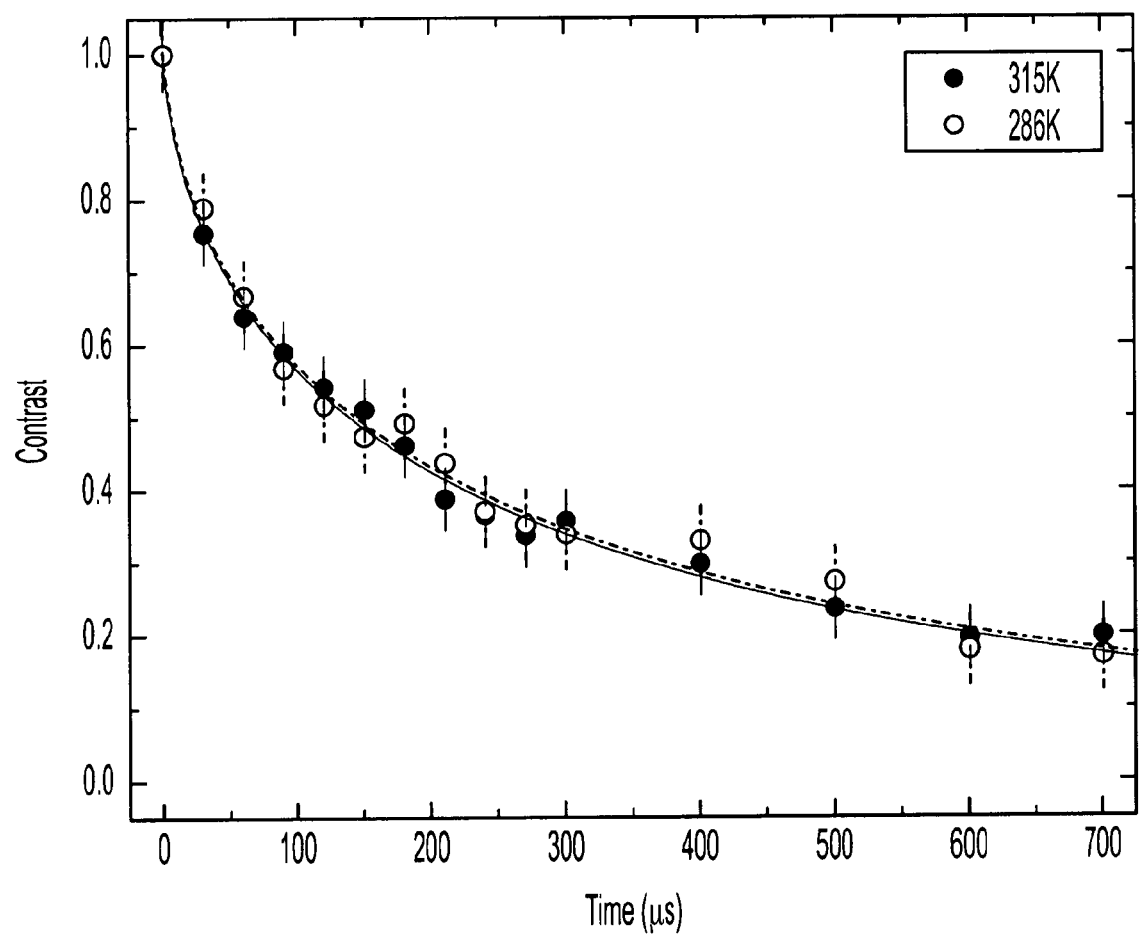

FIG. 27 shows plots of $T_1$ measurements away from the Gd flake at 315 K (darker curve) and 286 K (lighter curve), according to some embodiments. The resulting spin polarization lifetimes $T_1$=243±14 µs (315 K) and 247±20 µs (286 K) are the identical within the error bar.

Figure 28:
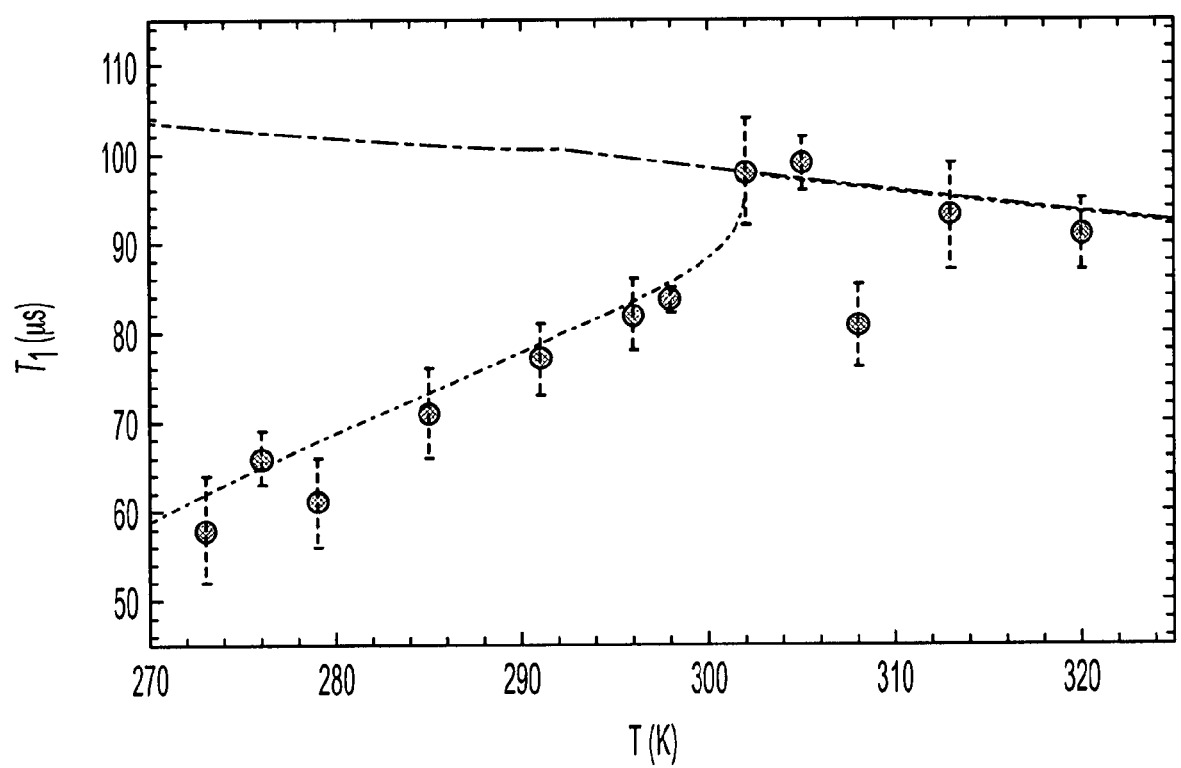

FIG. 28 shows an upper curve showing $T_1$ taking only the bulk contribution to Johnson noise into account according to some embodiments. The bottom curve shows $T_1$ taking both surface and bulk contribution into account, with $T_C$=292 K and $T_{C,s}$=302 K. The dots are experimental data.

Figure 29A:
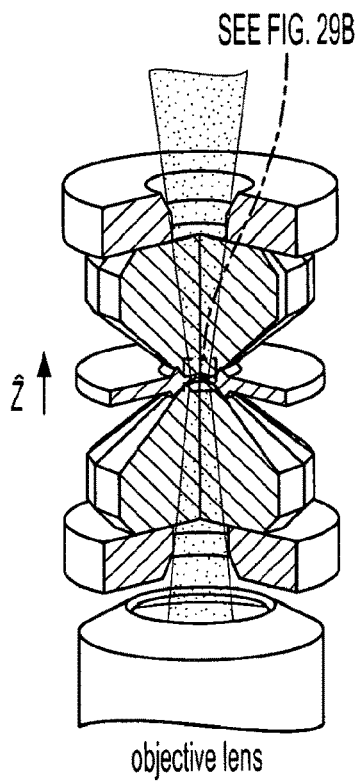

FIG. 29A is a schematic of a DAC according to some embodiments.

Figure 29B:
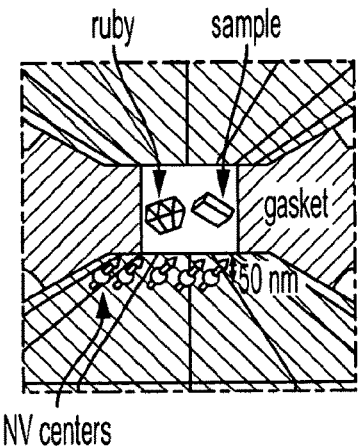

FIG. 29B is an enlarged view of the pressure chamber of the DAC of FIG. 29B.

Figure 29C:
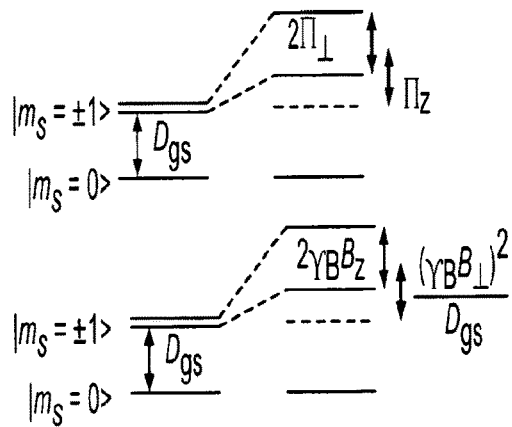

FIG. 29C illustrates the splitting of spin sublevels under stress.

Figure 29D:
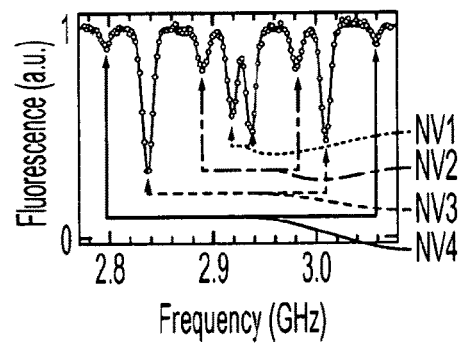

FIG. 29D illustrates an ODMR spectra from NV center ensemble under an applied magnetic field according to some embodiments.

Figure 29E:
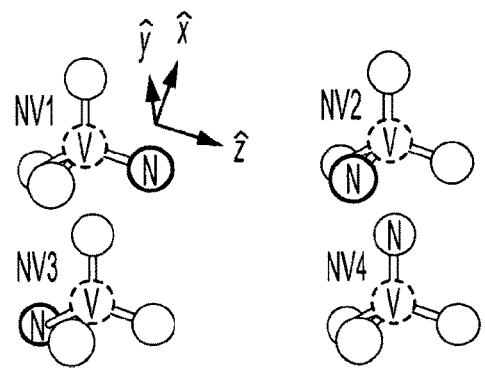

FIG. 29E illustrates four NV crystallographic orientations.

Figure 29F:
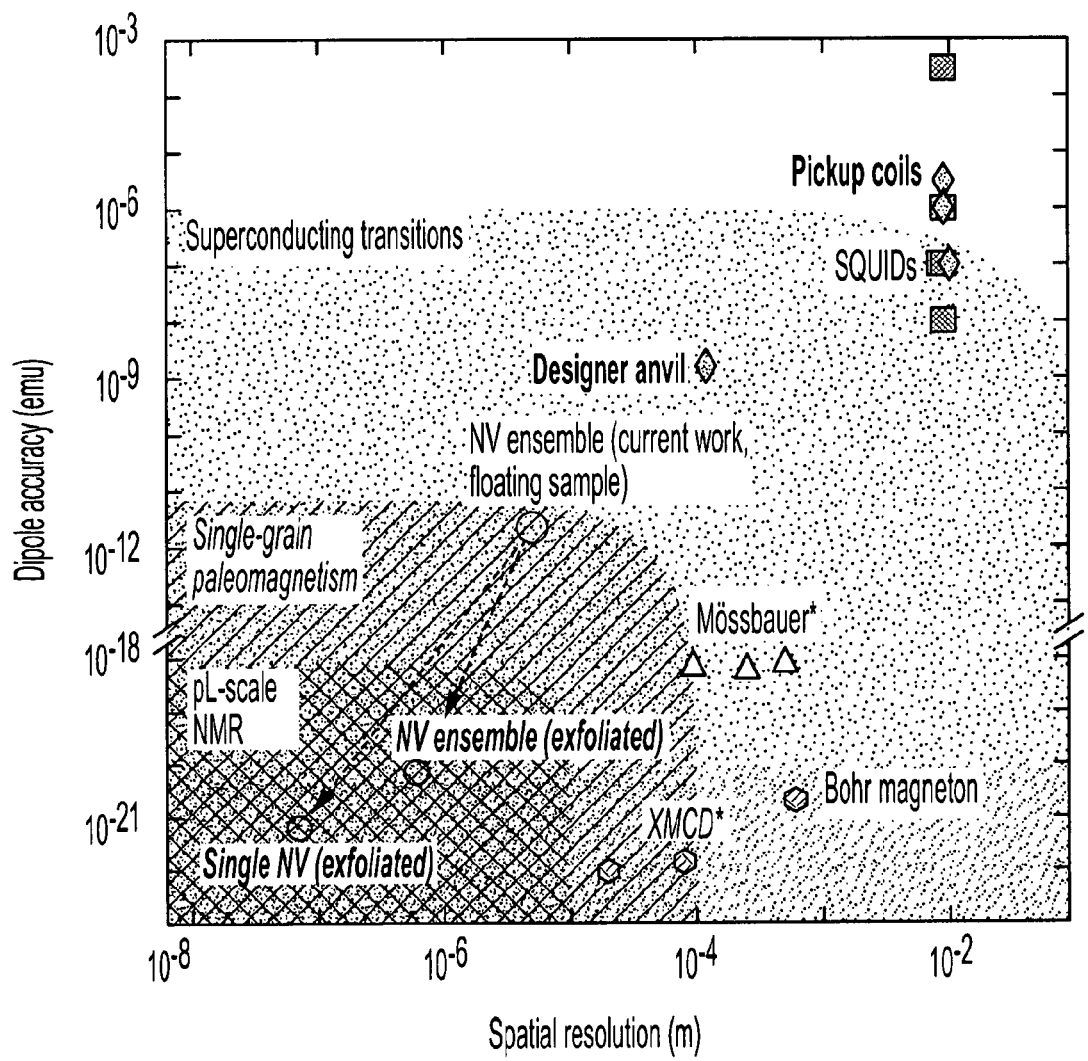

FIG. 29F illustrates a comparison of high pressure magnetometry techniques.

Figure 30A:
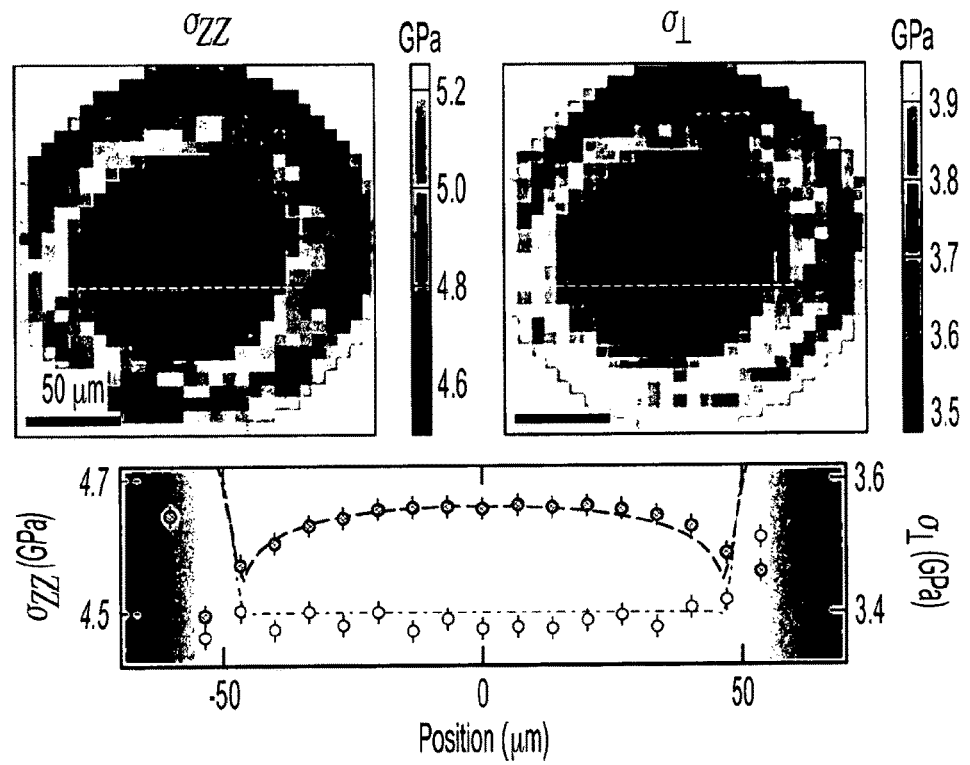

FIG. 30A illustrates spatially resolved maps of the loading stress (left) and mean lateral stress (right), $\sigma_\perp$=½($\sigma_{XX}$+$\sigma_{YY}$), across the culet surface according to some embodiments.

Figure 30B:
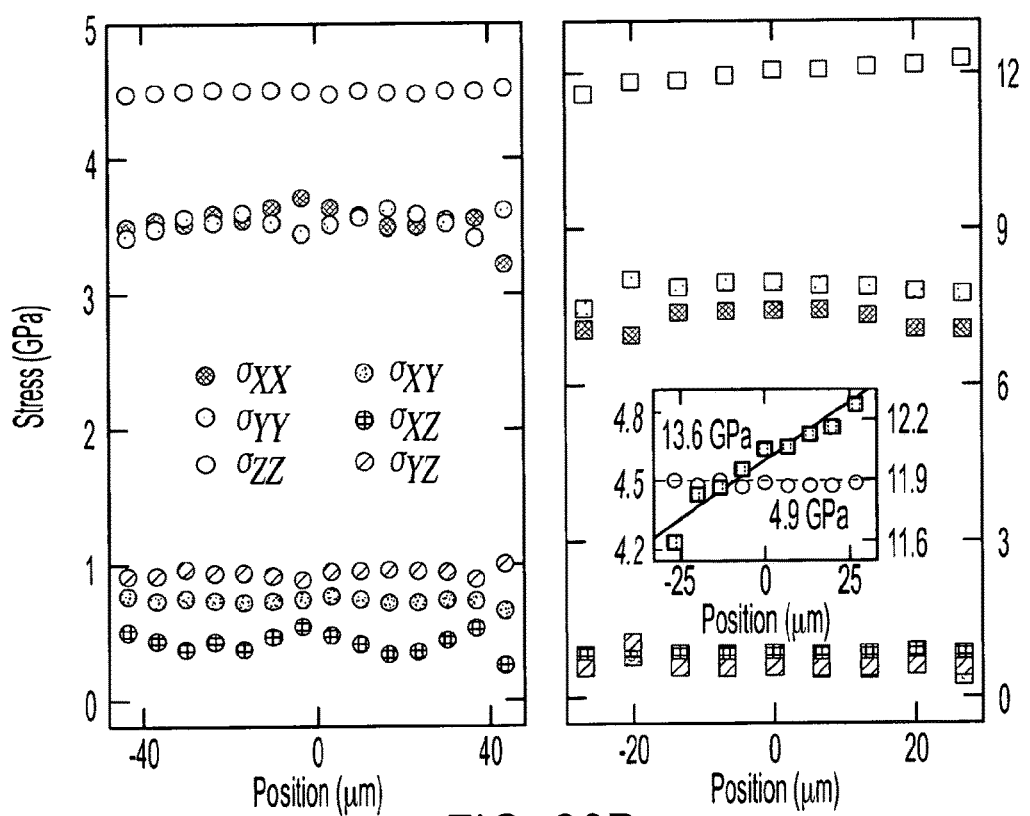

FIG. 30B illustrates a comparison of all stress tensor components in the fluid-contact region at P=4.9 GPa and P=13.6 GPa according to some embodiments.

FIGS. 31A-31C illustrate a comparison between the measured ODMR spectra and theoretical resonance positions for different pressures across vertical spatial cuts according to some embodiments.

FIGS. 31D-31F illustrates a map of the measured energy difference of a particular NV crystallographic orientation for different pressures according to some embodiments.

FIGS. 31G-31I illustrates theoretical reconstruction of the energy differences shown in FIGS. 31D-31F according to some embodiments.

Figure 31J:
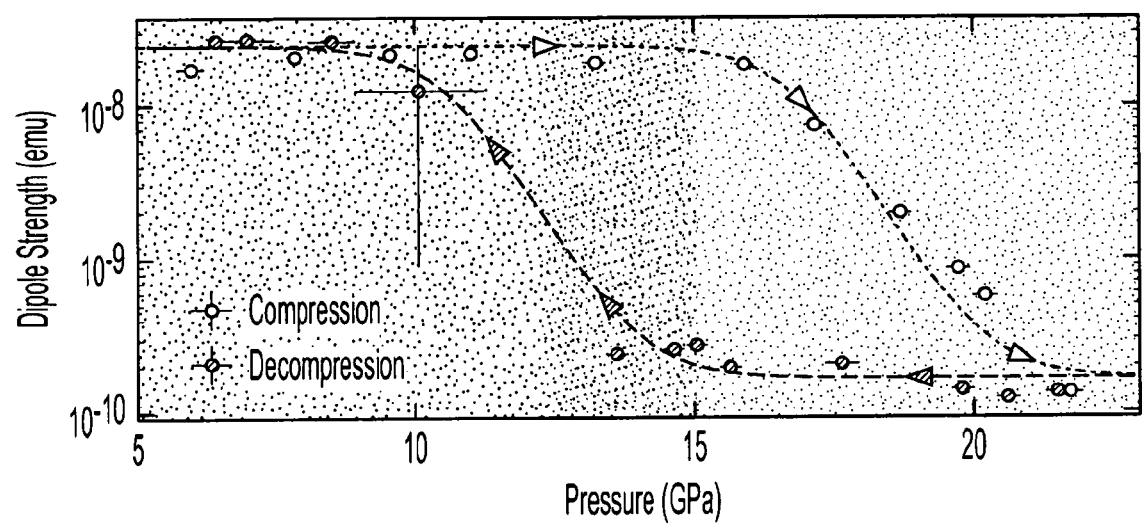

FIG. 31J illustrates a measured dipole moment of the iron pellet as a function of applied pressure at room temperature, for both compression and decompression according to some embodiments.

Figure 32A:
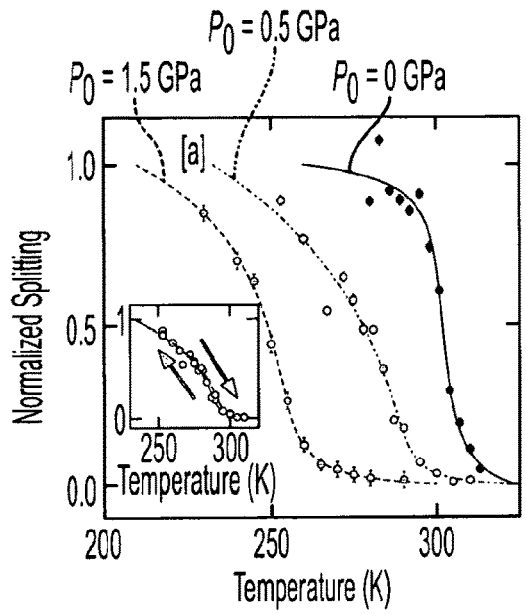

FIG. 32A illustrates normalized splitting as a function of temperature for Gd at different pressures according to some embodiments.

Figure 32B:
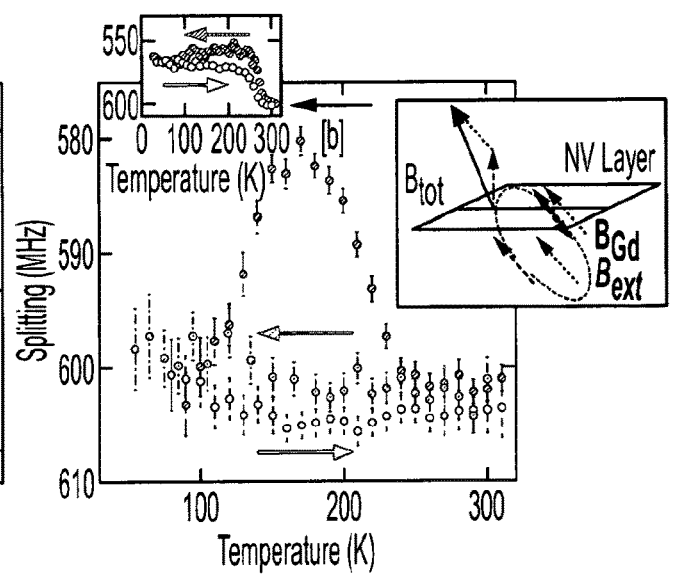

FIG. 32B illustrates splitting as a function of temperature for Gd at different pressures according to some embodiments.

Figure 32C:
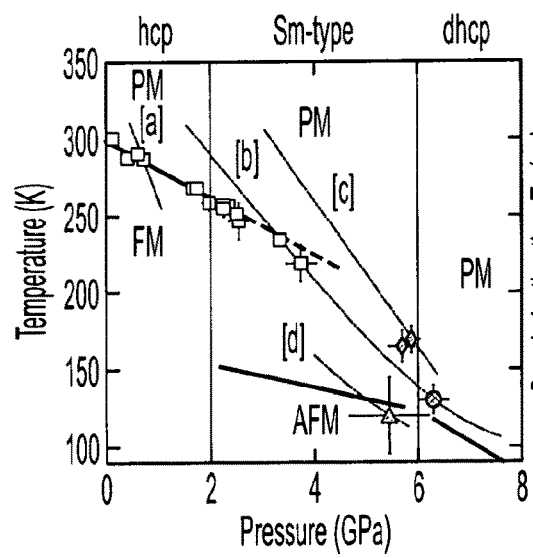

FIG. 32C illustrates a magnetic P-T phase diagram of Gd according to some embodiments.

Figure 32D:
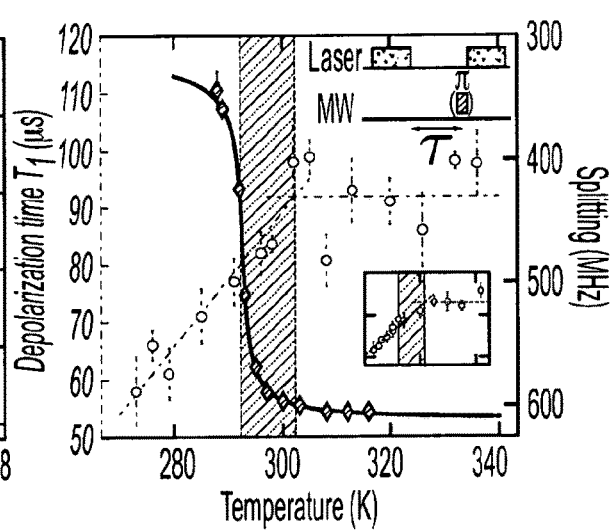

FIG. 32D illustrates splitting and depolarization time as a function of temperature for Gd according to some embodiments.

Figure 33:
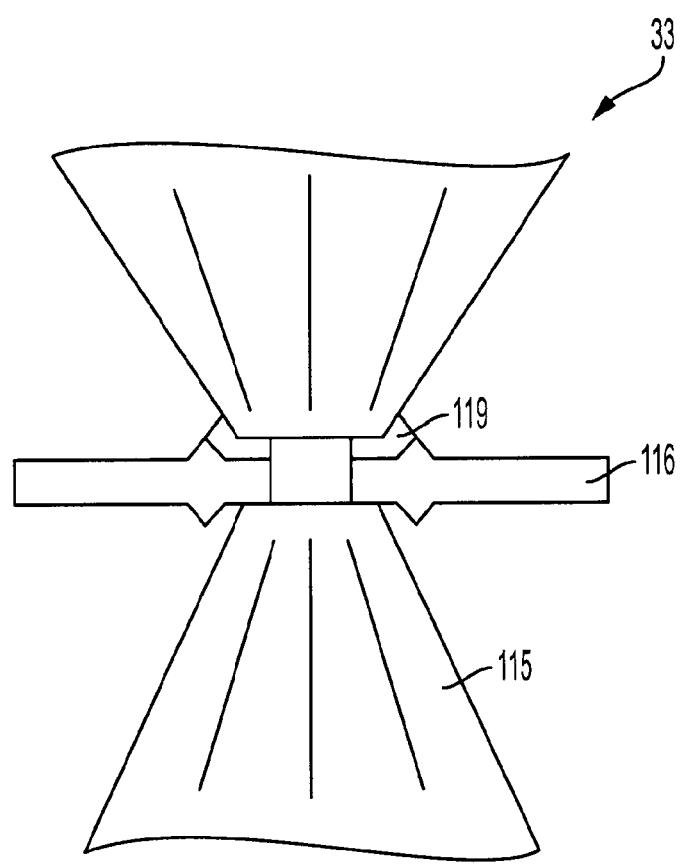

FIG. 33 illustrates a high pressure cell including an insulating material between gasket and diamond according to some embodiments.

Figure 34:
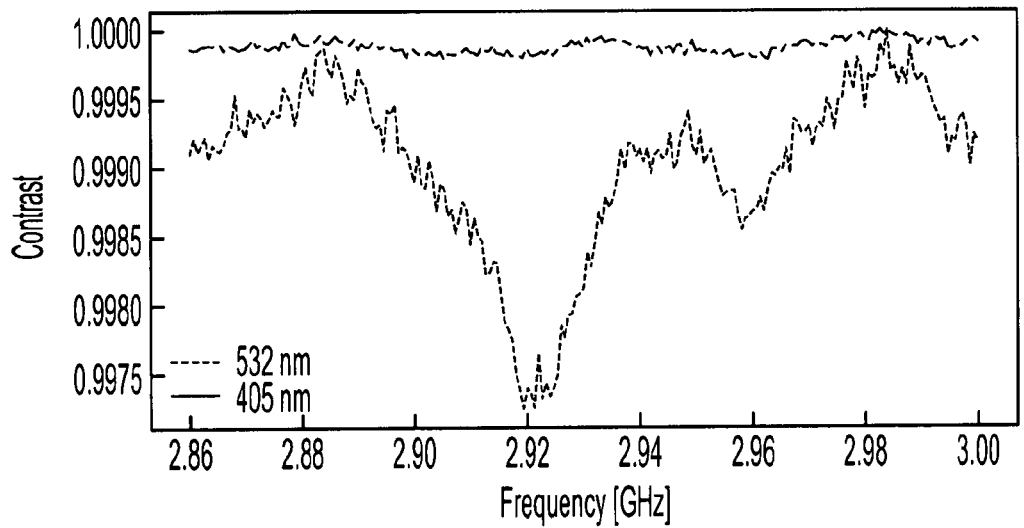

FIG. 34 illustrates a Rabi time trace using the high pressure cell of FIG. 33.

Figure 35:
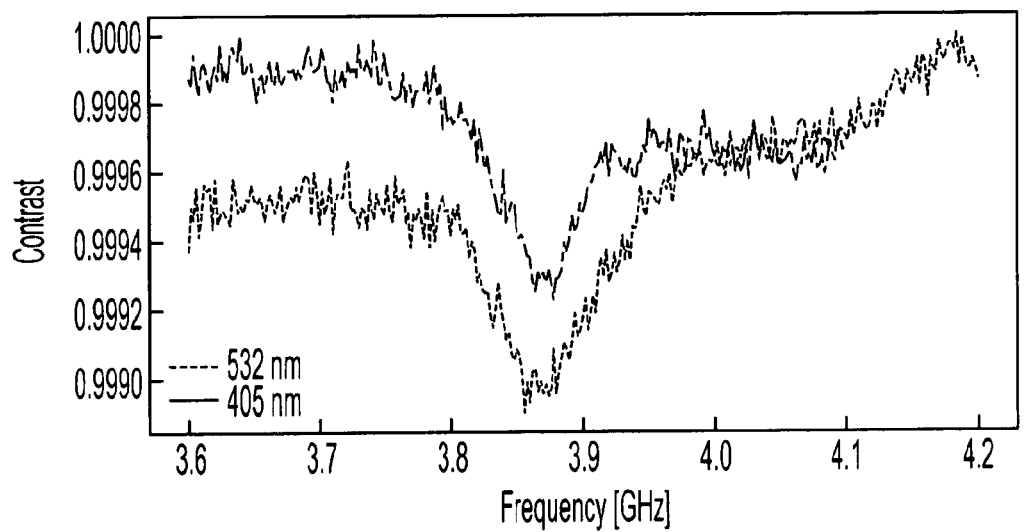

FIG. 35 illustrates a contrast of ODMR spectra using excitation energies 405 nm (upper curve) and 532 nm (lower curve) for a pressure of 4.26 GPa according to some embodiments.

Figure 36:
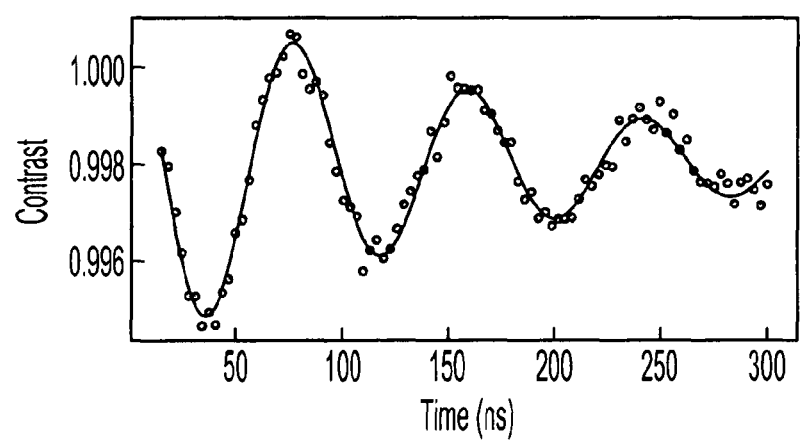

FIG. 36 illustrates a contrast of ODMR spectra using excitation energies 405 nm (upper curve) and 532 nm (lower curve) for a pressure of 103.97 GPa according to some embodiments.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

An embodiment of the current invention is directed to a novel nanoscale sensing platform, which integrates nitrogen-vacancy (NV) color centers directly into the culet (tip) of diamond anvils. This represents the first successful approach toward a long-standing goal: namely, to instrument diamond anvil cells with sensors capable of in situ measurements. A key challenge associated with this goal is the presence of enormous stress gradients generated near the sample (and culet tip), which limit the utility of most conventional tabletop spectroscopy techniques. According to some embodiments, by using an atomic-scale defect native to diamond itself, many of these challenges are overcome and there is provided a unique tool capable of directly monitoring spatially-resolved phenomena (elastic, electric, magnetic etc.) inside the high pressure chamber of DACs. We demonstrate operation of this tool at temperatures ranging from 25-340K, and pressures up to 100 GPa. The tool, according to some embodiments, is capable of performing diffraction limited imaging (with resolution ~500 nanometers) and can measure stress fields with precision less than 0.01 GPa and magnetic fields with magnetic moment precision less than 2 µT. Finally, we demonstrate that our tool, according to some embodiments, can be operated in multiple modalities. In some embodiments, it can be used to directly sense external fields using shifts of the NV center's energy levels. But more broadly, according to some embodiments, it can also be used to sense external effects by monitoring changes in the quantum coherence and/or depopulation time of the NV center's, an operation modality we refer to as noise spectroscopy.

According to some embodiments a nanoscale sensing platform is provided that integrates NV color centers directly into the culet of diamond anvils. The versatility of this platform is demonstrated by performing diffraction-limited imaging of both stress fields and magnetism as a function of pressure and temperature. All normal and shear stress components may be quantified and vector magnetic field imaging may be demonstrated, enabling the measurement of a pressure-driven $\alpha \leftrightarrow \epsilon$ phase transition in iron and the complex pressure-temperature phase diagram of gadolinium. A complementary NV-sensing modality using noise spectroscopy enables the characterization of phase transitions even in the absence of static magnetic signatures.

Figure 1:
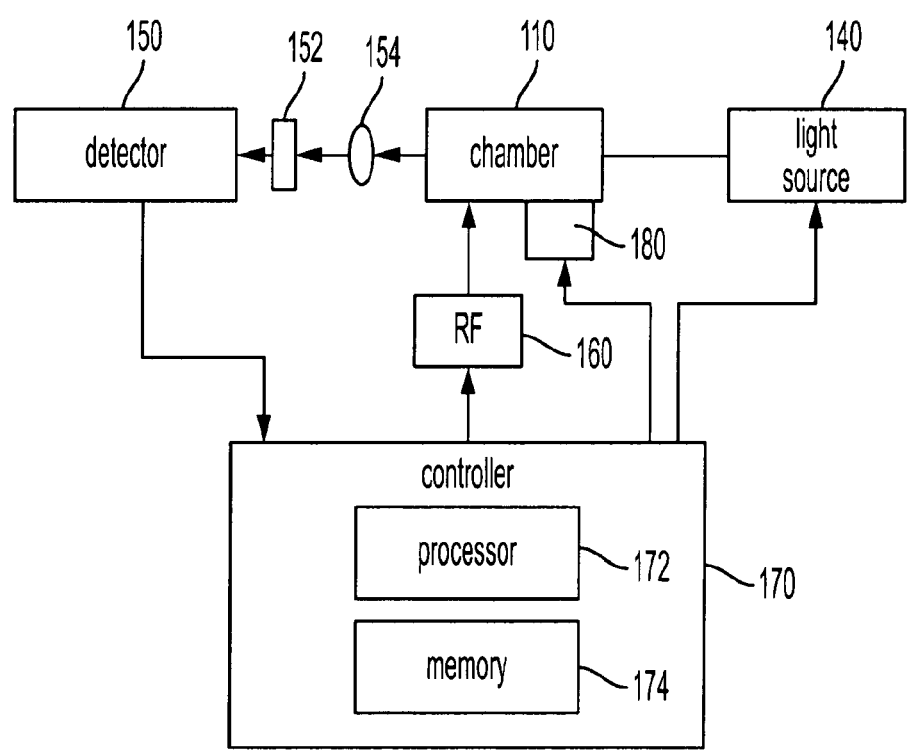
FIG. 1 is a schematic of a high pressure device according to some embodiments.

In hybrid quantum sensing devices, sensors are directly integrated into existing toolsets ranging from biological imaging to materials spectroscopy [G. Kucsko, et al., Nature 500, 54 EP (2013); P. Maletinsky, et al., Nat. Nanotechnol. 7, 320 (2012); J. Cai, F. Jelezko, M. B. Plenio, Nat. Commm. 5, 4065 EP (2014); Y. Dovzhenko, et al., Nat. Commm. 9, 2712 (2018)]. According to some embodiments, there is demonstrated the versatility of a platform based upon quantum spin defects, combined with static high pressure technologies [A. Jayaraman, Rev. Mod. Phys. 55, 65 (1983); H.-k. Mao, X.-J. Chen, Y. Ding, B. Li, L. Wang, Rev. Mod. Phys. 90, 404 (2018)]. In particular, according to some embodiments, there is demonstrated instrument diamond anvil cells with a layer of nitrogen-vacancy (NV) centers directly at the culet, enabling the pursuit of two complementary objectives in high pressure science: understanding the strength and failure of materials under pressure (e.g. the brittle-ductile transition) and discovering and characterizing exotic phases of matter (e.g. pressure-stabilize high-temperature superconductors) [E. Wigner, H. Huntington, J. Chem. Phys 3, 764 (1935); H. Horii, S. Nemat-Nasser, Philos. Trans. Royal Soc. A 319, 337 (1986); E. Gilioli, L. Ehm, IUCrJ 1, 590-603 (2014); A. P. Drozdov, M. I. Eremets, I. A. Troyan, V. Ksenofontov, S. I. Shylin, Nature 525, 73 EP (2015); M. Somayazulu, et al., Phys. Rev. Lett. 122, 027001 (2019)]. Achieving these goals hinges upon the sensitive in situ imaging of signals within the high pressure chamber. For the first goal, measuring the local stress environment permits the direct observation of inhomogeneities in plastic flow and the formation of line defects. For the second goal, the ability to spatially resolve field distributions can provide a direct image of complex order parameters and textured phenomena such as magnetic domains. Unfortunately, the enormous stress gradients generated near the sample limit the utility of most conventional tabletop spectroscopy techniques; as a result, one is often restricted to measuring bulk properties averaged over the entire DAC geometry. According to some embodiments, an approach to these challenges is to utilize an ensemble of NV centers disposed near the surface of the diamond anvil culet FIG. 1 illustrates a pressure device 100 according to some embodiments. The pressure device 100 may incorporate a diamond anvil cell, for example, but may incorporate materials other than diamond of a diamond anvil cell. For example, the pressure device 100 may incorporate silicon carbide instead of diamond.

Figure 2:
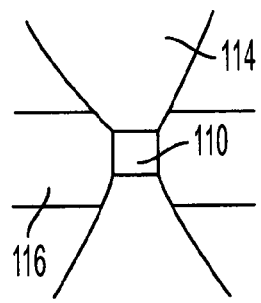
FIG. 2 is a schematic of a pressure chamber of the high pressure device according to some embodiments.

The pressure device 100 may include a pressure chamber 110 having chamber walls 112 as shown in FIG. 2. In the case of a diamond anvil cell, the chamber 110 may be formed by the culets, or diamond tips, of two opposing diamonds 114, and a gasket material 116 which is contacted between the diamonds. The culets form part of the chamber walls 112, and along with the gasket material 116, form the pressure chamber 110.

Figure 3:
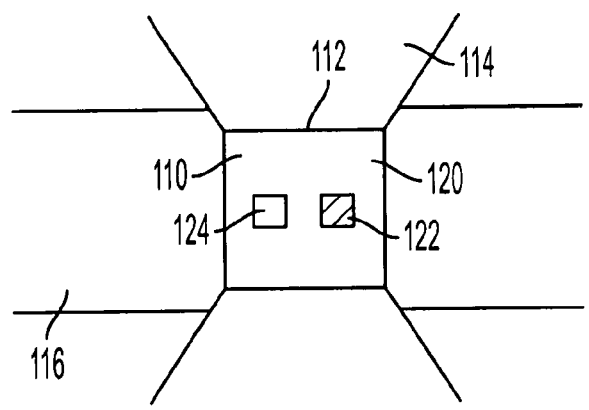
FIG. 3 is an enlarged view of the pressure chamber according to some embodiments.

FIG. 3 illustrates an enlarged view of the pressure chamber 110 illustrating the chamber walls 112 of the chamber with a pressure transmitting medium 120, sample 122, and a pressure indicator 124 within the pressure chamber 110. In operation, the opposing diamonds 114, or other high pressure material if other than diamond, may be aligned and pressed toward each other until they contact the gasket material 116. The gasket material 116 may have a hole formed therein, where a pressure transmitting medium 120, sample 122, and a pressure indicator 124 are formed in the hole. The sample 122 may include a plurality of samples. The pressure indicator 124 need not be present, and the defects 130 may act as a pressure indicator. A pressure transmitting medium 120 need not be present, and the sample 122 may act as the pressure transmitting medium. The opposing diamonds 114 seal the hole to provide the pressure chamber 110. Applying further force to the diamonds 114 causes the diamonds 114 to move closer to each other and increase the pressure within the pressure chamber 110.

Figure 4:
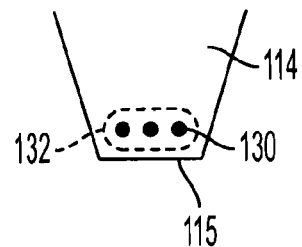
FIG. 4 is a schematic illustrating a region with a culet of a diamond according to some embodiments.

FIG. 4 is a schematic side view illustrating a region with a culet 115 of a diamond 114 where the culet 115 or a region near the culet include a number of defects 130. The defects may be nitrogen-vacancy (NV) atomic defects, for example, or in the case that the walls 112 are made of silicon carbide the defects may be a silicon-vacancy defect. The NV atomic defect has two adjacent carbon atoms replaced by a nitrogen atom and a lattice vacancy. The defects 130 may be optical defects which interact with electromagnetic radiation.

The defects 130 may be formed by an electron beam, by implantation of nitrogen, or by growth of diamond material at the culet, for example, followed by annealing, if needed. For example, for shallow defects close to the wall 112, lower energy ion implantation may be used, or nitrogen rich diamond may be formed followed by ion implantation or electron irradiation. For deeper defects, such as bulk defects, some of which may be further from the wall 112, higher energy electron implantation may be used, or diamonds with intrinsic NV centers may be used. Other formation techniques are contemplated for forming the defects.

The defects 130 may comprise a sensor 132 integrated into the diamond 114 at the culet 115. The sensor 132 may be at least one of a pressure sensor, a temperature sensor, a sensor for use in measuring magnetic fields from samples under pressure, a sensor for use in measuring electric fields from samples under pressure, a sensor for use in determining stress in a high pressure sample chamber, or a sensor for use in determining elastic and/or plastic deformations of a material.

Figure 6:
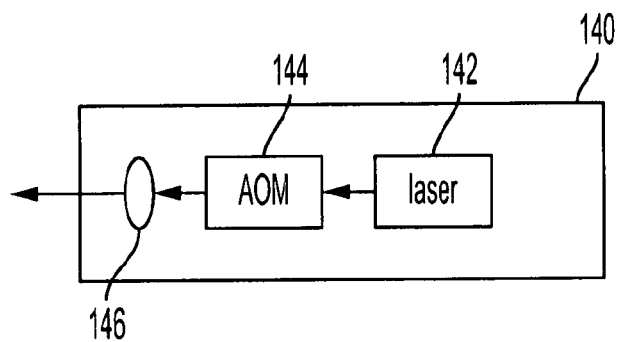
FIG. 6 is a schematic of a light source of the high pressure device according to some embodiments.

Returning to FIG. 1, in some embodiments, the pressure device 100 may further include a light source 140, which may be an electromagnetic radiation source in general providing electromagnetic radiation, arranged to provide light to the defects 130 of the high pressure chamber 110. In some embodiments as illustrated in FIG. 6, the light source 140 may include a laser 142 controlled by an acousto-optic modulator 144. The light source 140 may further include focusing optics 146 to focus light from the laser 142 to the defects 130 on the walls 112 of the pressure chamber 110. The light source 140 may be an incoherent light source, such as a light emitting diode, for example, or may be other than a light emitting diode.

The pressure device 100 may further include a detector 150 arranged to detect light from the defects 130. The pressure device 100 may include collection optics 154 arranged to collect light from defects and to image that light onto the detector 150. While FIG. 1 illustrates the focusing optics 146 and collection optics 154 to be separate, in some embodiments the focusing optics 146 and collection optics 154 may be the same. For example, the focusing optics 146 and the collection optics 154 may be a single objective lens of a confocal microscope.

The pressure device 100 may further include a filter 152 to allow light at desired wavelengths to be passed, and to block light at other wavelengths. The filter 152 may be a dichroic mirror, a long pass filter or a band pass filter, for example.

Figure 5:
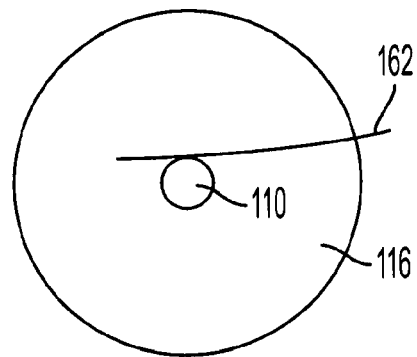
FIG. 5 is an example of an arrangement of an electrode of an RF source according to some embodiments.
Figure 8A:
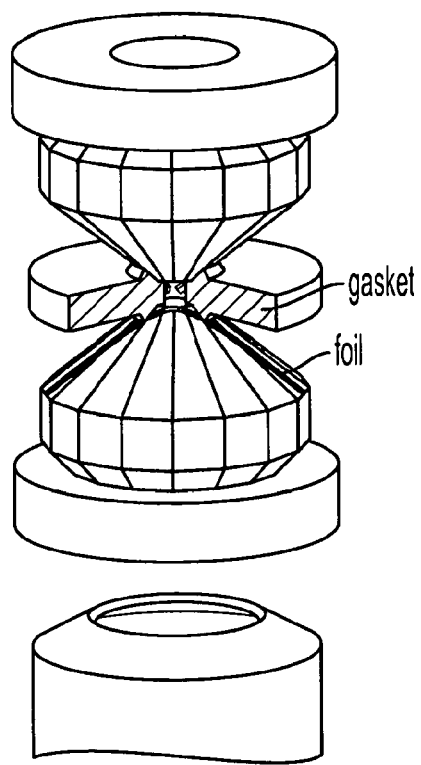
FIG. 8A is schematic of a setup explicitly depicting the platinum foil used for microwave excitation, where the gasket has been cross sectioned for visual clarity according to some embodiments.
Figure 8B:
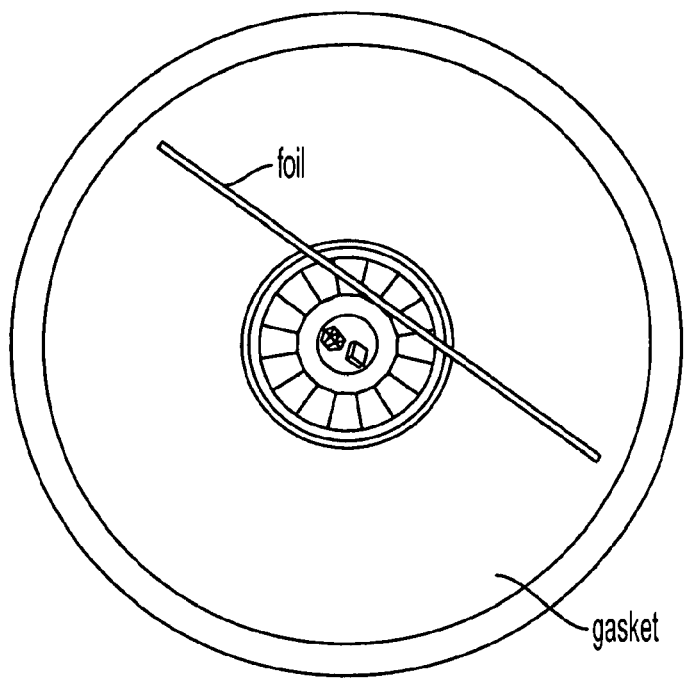
FIG. 8B is a top view of FIG. 8A omitting the anvil for visual clarity.

The pressure device 100 may further include a radio frequency (RF) source 160 arranged to provide an RF magnetic field to the defects 130 in addition to the light source 140 providing light to the defects 130. FIG. 5 and FIGS. 8A and 8B illustrates an example of an electrode 162 of the RF source relative to the chamber 110 and the gasket material 116. The electrode 162 may be a foil electrode, for example. As another example, the RF source 160 may include RF antennas for applying a magnetic field to the defects 130. According to some embodiments the system does not include an RF source, and the system is operated so that the detector 150 measures the wavelength of light, and the wavelength spectrum of the defects 130 acts as the signal.

According to some embodiments, the pressure device 100 may include a translator 180. The translator 180 supports the chamber 110 and/or the light source 140 and translates the position that the light beam from the light source 140 impinges on the chamber wall 112 having defects 130. A processor controller 120 may control the translator 180 to change the position and thus provides a scanning function for the light beam on the chamber wall. The translator 180 may include a single translator to scan in two dimensions, or may include a separate translator for each dimension. Thus, the translator 180 may provide mapping over two dimensions over the chamber wall 112 having defects 130.

As an alternative to a translator providing mapping over two dimensions, the pressure device 100 may employ wide field imaging to provide mapping over two dimensions of the chamber wall 112 having defects 130.

According to some embodiments, the pressure device 100 may include the processor controller 120 arranged to control the light source 140 o provide light to the defects 130, and to receive a signal from the detector 150 based on light detected from defects 130. The processor controller 120 may further be arranged to control the RF source 140 to provide an RF magnetic field to the defects 130. The processor controller 120 may include a processor 172 and a memory 174.

Figure 7:
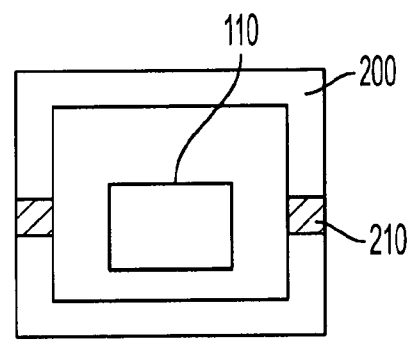
FIG. 7 is a schematic of a high pressure device including a cryostat according to some embodiments.

According to some embodiments, the pressure device 100 may include a cryostat 200 to allow for measurements at low temperatures, as shown in FIG. 7. The pressure chamber 110 is disposed in the cryostat 200. The cryostat 200 may include optical windows 210 to allow for light to enter and leave the pressure chamber 110 in some embodiments.

The processor controller 120 controls the light source 140 and RF source 140 to perform measurements as desired. The processor 172 may control measurement based on measurement control steps stored in the memory 174. The processor 172 further may perform data analysis based on light detected from the detector 150 and analysis functionality stored in the memory 174. As one example, the processor controller 120 may be programmed to perform optically detected magnetic resonance (ODMR) measurements. Embodiments are not limited, however, to ODMR measurements, and other measurements are contemplated, such as a measurement of the quantum depopulation time.

The processor controller 120 may be programmed or otherwise configured to determine the stress tensor (full or partial), or magnetic field vector (full or partial) as described herein in detail. The invention is not so limited and other parameters may be determined using pressure chamber wall defects. For example, temperature and electric fields are contemplated.

The following describes some concepts of the current invention with reference to particular embodiments. The general concepts of the current invention are not limited to the examples described. The following sections and further examples are provided below to describe some concepts of the current invention with reference to particular embodiments.

Nitrogen-Vacancy Center in Diamond

The nitrogen-vacancy (NV) center is an atomic defect in diamond in which two adjacent carbon atoms are replaced by a nitrogen atom and a lattice vacancy. When negatively charged (by accepting an electron), the ground state of the NV center consists of two unpaired electrons in a spin triplet configuration, resulting in a room temperature zero-field splitting $D_{gs}=(2\pi)\times 2.87$ GHz between $|m_s=0\rangle$ and $|m_s=\pm 1\rangle$ sublevels. The NV can be optically initialized into its $|m_s=0\rangle$ sublevel using a laser excitation at wavelength $\lambda=532$ nm. After initialization, a resonant microwave field is delivered to coherently address the transitions between $|m_s=0\rangle$ and $|m_s=\pm 1\rangle$. At the end, the spin state can be optically read-out via the same laser excitation due to spin-dependent fluorescence (M. W. Doherty, et al., *Physics Reports* 528, 1 (2013)).

The presence of externals signals affects the energy levels of the NV, and, in general, lifts the degeneracy of the $|m_S=\pm 1\rangle$ states. Using ODMR to characterize the change in the energy levels, one can directly measure such external signals. More specifically, combining the information from the four possible crystallographic orientation of the NV centers enables the reconstruction of a signal's vector (e.g. magnetic field) or tensorial (e.g. stress) information.

Experimental Details

Diamond Anvil Cell and Sample Preparation

Diamond anvils used were synthetic type-Ib ([N]≲200 ppm) single crystal diamonds cut into a 16-sided standard design with dimensions 0.2 mm diameter culet, 2.75 mm diameter girdle, and 2 mm height from Almax-easyLab and Syntek Co., Ltd. For stress measurements, both anvils with (111)-cut-culet and (110)-cut-culet were used, while for magnetic measurements on iron and gadolinium, a (110)-cut-culet anvil was used. $^{12}C^+$ ion implantation (CuttingEdge Ions, 30 keV energy, $5\times 10^{12}$ cm$^{-2}$) was performed to generate a ~50 nm layer of vacancies near the culet surface. After implantation, the diamonds were annealed in vacuum ($<10^{-6}$ Torr) using a home-built furnace with the following recipe: 12 hours ramp to 400° C., dwell for 8 hours, 12 hours ramp to 800° C., dwell for 8 hours, 12 hours ramp to 1200° C., dwell for 2 hours. During annealing, the vacancies become mobile, and probabilistically form NV centers with intrinsic nitrogen defects. After annealing, the NV concentration was estimated to be around 1 ppm as measured by fluorescence intensity. The NV centers remain photostable after several iterations of compression and decompression up to 48 GPa, with spin-echo coherence time $T_2 \approx 1$ μs, mainly limited by the nitrogen electronic spin bath.

The miniature diamond anvil cell body was made of nonmagnetic steel with cubic boron nitride backing plates (Technodiamant). Nonmagnetic gaskets (rhenium or beryllium copper) and pressure media (cesium iodide, methanol/ethanol/water) were used for the experiments.

Experimental setup

In measurements except those shown in FIGS. 14A-14E, NV ensembles integrated inside the DAC were addressed using a home-built confocal microscope. A 100 mW 532 nm diode-pumped solid-state laser (Coherent Compass), controlled by an acousto-optic modulator (AOM, Gooch & Housego AOMO 3110-120) in a double-pass configuration, was used for both NV spin initialization and detection. The laser beam was focused through the light port of the DAC to the NV layer using a long working distance objective lens (Mitutoyo 378-804-3, NA 0.42, for stress and iron measurements; Olympus LCPLFLN-LCD 20×, NA 0.45, for gadolinium measurements in cryogenic environment), with a diffraction-limit spot size ≈600 nm. The NV fluorescence was collected using the same objective lens, spectrally separated from the laser using a dichroic mirror, further filtered using a 633 nm long-pass filter, and then detected by a fiber coupled single photon counting module (Excelitas SPCM-AQRH-64FC). A data acquisition card (National Instruments USB-6343) was used for fluorescence counting and subsequent data processing. The lateral scanning of the laser beam was performed using a two-dimensional galvanometer (Thor-labs GVS212), while the vertical focal spot position was controlled by a piezo-driven positioner (Edmund Optics at room temperature; attocube at cryogenic temperature).

For the measurements in FIGS. 14A-14E, a home-built widefield imaging microscope was used in lieu of the confocal microscope. A 2 W 532 nm laser (Coherent Verdi V-2) was passed through a speckle reducer (Optotune LSR-3005-6D-VIS) and onto an objective lens (Mitutoyo 378804-3). The fluorescence was spectrally separated from the laser using a dichroic mirror, further filtered using a 633 nm long-pass filter, and imaged onto an EMCCD camera (Princeton Instruments ProEM-HS 512BX3).

For gadolinium measurements, the DAC was placed into a closed-cycle cryostat (attocube attoDRY800) for temperature control from 35-320 K. The AOM and the SPCM were gated by a programmable multi-channel pulse generator (SpinCore PulseBlasterESR-PRO 500) with 2 ns temporal resolution. A microwave source (Stanford Research Systems SG384) in combination with a 16 W amplifier (Mini-Circuits ZHL-16W-43+) served to generate signals for NV spin state manipulation. The microwave field was delivered to DAC through a 4 μm thick platinum foil compressed between the gasket and anvil pavilion facets (FIGS. 8A and 8B), followed by a 40 dB attenuator and a 50Ω termination. Electrical contact between the conducting gasket and platinum foil reduces the microwave transmission efficiency and was chosen out of technical simplicity.

Optically Detected Magnetic Resonance (ODMR)

Continuous-wave ODMR spectroscopy was used to probe the NV spin resonances. The laser and microwave field were both on for the entire measurement, while the frequency of the microwave field was swept. When the microwave field is resonant with one of the NV spin transitions, it drives the spin from $|m_s=0\rangle$ to $|m_s=\pm 1\rangle$, resulting in a decrease in NV fluorescence.

Sensitivity, Precision, and Pressure Range

Theoretical Sensitivity

The magnetic field sensitivity for continuous-wave ODMR (A. Dréau, et al., *Phys. Rev. B* 84, 195204 (2011)) is given by:

$$\eta_B = \mathcal{P}_G \frac{1}{\gamma_B} \frac{\Delta\nu}{C\sqrt{\mathcal{R}}}, \qquad (1)$$

$\gamma_B$ where is the gyromagnetic ratio, $P_G \approx 0.7$ is a unitless numerical factor for a Gaussian lineshape, $\Delta\nu=10$ MHz is the resonance linewidth, $C \approx 1.8\%$ is the resonance contrast, and $R \approx 2.5 \to 10^6$ s$^{-1}$ is the photon collection rate. One can relate this to magnetic moment sensitivity by assuming that the field is generated by a point dipole located a distance d from the NV center (pointing along the NV axis). Then the dipole moment sensitivity is given by $$\eta_m = \mathcal{P}_G \frac{1}{\gamma_B} \frac{\Delta \nu}{C\sqrt{\mathcal{R}}} \frac{2\pi d^3}{\mu_0}, \quad (2)$$

where μ0 is the vacuum permeability.

Analogous to Eq. 1, the stress sensitivity for continuous-wave ODMR is given by $$\eta_S = \mathcal{P}_G \frac{1}{\xi} \frac{\Delta \nu}{C\sqrt{\mathcal{R}}}, \quad (3)$$

where ε is the susceptibility for the relevant stress quantity. More specifically, ε is a tensor defined by:

$$\xi_{\alpha\beta} = \left| \frac{\delta f_\alpha}{\delta \sigma_\beta} \right|_{\sigma^{(0)}} \quad (4)$$

where $f_\alpha$, $\alpha \in$ [G. Kucsko, et al., *Nature* 500, 54 EP (2013); H. Horii, S. Nemat-Nasser, *Philos. Trans. Royal Soc. A* 319, 337 (1986).] are the resonance frequencies associated with the 4 NV crystallographic orientations; $\sigma^{(0)}$ is an initial stress state; and $\delta\sigma_\beta$ is a small perturbation to a given stress component, e.g. $\beta \in \{XX\ YY,\ ZZ,\ XY,\ XZ,\ YZ\}$ are considered. For optimal sensitivity, perturbations about an unstressed state (i.e., $\sigma^{(0)}=0$). Equivalently, one can begin from any hydrostatic stress, i.e. $\sigma^{(0)} \sim I$. Non-hydrostatic stress, however, will generally reduce the stress susceptibilities, as will the presence of electric or magnetic fields. The resulting susceptibilities for stress components in a (111)-cut diamond frame, where the Z axis is normal to the diamond surface, and the XZ plane contains two of the NV axes (the vertical axis and one of the three non-vertical axes), are $$\xi_{\alpha\beta} = (2\pi) \times \begin{bmatrix} 10.5 & 10.5 & 2.5 & 3.9 & 9.0 & 9.0 \\ 6.6 & 6.6 & 2.5 & 3.9 & 9.0 & 9.0 \\ 1.3 & 10.5 & 11.9 & 9.8 & 12.7 & 0.7 \\ 3.9 & 6.6 & 2.8 & 9.8 & 1.2 & 0.7 \\ 10.8 & 6.1 & 11.9 & 13.5 & 0.5 & 11.1 \\ 1.4 & 3.7 & 2.8 & 3.6 & 6.4 & 1.0 \\ 10.8 & 6.1 & 11.9 & 3.6 & 0.5 & 1.0 \\ 1.4 & 3.7 & 2.8 & 13.5 & 6.4 & 11.1 \end{bmatrix} \text{[MHz/GPa]}.$$

In the examples and in Table 1, the sensitivity using the maximum susceptibility is computed for each stress component:

$$\xi_\beta^{(max)} = \max_\alpha \xi_{\alpha\beta} \quad (5)$$

Experimental Sensitivity and Precision

Figure 9:
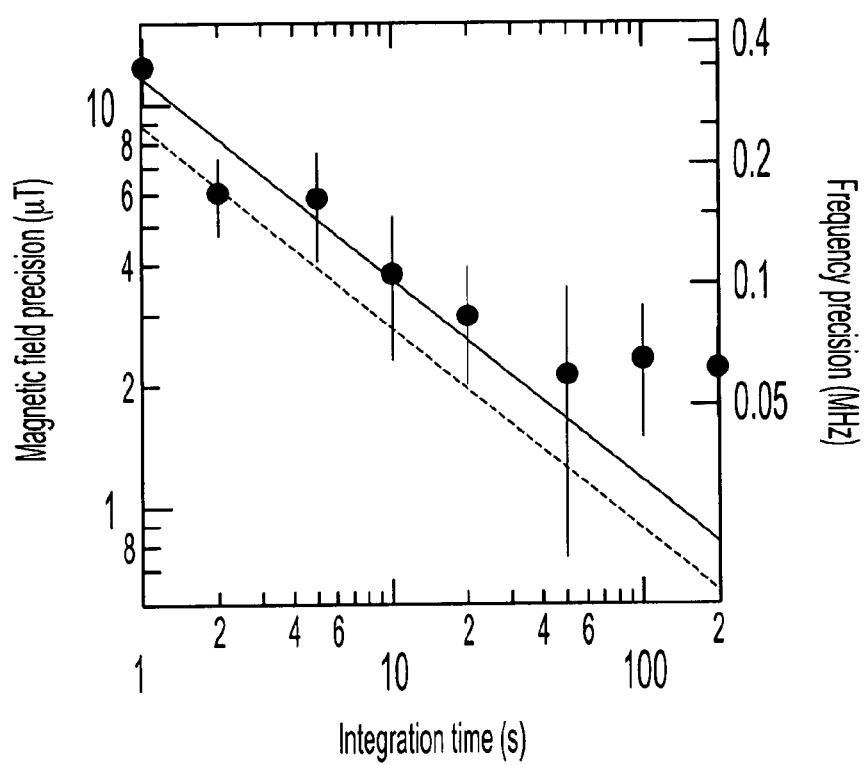
FIG. 9 is a graph illustrating the scaling of magnetic field precision as a function of total integration time on a single resonance according to some embodiments.

In order to characterize the sensitivity of our system, ODMR spectroscopy on a single resonance was performed. A Gaussian lineshape was fit to this resonance and observed the fitting error on the center frequency as a function of the total integration time, T (FIG. 9). In particular, the time scaling behavior of the fitting error is fit to $AT^{-1/2}$, where A, divided by the susceptibility of interest, characterizes the experimental sensitivity for a given signal. For $T \gtrsim 100$ s, the experimental precision saturates due to systematic noise, which is defined here as the "systematic precision" for each type of signal.

For scalar signals (e.g. axial magnetic fields, temperature, etc.), the precision is directly proportional to the minimum fitting error. For stress components, however, determining the precision is more complicated as the relation between resonance frequencies and the full stress tensor is a multi-dimensional, nonlinear function (see Section 4.1). To this end, the precision of each stress component is quantified using a Monte Carlo procedure. We begin with an unstressed state, which corresponds to the initial set of frequencies $f\alpha^{(0)}=D_{gs}$. Noise is then applied to each of the frequencies based on the minimum fitting error determined above—i.e. $f\alpha^{(0)}+\delta f\alpha$, where $\delta f\alpha$ are sampled from a Gaussian distribution with a width of the fitting error—and the corresponding stress tensor using a least-squared fit is calculated (Sec. 4.1). Repeating this procedure over many noise realizations, the standard deviation of each stress component is computed. The results of this procedure are shown in Table 1.

TABLE 1

NV sensitivity and precision for various signals. Sensitivity is calculated using Eqs. 2-3. We also report the typical fitting error of the center frequency for the relevant experiments in the main text. Gray rows correspond to projected sensitivity given an exfoliated sample atop (*) an ensemble of 5 nm depth NV centers or (†) a single 5 nm depth NV center with $\Delta\nu = 1$ MHz, C = 0.1, R = $10^4$ s$^{-1}$. Magnetic dipoles are reported in units of emu, where 1 emu = $10^{-3}$ A · m$^2$.

| Signal (unit) | Theo Sensitivity (unit/√Hz) | Exp Sensitivity (unit/√Hz) | precision (unit) |
|---|---|---|---|
| Hydrostatic stress (GPa) | 0.017 | 0.023 | 0.0012 |
| Average normal stress (GPa) | 0.022 | 0.03 | 0.0032 |
| Average shear stress (GPa) | 0.020 | 0.027 | 0.0031 |
| Magnetic field (µT) | 8.8 | 12 | 2.2 |
| Magnetic dipole (emu), floating sample (d = 5 µm) | $5.5 \times 10^{-12}$ | $7.5 \times 10^{-12}$ | $1.4 \times 10^{-12}$ |
| Magnetic dipole (emu), exfoliated sample (d = 5 nm)(*) | $1.7 \times 10^{-20}$ | $2.3 \times 10^{-20}$ | $4.3 \times 10^{-21}$ |
| Magnetic dipole (emu), exfoliated sample, single NV (d = 5 nm)(†) | $1.6 \times 10^{-21}$ | $2.2 \times 10^{-21}$ | $4.0 \times 10^{-22}$ |
| Electric field (kV/cm), Single NV(†) | 1.8 | 2.5 | 0.45 |
| Temperature (K), Single NV(†) | 0.4 | 0.55 | 0.10 |

Comparison to Other Magnetometry Techniques

In this section, the comparison of magnetometry techniques presented in FIG. 29F is discussed. For each sensor, the corresponding dipole precision (as defined in Section 3.2) is plotted against its relevant "spatial resolution," roughly defined as the length scale within which one can localize the source of a magnetic signal. In the following discussion, we specify the length scale plotted for each method in FIG. 29F. Two broad categories of high pressure magnetometers are discussed.

The first category encompasses inductive methods such as pickup coils (Y. Feng, D. M. Silevitch, T. F. Rosenbaum, *Rev. Sci. Instrum* 85, 033901 (2014); M. Mito, et al., *Phys. Rev. B* 67, 024427 (2003); D. Jackson, et al., *Rev. Sci. Instrum* 74, 2467 (2003); and superconducting quantum interference devices (SQUIDs) (P. L. Alireza, G. G. Lonzarich, *Rev. Sci. Instrum* 80, 023906 (2009); M. Mito, et al., *Jpn. J. Appl. Phys* 40, 6641 (2001); G. Giriat, W. Wang, J. P. Attfield, A. D. Huxley, K. V. Kamenev, *Rev. Sci. Instrums* 81, 073905 (2010); K. Takeda, M. Mito, *J. Phys. Soc. Jpn* 71, 729 (2002); A. Marizy, B. Guigue, F. Occelli, B. Leridon, P. Loubeyre, *High Press. Res.* 37, 465 (2017).). Under the category of inductive methods, we also include the "designer anvil" which embeds a pickup coil directly into the diamond anvil. Magnetic dipole measurement precision is readily reported in various studies employing inductive methods. We estimate the relevant length scale of each implementation as the pickup coil or sample bore diameter.

The second class of magnetometers comprises high energy methods including Mössbauer spectroscopy (M. P. Pasternak, R. D. Taylor, R. Jeanloz, *J. Appl. Phys* 70, 5956 (1991); M. P. Pasternak, et al., *Phys. Rev. B* 65, 035106 (2001); A. P. Kantor, et al., *Phys. Rev. Lett.* 93, 215502 (2004); and x-ray magnetic circular dichroism (XMCD) (O. Mathon et al., *J. Synchrotron Radiat* 11, 423 (2004); N. Ishimatsu, et al., *Phys. Rev. B* 75, 180402 (2007); S. Watanabe, et al., *J. Phys. Soc. Jpn* 80, 093705 (2011); K. Chen, et al., *Phys. Rev. B* 97, 235153 (2018)), which probe atomic scale magnetic environments. For the Mössbauer studies considered in our analysis, we calculate magnetic dipole moment precision by converting B-field uncertainties into magnetic moments, assuming a distance to the dipole on order of the lattice spacing of the sample. We assess the length scale as either the size of the absorbing sample or the length scale associated with the sample chamber/culet area. For XMCD studies, we accept the moment precision reported in the text. Length scales are reported as the square root of the spot size area. Notably, we emphasize that both methods provide information about atomic scale dipole moments rather than a sample-integrated magnetic moment; these methods are thus not directly comparable to inductive methods.

We compare these methods alongside the NV center, whose precision is defined in Section 3.2 and shown in Table 1. For the current work, we estimated a length scale ~5 µm, corresponding to the approximate distance between a sample (suspended in a pressure-transmitting medium) and the anvil culet. By exfoliating a sample onto the diamond surface, the diffraction-limit ~600 nm bounds the transverse imaging resolution for ensemble NV centers; this limit can be further improved for single NV centers via super-resolution techniques (E. Rittweger, K. Y. Han, S. E. Irvine, C. Eggeling, S. W. Hell, *Nat. Photonics* 3, 144 (2009)).

M. W. Doherty, et al., *Phys. Rev. Lett.* 112, 047601 (2014) has previously demonstrated technical challenges that manifest at gigapascal pressure. Firstly, they show that the zero phonon line is blue shifted to their excitation laser wavelength (532 nm) near 60 GPa, suggesting that this wavelength is insufficient to excite NV centers at higher pressures. Secondly, they show that the ODMR contrast decreases significantly with pressure. These technical challenges may potentially be overcome using, e.g., a higher energy excitation laser or by modifying the phonon occupation through temperature control.

Stress Tensor

Overview

In this Overview section, we describe our procedure for reconstructing the full stress tensor using NV spectroscopy. This technique relies on the fact that the four NV crystallographic orientations experience different projections of the stress tensor within their local reference frames. In particular, the full Hamiltonian describing the stress interaction is given by:

$$H_S = \sum_i \Pi_{z,i} S_{z,i}^2 + \Pi_{x,i}(S_{y,i}^2 - S_{x,i}^2) + \Pi_{y,i}(S_{x,i}S_{y,i} + S_{y,i}S_{x,i}) \quad (6)$$

where $$\Pi_{z,i} = \alpha_1(\sigma_{xx}^{(i)} + \sigma_{yy}^{(i)}) + \beta_1 \sigma_{zz}^{(i)} \quad (7)$$

$$\Pi_{x,i} = \alpha_2(\sigma_{yy}^{(i)} - \sigma_{xx}^{(i)}) + \beta_2(2\sigma_{xz}^{(i)}) \quad (8)$$

$$\Pi_{y,i} = \alpha_2(2\sigma_{xy}^{(i)}) + \beta_2(2\sigma_{yz}^{(i)}) \quad (9)$$

$\sigma^{(i)}$ is the stress tensor in the local frame of each of NV orientations labeled by $\{i=1, 2, 3, 4\}$, and $\{\alpha_{1,2}, \beta_{1,2}\}$ are stress susceptibility parameters (Section 4.4.3). Diagonalizing this Hamiltonian, one finds that the energy levels of each NV orientation exhibit two distinct effects: the $|m_s=\pm 1\rangle$ states are shifted in energy by $\Pi_{z,i}$ and split by $2\Pi_\perp$. Thus, the Hamiltonian can be thought of as a function that maps the stress tensor in the lab frame to eight observables: $H_S(\sigma^{(lab)}) = \{\Pi_{z,1}, \Pi_{\perp,1}, \Pi_{z,2}, \Pi_{\perp,2}, \ldots\}$. Obtaining these observables through spectroscopy, one can numerically invert this function and solve for all six components of the corresponding stress tensor.

In practice, resolving the resonances of the four NV orientation groups may not be straightforward because the ensemble spectra can exhibit near degeneracies. When performing ensemble NV magnetometry, a common approach is to spectroscopically separate the resonances using an external bias magnetic field. However, unlike magnetic contributions to the Hamiltonian, stress that couples via $\Pi_\perp$ is suppressed by an axial magnetic field. Therefore, a generic magnetic field provides only stress information via the shifting parameters, $\Pi_{z,i}$, which is insufficient for reconstructing the full tensor.

To address this issue, we demonstrate a novel technique that consists of applying a well-controlled external magnetic field perpendicular to each of the NV orientations. This technique leverages the symmetry of the NV center, which suppresses its sensitivity to transverse magnetic fields. In particular, for each perpendicular field choice, three of the four NV orientations exhibit a strong Zeeman splitting proportional to the projection of the external magnetic field along their symmetry axes, while the fourth (perpendicular) orientation is essentially unperturbed. A transverse magnetic field leads to shifting and splitting at second order in field strength. We account for the former through a correction described in Section 4.3, while the latter effect is small enough to be neglected. More specifically, the effective splitting caused by magnetic fields is $(\gamma BB_\perp)^2/D_{gs} \approx 5$-10 MHz, which is smaller than the typical splitting observed at zero field. This enables one to resolve $\Pi_{z,i}$ for all four orientations and $\Pi_{\perp,i}$ for the orientation that is perpendicular to the field. Repeating this procedure for each NV orientation, one can obtain the remaining splitting parameters and thus reconstruct the full stress tensor.

In the following sections, we provide additional details regarding our experimental procedure and analysis. In Section 4.2, we describe how to use the four NV orientations to calibrate three-dimensional magnetic coils and to determine the crystal frame relative to the lab frame. In Section 4.3, we discuss our fitting procedure, the role of the NV's local charge environment, and the origin of the stress susceptibility parameters. In Section 4.4, we present the results of our stress reconstruction procedure for both (111)- and (110)-cut diamond. In Section 4.5, we compare our experimental results to finite element simulations.

Experimental Details

Electromagnet Calibration Procedure

To apply carefully aligned magnetic fields, we utilize a set of three electromagnets (GMW Associates 3470 Electromagnet) that are approximately spatially orthogonal with one another and can be controlled independently via the application of current. Each coil is placed >10 cm away from the sample to reduce the magnetic gradient across the (200 µm)² culet area. We note that the pressure cell, pressure medium and gasket are nonmagnetic.

To calibrate the magnetic field at the location of the sample, we assume that the field produced by each coil is linearly proportional to the applied current, I. Our goal is then to find the set of coefficients, $a_{mn}$, such that $$B_m = \sum_n a_{mn} I_n, \quad (10)$$

where $B_m = \{B_X, B_Y, B_Z\}$ is the magnetic field in the crystal frame and n={1, 2, 3} indexes the three electromagnets. This construction does not require the electromagnets to be spatially orthogonal.

To determine the nine coefficients, we apply arbitrary currents and measure the Zeeman splitting of the four NV orientations via ODMR spectroscopy. Notably, this requires the ability to accurately assign each pair of resonances to their NV crystallographic orientation. We achieve this by considering the amplitudes of the four pairs of resonances, which are proportional to the relative angles between the polarization of the excitation laser and the four crystallographic orientations. In particular, the $|m_s=0\rangle \leftrightarrow |m_s=\pm 1\rangle$ transition is driven by the perpendicular component of the laser field polarization with respect to the NV's symmetry axis. Therefore, tuning the laser polarization allows us to assign each pair of resonances to a particular NV orientation.

Here In order to minimize the number of fitting variables, we choose magnetic fields whose projection along each NV orientation is sufficient to suppress their transverse stress-induced energy splitting, i.e. $\gamma_B B \gg \Pi_\perp$. As a result, the spectrum measured at each magnetic field is determined by (a) the stress-induced shift $\Pi_{z,i}$ for each NV orientation, which is constant for all applied fields, and (b) the applied vector magnetic field $\{B_X, B_Y, B_Z\}$. Sequentially applying different currents to the electromagnet coils and determining the subsequent vector magnetic field at the sample three times, we obtain sufficient information to determine the matrix $a_{mn}$ as well as the shift $\Pi_z$ for all NV orientations. We find that the calibration technique is precise to within 2%.

Calibration of Crystal and Laboratory Frames

To determine the orientation of the crystal frame (i.e. the [100] diamond axis) with respect to the lab frame, we apply an arbitrary magnetic field and measure its angle (a) in the lab frame via a hand held magnetometer, and (b) in the crystal frame via the Zeeman splittings (see Section 4.2). Together with the known diamond cut, this provides a system of equations for the rotation matrix, Re, that relates the lab frame and the crystal frame:

$$R_c \hat{B}^{(lab)} = \hat{B}^{(crystal)}, \quad R_c \hat{Z} = \hat{e}^{(crystal)} \quad (11)$$

where $\hat{z}=(0, 0, 1)^\tau$ the longitudinal axis in the lab frame, and $\hat{e}^{(crystal)}$ is the unit vector perpendicular to the diamond cut surface in crystal frame, e.g. $\hat{e}^{(crystal)} \propto (1, 1, 1)^\xi$ for the (111)-cut diamond. We solve for $R_c$ by numerically minimizing the least-squared residue of these two equations.

However, we note that the magnetic field determined by the Zeeman splittings contains an overall sign ambiguity. To account for this, we numerically solve Eq. (11) using both signs for $\hat{B}^{(crystal)}$ and select the solution for $R_c$ with the smaller residue. Based on this residue, we estimate that our calibration is precise to within a few degrees.

Analysis

Extracting Splitting and Shifting Information

Having developed a technique to spectrally resolve the resonances, we fit the resulting spectra to four pairs of Lorentzian lineshapes. Each pair of Lorentzians is defined by a center frequency, a splitting, and a common amplitude and width. To sweep across the two-dimensional layer of implanted NV centers, we sequentially fit the spectrum at each point by seeding with the best-fit parameters of nearby points. We ensure the accuracy of the fits by inspecting the frequencies of each resonance across linecuts of the 2D data (FIG. 10A, 10B).

Converting the fitted energies to shifting ($\Pi_{z,i}$ and splitting parameters ($\Pi_{\perp,i}$) requires us to take into account two additional effects. First, in the case of the shifting parameter, we subtract off the second-order shifting induced by transverse magnetic fields. In particular, the effective shifting is given by $\Pi_{z,B} \approx (\gamma_B B_\perp)^2/D_{gs}$, which, under our experimental conditions, corresponds to $\Pi_{z,B} \approx 5$-10 MHz. To characterize this shift, one can measure each of the NV orientations with a magnetic field aligned parallel to its principal axis, such that the transverse magnetic shift vanishes. In practice, we obtain the zero-field shifting for each of the NV orientations without the need for additional measurements, as part of our electromagnet calibration scheme (Section 4.2). We perform this calibration at a single point in the two-dimensional map and use this point to characterize and subtract off the magnetic-induced shift in subsequent measurements with arbitrary applied field. Second, in the case of the splitting parameter, we correct for an effect arising from the NV's charge environment. We discuss this effect in the following section. The final results for the shifting ($\Pi_{z,i}$) and splitting ($\Pi_{\perp,i}$) parameters for the (111)-cut diamond at 4.9 GPa are shown in FIG. 10C.

Effect of Local Charge Environment

It is routinely observed that ensemble spectra of high-density samples (i.e. Type Ib) exhibit a large (5-10 MHz) splitting even under ambient conditions. While commonly attributed to intrinsic stresses in the diamond, it has since been suggested that the splitting is, in fact, due to electric fields originating from nearby charges (T. Mittiga, et al., *Phys. Rev. Lett.* 121, 246402 (2018)). This effect should be subtracted from the total splitting to determine the stress-induced splitting.

To this end, let us first recall the NV interaction with transverse electric fields:

$$H_E = d_\perp [\varepsilon_x(S_y^2 - S_x^2) + \varepsilon_x(S_x S_y + S_y S_x)] \quad (12)$$

where $d_\perp=17$ Hz cm/V. Observing the similarity with Eq. (6), we can define $$\tilde{\Pi}_x=\Pi_{s,x}+\Pi_{E,x} \quad (13)$$

$$\tilde{\Pi}_y=\Pi_{s,y}+\Pi_{E,y} \quad (14)$$

where $\Pi_{s,(x,y)}$ are defined in Eq. (7) and $\Pi_{E,(x,y)}=d_\perp E_{(x,y)}$. The combined splitting for electric fields and stress is then given by $$2\tilde{\Pi}_\perp = 2((\Pi_{s,x}+\Pi_{E,x})^2+(\Pi_{s,y}+\Pi_{E,y})^2)^{1/2}. \quad (15)$$

We note that the NV center also couples to longitudinal fields, but its susceptibility is ~50 times weaker and is thus negligible in the present context.

To model the charge environment, we consider a distribution of transverse electric fields. For simplicity, we assume that the electric field strength is given by a single value $\varepsilon_0$, and its angle is randomly sampled in the perpendicular plane. Adding the contributions from stress and electric fields and averaging over angles, the total splitting becomes $$\tilde{\Pi}_{\perp,avg} = \int d\theta (\Pi_{S,\perp}^2 + \Pi_{E,\perp}^2 + 2\Pi_{S,\perp}\Pi_{E,\perp}\cos\theta)^{1/2} \quad (16)$$

$$= \frac{1}{\pi}\left[\sqrt{\Pi_{S,\perp}^2 - \Pi_{E,\perp}^2}\, \mathrm{EllipticE}\!\left(-\frac{4\Pi_{S,\perp}\Pi_{E,\perp}}{\sqrt{\Pi_{S,\perp}^2 - \Pi_{E,\perp}^2}}\right) + \sqrt{\Pi_{S,\perp}^2 + \Pi_{E,\perp}^2}\, \mathrm{EllipticE}\!\left(-\frac{4\Pi_{S,\perp}\Pi_{E,\perp}}{\sqrt{\Pi_{S,\perp}^2 + \Pi_{E,\perp}^2}}\right)\right]$$

where EllipticE(z) is the elliptic integral of the second kind. This function is plotted in FIG. 11A, and we note its qualitative similarity to a quadrature sum.

To characterize the intrinsic charge splitting ($\Pi_{E,\perp}$), we first acquire an ODMR spectrum for each diamond sample under ambient conditions. For example, for the (111)-cut diamond, we measured $\Pi_{E,\perp}\approx 4.5$ MHz. For subsequent measures under pressure, we then subtract off the charge contribution from the observed splitting by numerically inverting Eq. (16) and solving for $\Pi_{S,\perp}$.

Susceptibility Parameters

An elegant recent experiment established the four stress susceptibilities relevant to this work (M. S. J. Barson, et al., *Nano Letters* 17, 1496 (2017)). In this section, we discuss the conversion of their susceptibilities to our choice of basis (the local NV frame), and we reinterpret their results for the splitting parameters taking into account the effect of charge (T. Mittiga, et al., *Phys. Rev. Lett.* 121, 246402 (2018)).

In their paper (M. S. J. Barson, et al., *Nano Letters* 17, 1496 (2017)), Barson et. al. define the stress susceptibilities with respect diamond crystal frame:

$$\Pi_z=a_1(\sigma_{xx}+\sigma_{yy}+\sigma_{zz})+2a_2(\sigma_{yz}+\sigma_{zx}+\sigma_{xy}) \quad (17)$$

$$\Pi_x=b(2\sigma_{zz}-\sigma_{xx}-\sigma_{yy})+c(2\sigma_{xy}-\sigma_{yz}-\sigma_{zx}) \quad (18)$$

$$\Pi_y=\sqrt{3}|b(\sigma_{xx}-\sigma_{yy})+c(\sigma_{yz}-\sigma_{zx})| \quad (19)$$

where XYZ are the principal axes of the crystal frame. Their reported results are $\{a_1, a_2, b, c\}=(2\pi)\times\{4.86(2), -3.7(2), -2.3(3), 3.5(3)\}$ MHz/GPa. To convert these susceptibilities to our notation (Eq. 6), one must rotate the stress tensor from the crystal frame to the NV frame, i.e. $\sigma_{x,y,z}=R\sigma_{XYZ}R^1$. The rotation matrix that accomplishes this is:

$$R = \begin{pmatrix} -\frac{1}{\sqrt{6}} & -\frac{1}{\sqrt{6}} & \sqrt{\frac{2}{3}} \\ \frac{1}{\sqrt{2}} & -\frac{1}{\sqrt{2}} & 0 \\ \frac{1}{\sqrt{3}} & \frac{1}{\sqrt{3}} & \frac{1}{\sqrt{3}} \end{pmatrix}. \quad (20)$$

Applying this rotation, one finds that the above equations become (in the NV frame)

$$\Pi_z = (a_1-a_2)(\sigma_{xx}+\sigma_{yy})+(a_1+2a_2)\sigma_{zz} \quad (21)$$

$$\Pi_x = (-b-c)(\sigma_{yy}-\sigma_{xx})+\left(\sqrt{2}b-\frac{\sqrt{2}}{2}c\right)(2\sigma_{xz}) \quad (22)$$

$$\Pi_x = (-b-c)(2\sigma_{xy})+\left(\sqrt{2}b-\frac{\sqrt{2}}{2}c\right)(2\sigma_{yz}) \quad (23)$$

Thus, the conversion between the two notations is $$\begin{pmatrix}\alpha_1\\\beta_1\end{pmatrix} = \begin{pmatrix}1 & -1\\1 & 2\end{pmatrix}\begin{pmatrix}a_1\\a_2\end{pmatrix} \quad (24)$$

$$\begin{pmatrix}\alpha_2\\\beta_2\end{pmatrix} = \begin{pmatrix}-1 & -1\\\sqrt{2} & -\frac{\sqrt{2}}{2}\end{pmatrix}\begin{pmatrix}b\\c\end{pmatrix}$$

Figure 11A:
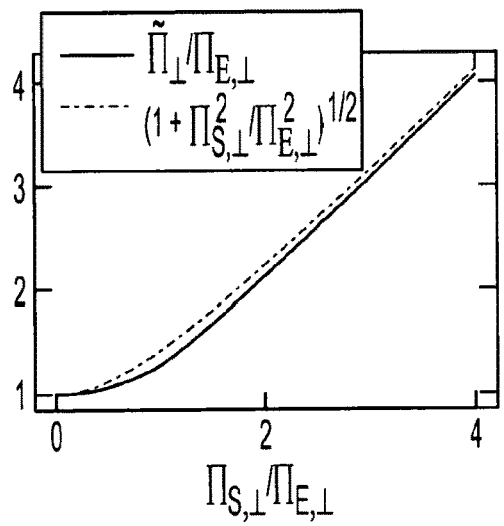
FIG. 11A is a theoretical curve for the total splitting in the presence of stress and electric fields according to some embodiments.
Figure 11B:
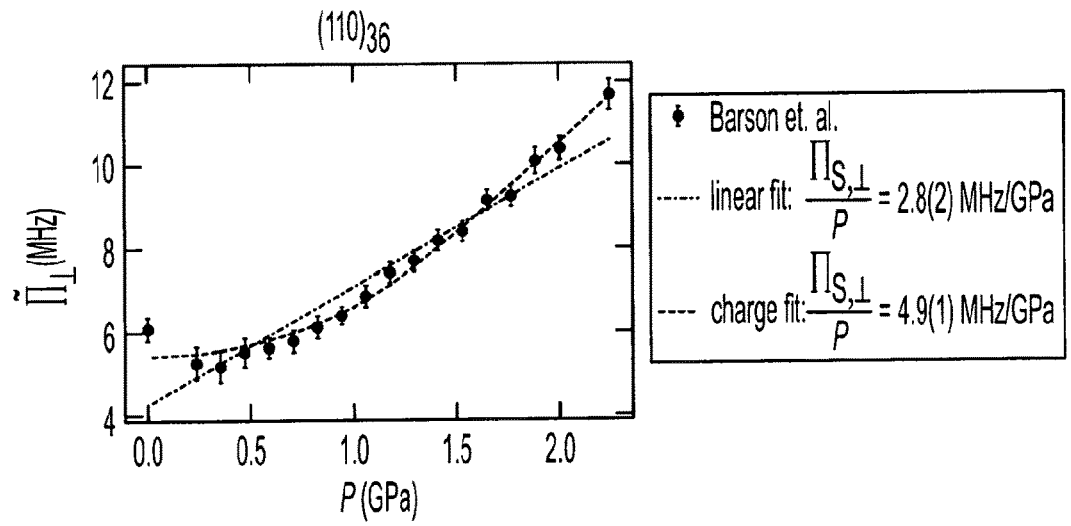
FIG. 11B and 11C are measured splitting parameters for uniaxial pressure applied to a (100)-cut and (100)-cut diamond fit to a theoretical curve.
Figure 11C:
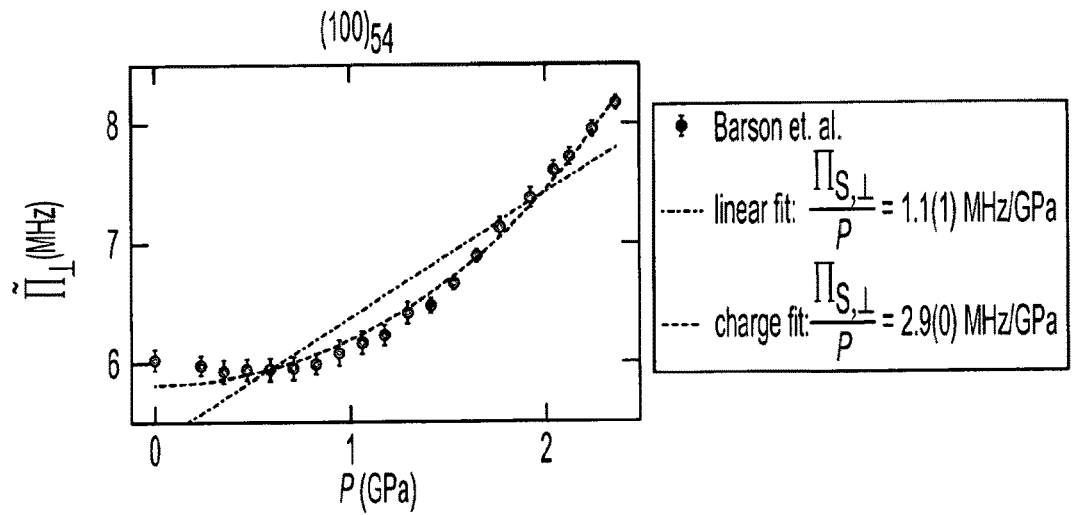
Figure 12A:
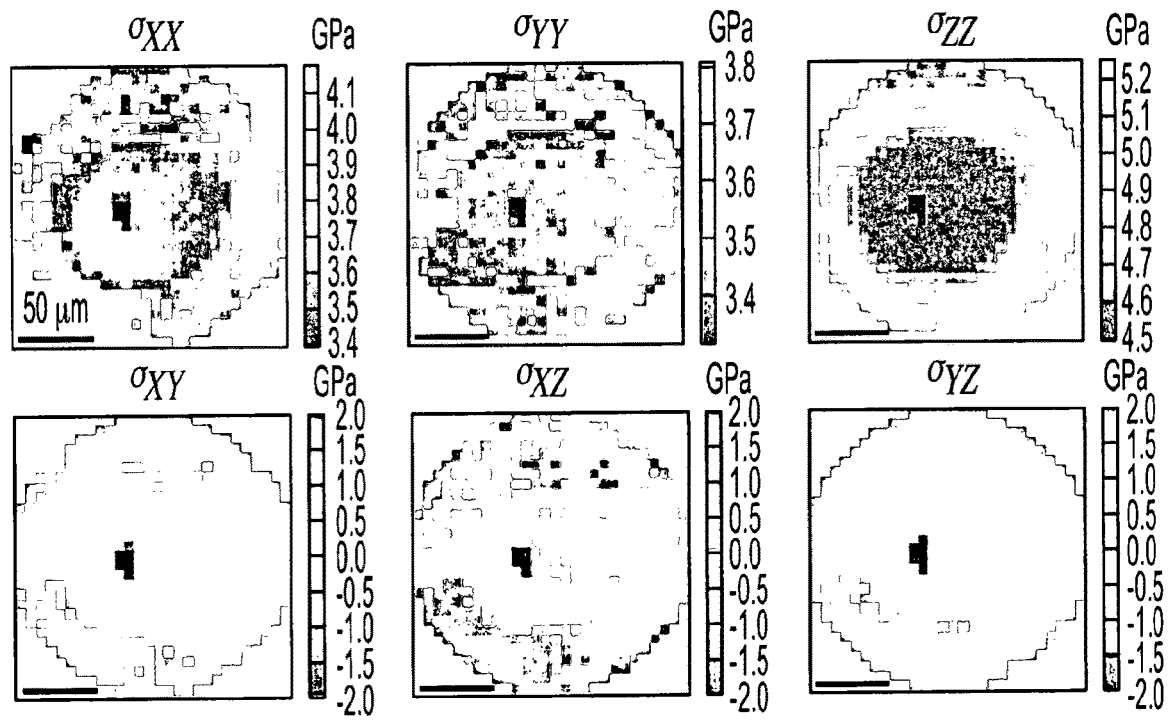
FIGS. 12A and 12B are sensor tensor reconstructions for (111)-cut diamond at 4.9 GPa and 13.6 GPa, respectively, according to some embodiments.
Figure 12B:
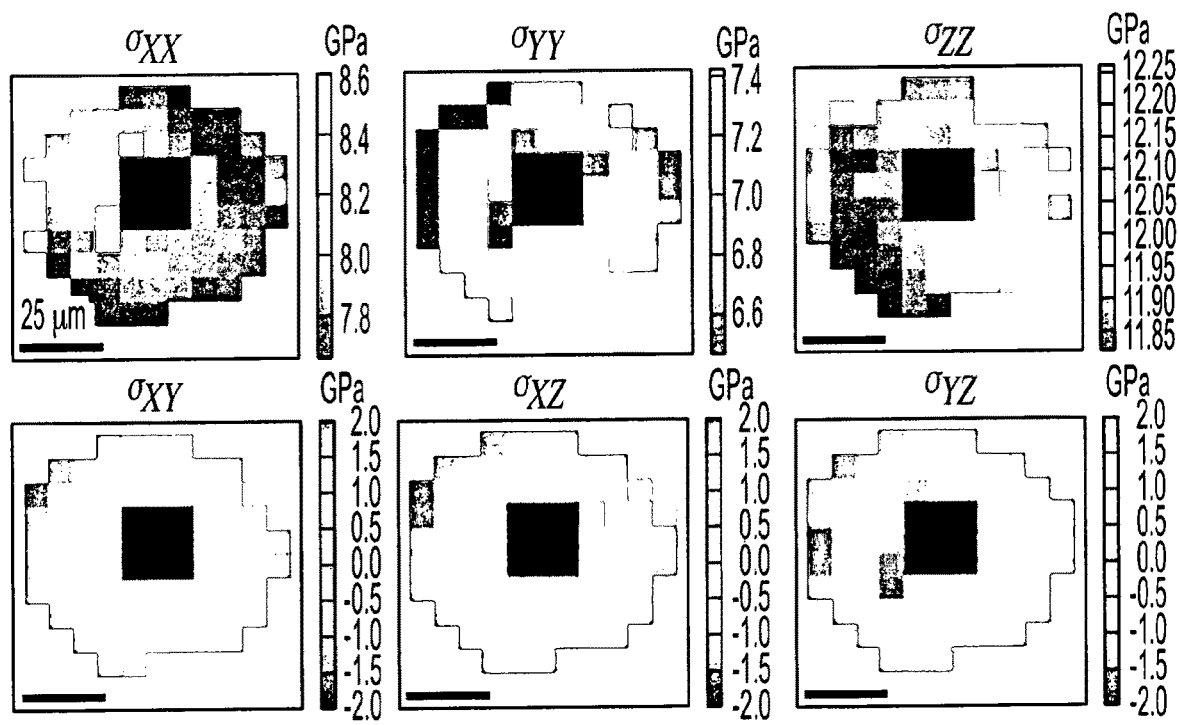

In characterizing the splitting parameters (b and c), Barson et. al. assumed a linear dependence between the observed splitting and $\Pi_{S,\perp}$. However, our charge model suggests that for $\Pi_{S,\perp}\lesssim\Pi_{E,\perp}$ the dependence should be nonlinear. To account for this, we re-analyze their data using Eq. 16 as our fitting form, rather than a linear function as in the original work. The results are shown in FIGS. 11A-11C for two NV orientation groups measured in the experiment: $(110)_{36}$ and $(100)_{54}$, where (•••) denotes the crystal cut and the subscript is the angle of the NV group with respect to the crystal surface. From the fits, we extract the linear response, $\Pi_{S,\perp}/P$, for the two groups. These are related to the stress parameters by b−c and 2b, respectively. Using these relations and the results of the fits, one finds $\{b, c\}=(2\pi)\times\{1.47(2), 3.42(7)\}$ MHz/GPa. Note that the overall sign of these parameters cannot be determined through these methods, as the energy splitting is related to the quadrature sum of $\Pi_x$ and $\Pi_y$. To determine the sign, one would need to measure the phase of the perturbed states (T. Mittiga, et al., *Phys. Rev. Lett.* 121, 246402 (2018)). Finally, we convert these and the original reported for $\{a_1, a_2\}$ to the NV frame using Eq. 24. This leads to the susceptibilities that we use for our analysis:

$$\{\alpha_1, \beta_1, \alpha_2, \beta_2\}=(2\pi)\times\{8.6(2), -2.5(4), -1.95(9), -4.50(8)\}\text{ MHz/GPa.} \quad (25)$$

Results

Figure 13:
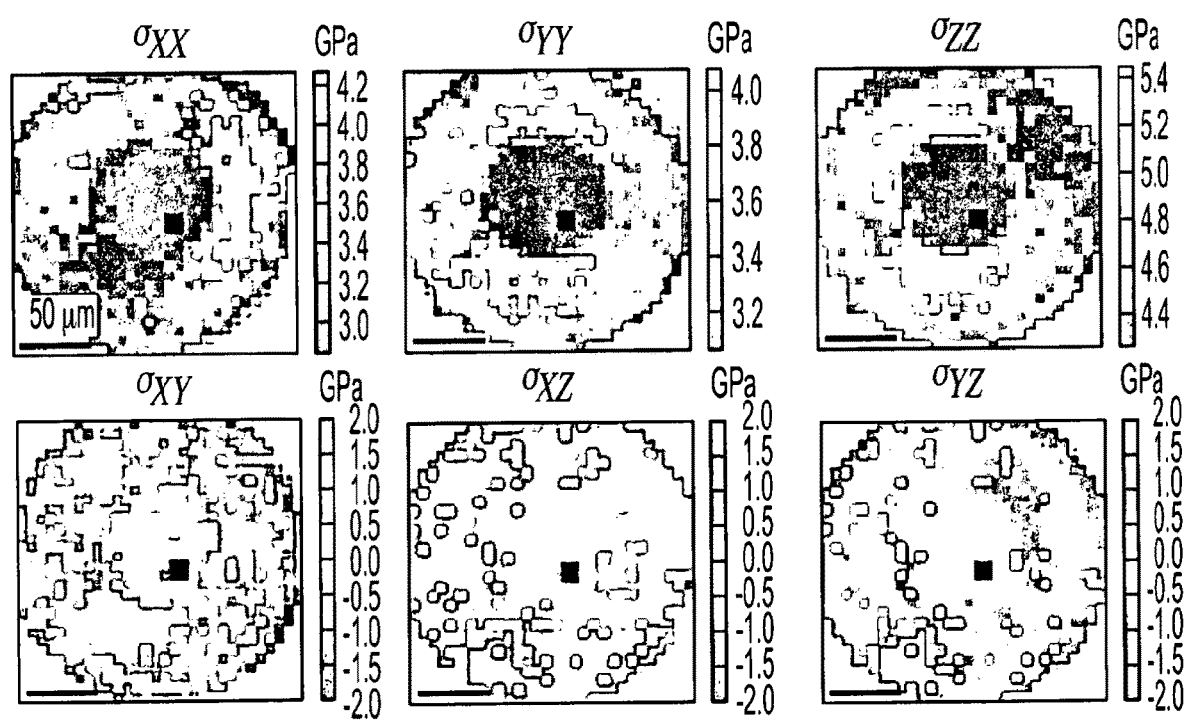
FIG. 13 is a sensor tensor reconstruction for (110)-cut diamond at 4.8 GPa, according to some embodiments.
Figure 14A:
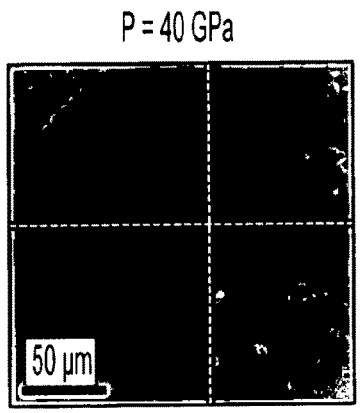
FIG. 14A is a fluorescence image of a culet of (111) diamond at 40 GPa, according to some embodiments.
Figures 14B, 14C:
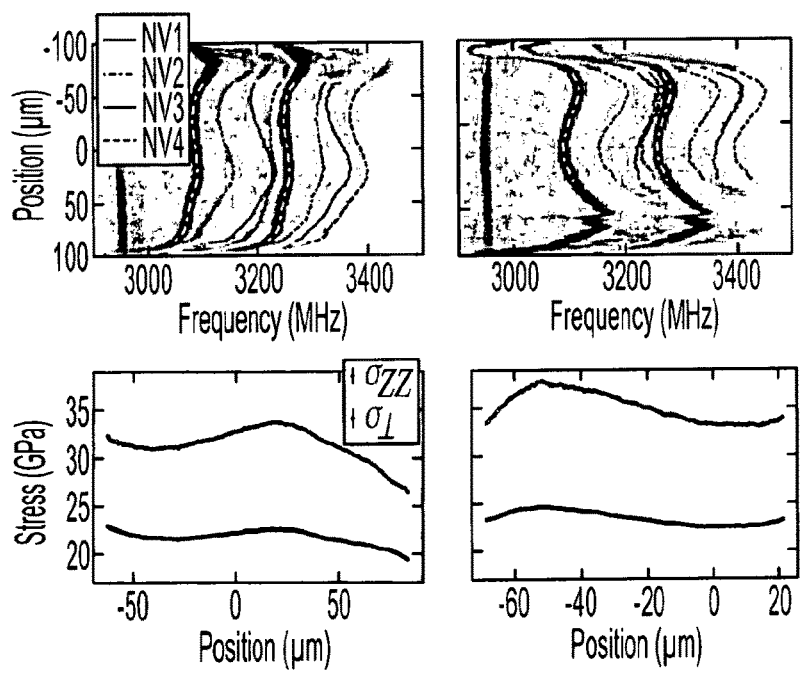
FIGS. 14B and 14C are ODMR spectra and corresponding stress reconstruction of the horizontal and vertical linecuts of FIG. 14A, according to some embodiments.
Figure 14D:
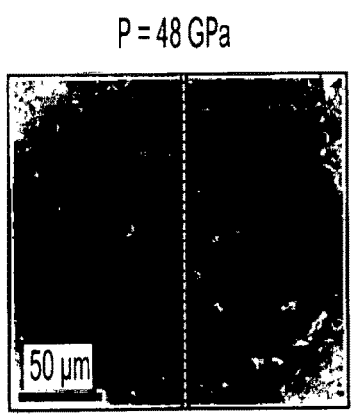
FIG. 14D is a fluorescence image of a culet of (111)-cut diamond at 48 GPa, according to some embodiments.
Figure 14E:
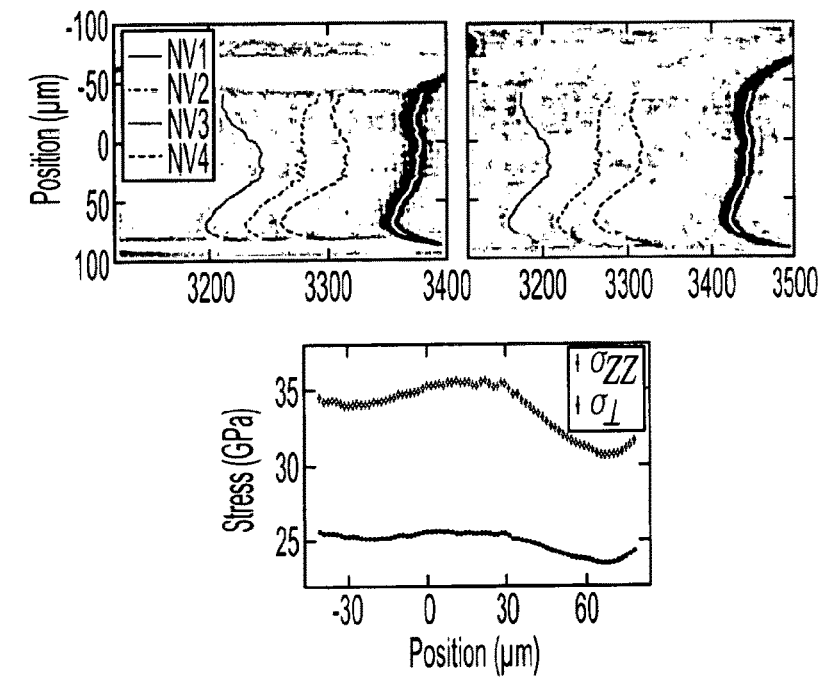
FIG. 14E is an ODMR spectra and corresponding stress reconstruction of the vertical linecut of FIG. 14D, according to some embodiments.

In this section, we discuss our stress reconstruction results for (a) the (111)-cut diamond at 4.9 GPa and 13.6 GPa with methanol/ethanol/water solution (see FIGS. 12A, 12B, 30A and 30B), (b) the (110)-cut diamond at 4.8 GPa with methanol/ethanol/water solution (FIG. 13), and (c) the (111)-cut diamond at 40 GPa and 48 GPa with sodium chloride (FIGS. 14A-14E). In the first two cases, the full stress tensors were obtained by numerically minimizing the least-squared residue with respect to the measured shifting and splitting parameters (i.e. $\Pi_{z,i}$, $\Pi_{\perp,i}$); in particular, we measure a total of six observables—all four shifting parameters and two splitting parameters—which is the minimum information required for the full tensorial reconstruction.

In the last case, we perform a simplified analysis that allows for a partial reconstruction of the stress tensor. Based on the symmetry of the (111)-cut diamond, there is a linear transformation that relates the two azimuthally symmetric normal stresses, $\sigma_{ZZ}$ and $\sigma_\perp = \frac{1}{2}(\sigma_{XX} + \sigma_{YY})$, to two observables: the shifting parameter of the NV crystallographic orientation normal to the surface, $D_{111}$, and the average shifting parameter of the three other crystallographic orientations, $\overline{D}$:

$$\begin{pmatrix} D_{111} \\ \overline{D} \end{pmatrix} = \begin{pmatrix} 2\alpha_1 & \beta_1 \\ \frac{10}{9}\alpha_1 + \frac{8}{9}\beta_1 & \frac{8}{9}\alpha_1 + \frac{1}{9}\beta_1 \end{pmatrix} \begin{pmatrix} \sigma_\perp \\ \sigma_{ZZ} \end{pmatrix} \quad (26)$$

Thus, by measuring only the shifting parameters, we are able to characterize two components of the stress tensor (FIGS. 14A-14E). We further note that at 48 GPa (FIGS. 14D-14E), some of the ODMR resonances have very low contrast, rendering the determination of some shifting parameters ambiguous (see Section 3.3). To perform stress reconstruction without these resonances, we measure multiple ODMR spectra under magnetic fields of fixed direction and varying amplitude; the measured change of the resonance positions, together with the known relative change of the magnetic field amplitude, allows us to extrapolate the values of the remaining shifting parameters.

We note additional remarks as follows. First, we estimate the precision of the full tensor reconstructions from the spatial variations of $\sigma_{ZZ}$ at 4.9 GPa. Assuming the medium is an ideal fluid, one would expect that $\sigma_{ZZ}$ to be flat in the region above the gasket hole. In practice, we observe spatial fluctuations characterized by a standard deviation ≈0.01 GPa; this is consistent with the expected precision based on frequency noise (Table 1). The error bars in the reconstructed stress tensor are estimated using this experimental precision. Each pixel of the stress tensor image is integrated for ~7 min.

Second, the measured values for $\sigma \sim_{ZZ}$ differs from the ruby pressure scale by 10%. This discrepancy is likely explained by inaccuracies in the susceptibility parameters; in particular, the reported susceptibility to axial strain (i.e. $\beta_1$) contains an error bound that is also ~10%. Other potential sources of systematic error include inaccuracies in our calibration scheme or the presence of plastic deformation.

Finally, we note that, in some cases, our full reconstruction procedure yields two degenerate solutions for the non-symmetric stress components; that is, while $\sigma_{ZZ}$ and $\sigma_\perp$ have a unique solution, we find two different distributions for $\sigma_{XX}$, $\sigma_{XY}$, etc. This degeneracy arises from the squared term in the splitting parameter, $$\Pi_{\perp,i} = 2\sqrt{\Pi_{S,\perp}^2 + \Pi_{E,\perp}^2},$$

and the fact we measure only six of the eight observables. Referring to FIGS. 12A-12B, 13 and 30B, we show the solution for the stress tensor that is more azimuthally symmetric, as physically motivated by our geometry.

Finite Element Simulations of the Stress Tensor

Using equations from elasticity theory under the finite element approach, a numerical simulation was coded in ABAQUS for the stress and strain tensor fields in the diamond anvil cell. The diamond anvil cell is approximately axially symmetric about the diamond loading axis, in this case the crystallographic (111) axis (i.e. the Z axis). This permits us to improve simulation efficiency by reducing the initially 3D tensor of elastic moduli to the 2D axisymmetric cylindrical frame of the diamond as follows. Initially, the tensor can be written in 3D with cubic axes $c_{11}=1076$ GPa, $c_{12}=125$ GPa, $c_{44}=577$ GPa. Next, we rotate cubic axes such that the (111) direction is along the Z axis of the cylindrical coordinate system. Finally, the coordinate system is rotated by angle $\theta$ around the Z axis and the elastic constants are averaged over 360° rotation. The resulting elasticity tensor in the cylindrical coordinate system is $$\begin{bmatrix} 1177.5 & 57.4 & 91 & 0 \\ 57.4 & 1211.6 & 57.4 & 0 \\ 91 & 57.4 & 1177.5 & 0 \\ 0 & 0 & 0 & 509.2 \end{bmatrix}.$$

Figure 15A:
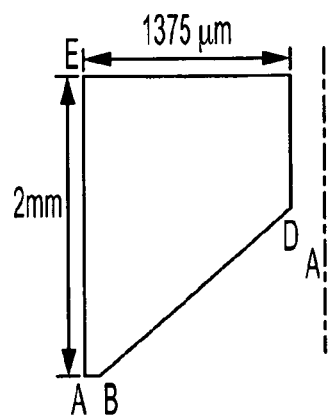
FIG. 15A is a diamond geometry, according to some embodiments.

The geometry of the anvil and boundary conditions (FIGS. 15A-15C) are as follows:

The top surface of the anvil is assumed to be fixed. The distribution of stresses or displacements along this surface does not affect our solution close to the diamond culet line AB.

Figure 16A:
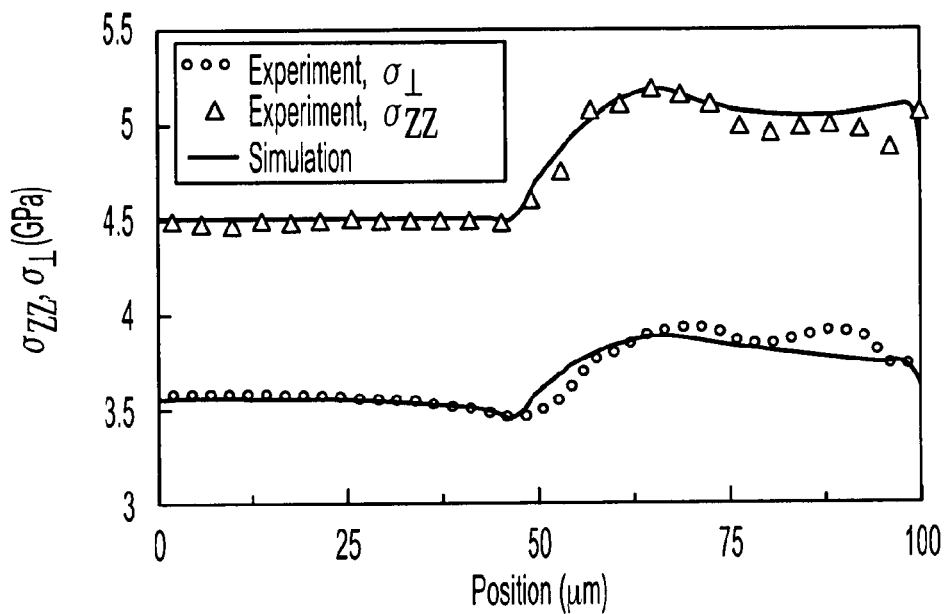
FIG. 16A illustrates the distribution of applied normal stress $\sigma_{ZZ}$ and the mean in-plane stress $\sigma_\perp$ along the culet surface of the diamond from experiment and FEM simulation according to some embodiments.
Figure 16B:
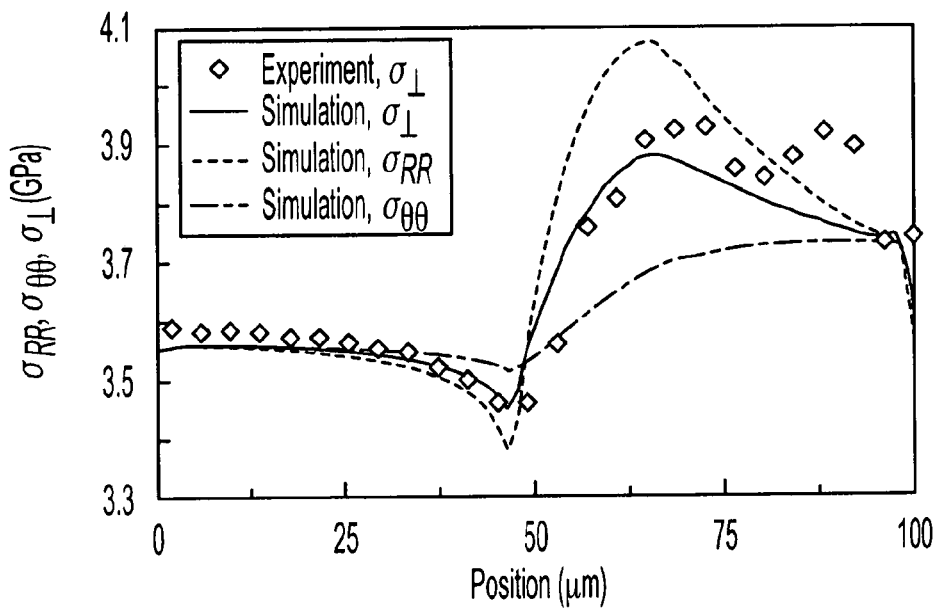
FIG. 16B illustrates the distribution of the mean in-plane stress $\sigma_\perp$ (experimental and simulated) as well as the simulated radial $\sigma_{RR}$ and circumferential $\sigma_{\Theta\Theta}$ stresses along the culet surface of the diamond according to some embodiments.

The normal stress $\sigma_{ZZ}$ along the line AB is taken from the experimental measurements (see FIGS. 30A and 16A-16B). The pressure-transmitting medium/gasket boundary runs along the innermost 47 μm of this radius.

Along the pressure-transmitting medium/anvil boundary (r≤47 μm) and also at the symmetry axis r=0 (line AE) shear stress $\sigma_{RZ}$ is zero. Horizontal displacements at the symmetry axis are also zero.

Figure 15B:
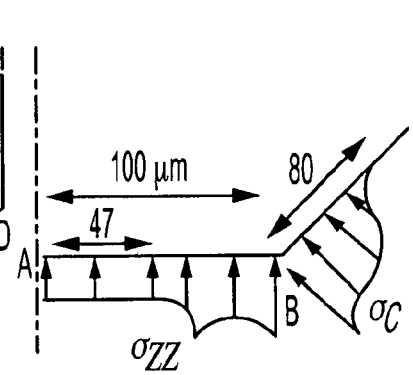
FIG. 15B is an anvil tip with a distribution of applied normal stress, according to some embodiments.
Figure 17:
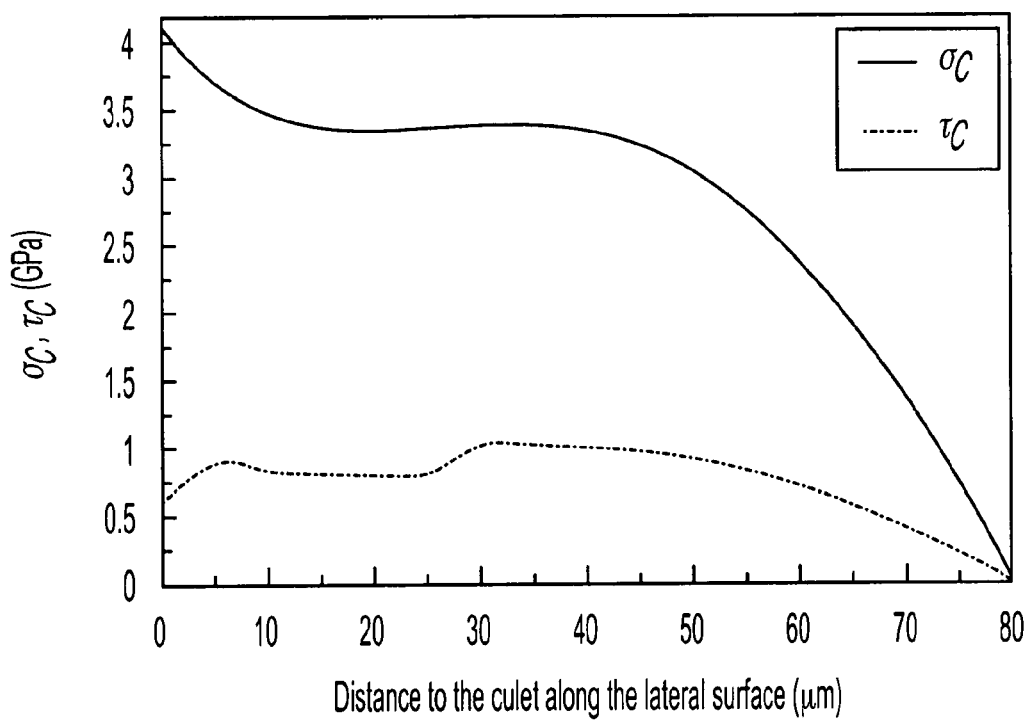
FIG. 17 illustrates the distribution of applied normal and shear stress along the lateral surface of the diamond determined from the best fit of the mean in-plane stress distribution $\sigma_\perp$ to experiment according to some embodiments.

Normal and shear contact stresses along all other contact surfaces are determined from the best fit to the mean in-plane stress distribution $\sigma_\perp = 0.5(\sigma_{RR} + \sigma_{\Theta\Theta})$ measured in the experiment (FIGS. 30A and 16A-16B). We chose to fit to $\sigma_\perp$ rather than to other measured stresses because it has the smallest noise in experiment. With this, the normal stress on the line BD with the origin at point B is found to be $$\sigma_c = 3.3 \times 10^5 x^4 - 7.5 \times 10^4 x^3 + 45 \times 10^3 x^2 - 10^2 x + 4.1, \quad (27)$$

where $\sigma_c$ is in units of GPa, and the position x along the lateral side is in units of mm. The distribution of the normal stresses is shown in FIGS. 15B and 17.

Figure 15C:
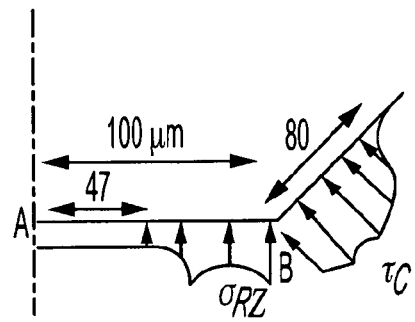
FIG. 15C is an anvil tip with a distribution of applied shear stress, according to some embodiments.

At the contact surface between the gasket and the anvil, a Coulomb friction model is applied. The friction coefficient on the culet is found to be 0.02 and along the inclined surface of the anvil (line BD) is found to vary from 0.15 at point B to 0.3 at 80 μm from the culet. The distribution of shear stresses is shown in FIGS. 15C and 17.

Other Surfaces not Mentioned above are Stress-Free.

Figure 18:
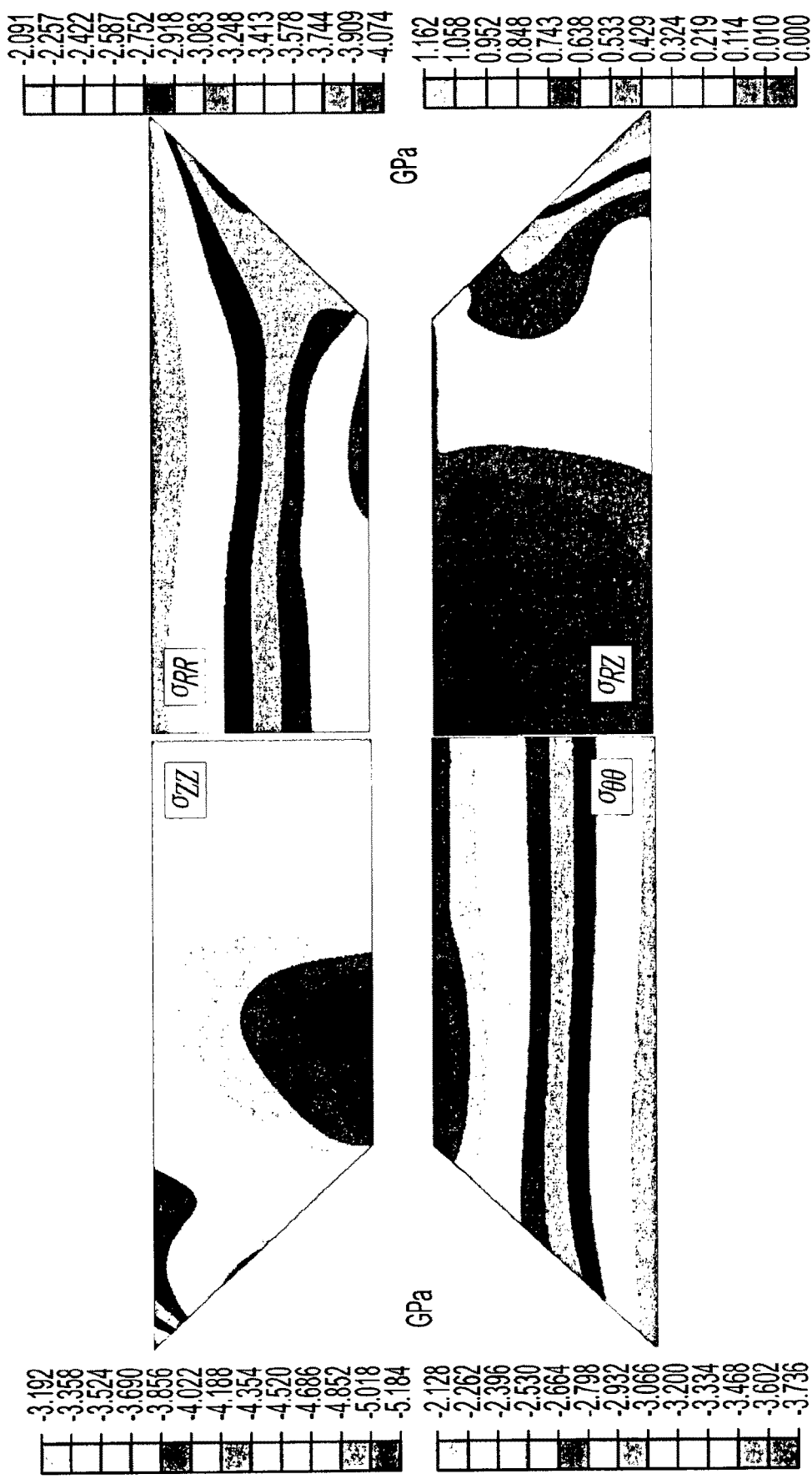
FIG. 18 illustrates the calculated distributions of the components of stress tensor in the anvil for r<150 and z<475 µm according to some embodiments.

The calculated distributions of the stress tensor components near the tip of the anvil are shown in FIG. 18.

Iron Dipole Reconstruction

In this section, we discuss the study of the pressure-induced a↔ε transition in iron. In particular, we provide the experimental details, describe the model used for fitting the data, and outline the procedure to ascertain the transition pressure.

For this experiment, the DAC is prepared with a rhenium gasket preindented to 60 μm thickness and laser drilled with a 100 μm diameter hole. We load a ~10 μm iron pellet, extracted from a powder (Alfa Aesar Stock No. 00737-30), and a ruby microsphere for pressure calibration. A solution of methanol, ethanol and water (16:3:1 by volume) is used as the pressure-transmitting medium.

The focused laser is sequentially scanned across a 10×10 grid corresponding to a ~30×30 μm area of the NV layer in the vicinity of the iron pellet, taking an ODMR spectrum at each point. Each pixel in the grid is integrated for ~3 minutes. As discussed in the examples, the energy levels of the NV are determined by both the magnetic field and the stress in the diamond. Owing to their different crystallographic orientations, the four NV orientations in general respond differently to these two local parameters. As a result, for each location in the scan, eight resonances are observed.

A large bias magnetic field (~180 G), not perpendicular to any of the axes, is used to suppress the effect of the transverse stress in the splitting for each NV orientation. However, the longitudinal stress still induces an orientation-dependent shift of the resonances which is nearly constant across the imaging area, as measured independently (FIG. 10C).

By analyzing the splittings of the NV resonances across the culet, we can determine the local magnetic field and thereby reconstruct the dipole moment of the iron pellet.

To estimate the error in pressure, a ruby fluorescence spectrum was measured before and after the ODMR mapping, from which the pressure could be obtained (A. Dewaele, P. Loubeyre, M. Mezouar, *Phys. Rev. B* 70 (2004)). The pressure was taken to be the mean value, while the error was estimated using both the pressure range and the uncertainty associated with each pressure point.

Extracting Splitting Information

Figures 19A, 19B:
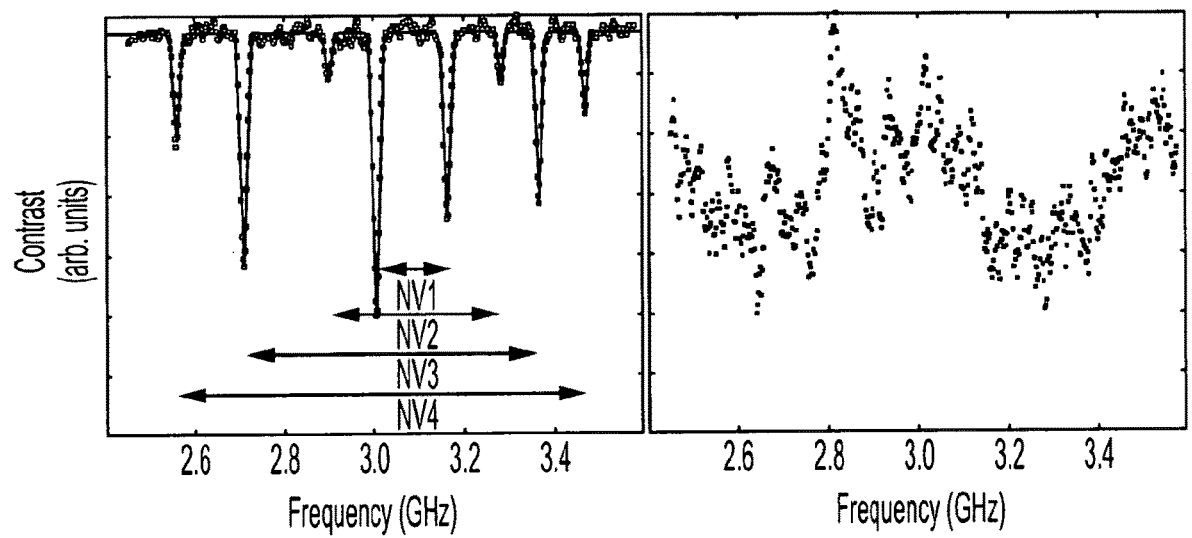
FIG. 19A illustrates an example of a typical spectrum with a fit to eight free Gaussians according to some embodiments.
FIG. 19B illustrates an example of a spectrum for which resonances are broadened and shifted according to some embodiments.

The eight resonances in a typical ODMR spectrum are fit to Gaussian lineshapes to extract the resonance frequency (FIG. 19A). Resonances are paired as in FIG. 29D from outermost resonances to innermost, corresponding to NV orientations with the strongest magnetic field projection to the weakest, respectively. Once identified, we calculate the splitting and magnetic field projection for each NV orientation.

We note that there are two regimes where our spectra may not confidently resolve and identify all the eight resonances. First, at high pressure, the resonance contrast for some NV orientations is diminished, possibly due to a modification of the frequency response of the microwave delivery system. Second, close to or on top of the iron pellet, the resonances are broadened; we attribute this to the large magnetic field gradients (relative to the imaging resolution) caused by the sample. The resulting overlap in spectral features obfuscates the identity of each resonance (FIG. 19B). In both cases, we fit and extract splittings only for the orientations we could identify with certainty.

Point Dipole Model

We model the magnetization of our pellet sample as a point dipole at some location within the sample chamber. The total magnetic field is then characterized by the external applied field, $B_0$, the dipole of the sample, d, and the position of the dipole, r. Because of the presence of a large applied field, we observe that the magnetization of the sample aligns with $B_0$, and thus, we require only the strength of the dipole to characterize its moment, $d=D\hat{B}_0$. We expect the external magnetic field and the depth of the particle to remain nearly constant at different pressures. This is indeed borne out by the data, see Section 5.4. As a result, we consider the external magnetic field $B_0=(-23(7), -160(1), 92(2))$ G and depth of the iron pellet $r_Z=-5(1)$ μm to be fixed.

Due to the dipole of the iron pellet, the magnetic field across the NV layer at position x is given by:

$$B(x) = B_0 + \frac{\mu_0}{4\pi} \frac{1}{|x|^3}(3\hat{x}(d \cdot \hat{x}) - d), \qquad (28)$$

where hats represent unit vectors. At each point, the local field induces a different splitting, $\Delta^{(i)}$, to the 4 NV crystallographic orientations $i \in \{1, 2, 3, 4\}$, measured by diagonalizing the Hamiltonian $H=D_{gs}S_z^2+B_z^{(i)}+B_\perp^{(i)}S_x$, where $B_z=|B\cdot\hat{z}^{(i)}|$ is the projection of B onto the axis of the NV, and $B_\perp^{(i)}=\sqrt{|B^{(i)}|^2-(B_z^{(i)})^2}$, its transverse component. $D_{gs}$ is the zero field splitting of the NV. For each choice of D, $r_X$ and $r_Y$, we obtain a two dimensional map of $\{\Delta^{(i)}\}$. Performing a least squares fit of this map against the experimental splittings determines the best parameters for each pressure point. The error in the fitting procedure is taken as the error in the dipole strength D.

Determining Transition Pressure

Although the $\alpha \leftrightarrow \epsilon$ structural phase transition in iron is a first order phase transition, we do not observe a sharp change in the dipole moment of the sample, observing instead a cross-over between the two magnetic behaviors. We attribute this to the non-hydrostatic behavior of the sample chamber at high pressures. As a result, different parts of the iron pellet can experience different amounts of pressure and, thus, undergo a phase transition at different applied pressures. The measured dipole moment should scale with the proportion of the sample that has undergone the phase transition. This proportion, p(P), should plateau at either 0 or 1 on different sides of the phase transition, and vary smoothly across it. To model this behavior we use a logistic function:

$$p(P) = \frac{1}{e^{B(P-P_c)} + 1}. \qquad (29)$$

The dipole strength is then given by:

$$D = p(P)D_\alpha + [1-p(P)]D_\epsilon, \qquad (30)$$

where $D_\alpha (D_\epsilon)$ is the dipole moment of the sample in the $\alpha$ ($\epsilon$) structural phase and 1/B corresponds to the width of the transition, thus its uncertainty.

Large Error Bar in the 11 GPa Decompression Point

During the decompression, around 11 GPa, we observed a significant drift of the pressure during measurement of the ODMR spectra. Unfortunately, the starting pressure was close to the transition pressure, and the drift in pressure led to a very large change in the pellet's dipole moment throughout the scanning measurement. This is clear in the measured data, see FIG. 20, with the top-half of the map displaying a significantly larger shift with respect to the bottom-half.

To extract the drift in the dipole moment, we divide the two-dimensional map into three different regions, each assumed to arise from a constant value of the dipole moment of the pellet. By fitting to three different dipole moments (given a fixed position, rx and ry) we obtain an estimate of the drift of the dipole moment that allows us to compute an error bar of that measurement. The estimated dipole moment at this pressure point is taken as the midpoint of the three extracted values, while the error is $$\frac{D_{max} + D_{min}}{2}$$

estimates by the range, $$\frac{D_{max} - D_{min}}{2}.$$

Fitting to External Magnetic Field and Depth

In this section we present additional data where we have allowed both the external magnetic field and the depth of the iron pellet to vary in the fitting procedure. The result of the fitting procedure is summarized in FIGS. 21A-21C. FIGS. 21A and 21B respectively show the external magnetic field, and position of the pellet, extracted as a function of pressure (circles correspond to compression while diamonds correspond to decompression). Across the entire range of pressures, the extracted external magnetic field and the depth of the iron pellet is approximately constant. In the final fitting procedure, these values are fixed to their extracted mean (dashed lines). Shaded regions correspond to a standard deviation above and below the mean value. FIG. 21C shows the dipole strength of the iron pellet, extracted when all seven parameters ($B_X$, $B_Y$, $B_Z$, D, $r_X$, $r_Y$, $r_Z$) are fitted. The resulting transitions occur at 17.2 GPa and 10.8 GPa for compression and decompression, respectively. Comparing with the width of the transition (1.3 GPa), these values are in excellent agreement with those presented in the Examples.

In particular, we expect the external magnetic field and the depth of the pellet to remain constant at different pressures. Indeed, we observe this trend in the extracted parameters, FIGS. 21A and 21B. Using the mean and standard deviation, we estimate these values and their errors, quoted in Section 5.2. The final fitting procedure with these values fixed is presented in the Examples.

Gadolinium

Experimental Details

We use a closed cycle cryostat (attocube attoDRY800) to study the P-T phase diagram of Gd. The DAC is placed on the sample mount of the cryostat, which is incorporated with a heater and a temperature sensor for temperature control and readout.

For this experiment, we used beryllium copper gaskets. The Gd sample is cut from a 25 µm thick Gd foil (Alfa Aesar Stock No. 12397-FF) to a size of ~30 µm×30 µm and loaded with cesium iodide (CsI) as the pressure-transmitting medium. A single ruby microsphere loaded into the chamber is used as a pressure scale.

For each experimental run, we start with an initial pressure (applied at room temperature 300 K) and cool the cell in the cryostat. Due to contraction of the DAC components with decreasing temperature, each run of the experiment traverses a non-isobaric path in P-T phase space, FIG. 23A. Using fiducial markers in the confocal scans of the sample chamber, we tracked points near and far from the Gd sample throughout the measurement. By performing ODMR spectroscopy at these points for each temperature, we monitored the magnetic behavior of the sample. More specifically, comparing the spectra between the close point (probe) against the far away one (control), FIGS. 22A-22B, enables us to isolate the induced field from the Gd sample.

Fitting the Phase Transition

There are three different transitions we attempt to identify in Gd's P-T phase diagram: a magnetic transition from PM dhcp to FM dchp; structural phase transitions, either hcp→dhcp or Sm-type↔dhcp; and a magnetic phase transition from PM Sm-type to AFM Sm-type.

In order to extract the transition temperature of the paramagnet to ferromagnet transition from our data, we model the magnetization of our sample near the magnetic phase transition using a regularized mean field theory.

The magnetism of gadolinium is well-described by a three dimensional Heisenberg magnet of core electrons (A. Jayaraman, Metals (Elsevier, 1978), vol. 1 of *Handbook on the Physics and Chemistry of Rare Earths*, pp. 707-747). In the presence of an external magnetic field, the free energy near the critical point is expanded in even powers of the magnetization with a linear term that couples to the external magnetic field:

$$f = -Bm + \frac{\alpha}{2}(T - T_C)m^2 + \frac{\beta}{4}m^4, \tag{31}$$

where m is the magnetization, B is the external magnetic field, $\alpha$ and $\beta$ the expansion coefficients, T the temperature, and $T_C$ the transition temperature. In this treatment, we implicitly assume that $\alpha$ and $\beta$ do not vary significantly with pressure and thus can be taken to be constant across paths in P-T phase space. The magnetization $m_{min}$ is then obtained by minimizing the free energy.

Because our observation region extends far away from the transition, we observe a plateauing of the splittings that emerges from the microscopics of Gd. Using R as the regularization scale and Ã as the maximum magnetization of the sample we propose the simple regularization scheme:

$$m(T, P) = \tilde{A}\frac{m_{min}}{m_{min} + R}. \tag{32}$$

The splitting of the NV group, up to some offset, is proportional to the magnetization of the sample. This proportionality constant, A, captures the relation between magnetization and induced magnetic field, the geometry of sample relative to the measurement spot, as well as the susceptibility of the NV to the magnetic field. The splitting of the NV is then given by:

$$\Delta = A \frac{m_{min}}{m_{min} + R} + c \quad (33)$$

where we incorporated $\tilde{A}$ into A as well. Normalizing $\alpha$ and $\beta$ with respect to B, we obtain six parameters that describe the magnetization profile, directly extracting $T_C$.

In the case of the first order structural phase transitions, similar to that of iron, we take the susceptibility to follow a logistic distribution. We model the observed splitting as:

$$\Delta = \frac{A}{e^{B(T-T_C)} + 1} + c \quad (34)$$

Fitting to the functional form provides the transition temperature $T_C$. Error bar is taken as largest between 1/B and the fitting error.

In the case of the paramagnetic to antiferromagnetic transition, we use the mean field susceptibility across the phase transition of the system. The susceptibility across such transition is peaked at the transition temperature:

$$\chi(T) \propto \begin{cases} \frac{1}{T - \theta_p} & T > T_c \\ C \frac{3L'(H/T)}{T - \theta_p 3L'(H/T)} & T < T_c \end{cases} \quad (35)$$

where C is chosen to ensure continuity of x, L'(x) is the derivative of the Langevin function L(x), H is a measure of the applied field, and $\theta_p$ is the asymptotic Curie point. Finally, we fit the observed splitting to:

$$\Delta = A_\chi(T; T_c, H, \theta_p) + c \quad (36)$$

where, as before, A captures both the geometric effects, as well as the response of the chosen NV group to the magnetic field.

Additional Data

In this section we present the data for the different paths taken in P-T phase and the resulting fits. Table 2 summarizes the observations for all experimental runs. FIGS. 23A-23O contain the data used in determining the linear pressure dependence of the hcp phase. FIGS. 24A-24D comprises the data used in determining the transition to the dhcp phase, either via the FM hcp to PM dhcp transition, FIG. 24B, or via the difference in susceptibilities between PM Sm-type and PM dhcp of Gd, FIGS. 24C and 24D. We begin the experiment below 2 GPa and thus in the hcp structure, while for beginning above 2 GPa, we expect the system to be in Sm-type. Finally, FIGS. 25A-25B contain the data where we observe a change in the susceptibility of Gd that occurs at the purported Sm-type PM to AFM transition.

Recreating the P-T Phase Diagram of Gd

The rich magnetic behavior of Gd is partially dependent on its structural phases, captured in the sequence: hexagonal closed packed (hcp) to Samarium (Sm) type at ~2 GPa, and then to double hexagonal closed packed (dhcp) at ~6 GPa. In particular, while the paramagnetic (PM) phase of hcp orders to a ferromagnet (FM), the PM phase of Sm-type orders to an antiferromagnet (AFM) (A. Jayaraman, Metals (Elsevier, 1978), vol. 1 of Handbook on the Physics and Chemistry of Rare Earths, pp. 707 747). Similarly, dhcp undergoes a PM to magnetically ordered phase transition.

For experimental runs with initial pressures <2 GPa (runs 1-3, 5-9, 11-13, 17-19), we observe a PM↔FM phase transition in hcp Gd. In agreement with previous studies, we see a linear decrease of the Curie temperature with increasing pressure up to ~4 GPa (D. D. Jackson, V. Malba, S. T. Weir, P. A. Baker, Y. K. Vohra, Phys. Rev. B 71, 184416 (2005); D. B. McWhan, A. L. Stevens, Phys. Rev. 139, A682 (1965); T. Iwamoto, M. Mito, M. Hidaka, T. Kawae, K. Takeda, Physica B: Condensed Matter 329-333, 667 (2003). Proceedings of the 23rd International Conference on Low Temperature Physics). Notably, prior studies have shown a structural transition from hcp to Sm-type at 2 GPa (G. K. Samudrala, G. M. Tsoi, S. T. Weir, Y. K. Vohra, High Press. Res. 34, 385 (2014); D. B. McWhan, A. L. Stevens, Phys. Rev. 139, A682 (1965); J. Akella, G. S. Smith, A. P. Jephcoat, J. Phys. Chem. Solids 49, 573 (1988)), which is believed to be "sluggish" (D. B. McWhan, A. L. Stevens, Phys. Rev. 139, A682 (1965); D. B. McWhan, A. L. Stevens, Phys. Rev. 139, A682 (1965)). This is indeed consistent with our observation that the linear dependence of the Curie temperature persists well into the Sm-type region, suggesting the existence of both structural phases over our experimental timescales.

TABLE 2

Summary of all experimental runs in the P-T phase diagram, indexing either a decrease or increase in temperature during this path, and the observed phase transitions. Each group of runs, between double lines in the table, corresponds to a different sample.

| Run | Direction | Phase transition | Remarks, visible in FIG. |
|---|---|---|---|
| 1 | Heat-up | hcp (FM) → hcp (PM) | New sample, FIG. S16B |
| 2 | Cool-down | hcp (PM) → hcp (FM) | FIG. S16C |
| 3 | Cool-down | hcp (PM) → hcp (FM) | FIG. S16D |
| 4 | Cool-down | No observation | Probably starting in Sm due to large initial pressure |
| 5 | Cool-down | hcp (PM) → hcp (FM) | New sample, FIG. S16E |
| 6 | Heat-up | hcp (FM) → hcp (PM) | FIG. S16F |
| 7 | Cool-down | hcp (PM) → hcp (FM) | FIG. S16G |
| 8 | Heat-up | hcp (FM) → hcp (PM) | FIG. S16H |
| 9 | Cool-down | hcp (PM) → hcp (FM) → dhcp (PM) | FIG. S16I, S17B |
| 10 | Cool-down | Weak evidence for Sm (PM) → Sm (AFM) | Probably starting in Sm due to metastability, FIG. S18B |
| 11 | Cool-down | hcp (PM) → hcp (FM) | New sample, FIG. S16J |
| 12 | Heat-up | hcp (FM) → hcp (PM) | FIG. S16K |
| 13 | Cool-down | hcp (PM) → hcp (FM) | FIG. S16L |
| 14 | Cool-down | Weak evidence for Sm (PM) → dhcp (PM) | Probably starting in Sm due to large initial pressure |
| 15 | Cool-down | Weak evidence for Sm (PM) → dhcp (PM) | Probably starting in Sm due to metastability, FIG. S17C |
| 16 | Heat-up | Weak evidence for dhcp (PM) → Sm (PM) | FIG. S17D |
| 17 | Cool-down | hcp (PM) → hcp (FM) | New sample, FIG. S16M |
| 18 | Heat-up | hcp (FM) → hcp (PM) | FIG. S16N |
| 19 | Cool-down | hcp (PM) → hcp (FM) and start of transition to dhcp (PM) | FIG. S16O |

Furthermore, in run 9 (Table 2 and FIGS. 25A-25B), we observe a complete loss of FM signal when pressures exceed ~6 GPa at ~150 K, in good agreement with the previously reported phase transition from hcp (FM) to dhcp (PM) structure (A. Jayaraman, Metals (Elsevier, 1978); vol. 1 of *Handbook on the Physics and Chemistry of Rare Earths*, pp. 707-747; G. K. Samudrala, G. M. Tsoi, S. T. Weir, Y. K. Vohra, High Press. Res. 34, 385 (2014); D. B. McWhan, A. L. Stevens, *Phys. Rev.* 139, A682 (1965)). Upon performing a similar path in P-T space (run 19), we observe the same behavior. In contrast to the previous slow hcp to Sm-type transition, we believe that the equilibrium timescale for the hcp (FM) to dhcp (PM) transition is much faster at this temperature.

After entering the dhcp structure (run 9), we no longer observe a clear FM signal from the sample even after heating to 315 K and depressurizing <0.1 GPa. This can be explained by the retention of dhcp or Sm-type structure in the sample. Previous studies, suggesting that the Sm-type phase in Gd is metastable up to ambient pressure and temperature (A. Jayaraman, Metals (Elsevier, 1978), vol. 1 of *Handbook on the Physics and Chemistry of Rare Earths*, pp. 707-747), corroborate that our sample is likely still in the Sm-type structural phase. It is not too surprising, that by continuing to cool down and walking along a slightly different P-T path, we observe only a small change in the NV splitting at ~m150 K and ~5 GPa as we cross the purported Sm-type PM to AFM phase boundary (run 10 in Table 2) (A. Jayaraman, Metals (Elsevier, 1978), vol. 1 of *Handbook on the Physics and Chemistry of Rare Earths*, pp. 707-747; G. K. Samudrala, G. M. Tsoi, S. T. Weir, Y. K. Vohra, *High Press. Res.* 34, 385 (2014); D. B. McWhan, A. L. Stevens, *Phys. Rev.* 139, A682 (1965)).

Moreover, the metastable dynamics of hcp to Sm-type transitions are strongly pressure and temperature dependent, suggesting that different starting points (in the P-T phase diagram) can lead to dramatically different behaviors. Indeed, by preparing the sample above 2 GPa at room temperature (run 4), we no longer detect evidence for a ferromagnetic Curie transition, hinting the transition to the Sm-type structure. Instead, we only observe a small change in the NV splitting at ~6 GPa and ~170 K, which could be related to the presence of different paramagnetic susceptibilities of the Sm-type and dhcp structural phases. Interestingly, by cycling temperature across the transition (runs 14-16 in Table 2), we observe negligible hysteresis, suggesting fast equilibration of this structural transition.

Noise Spectroscopy

In order to perform magnetic noise spectroscopy of Gd at temperatures ranging from 273 K to 340 K, we attach a small chunk of Gd foil (100 μm×100 μm×25 μm) close to a microwave wire on a Peltier element with which we tune the temperature. Instead of millimeter-scale diamonds as before, we use nano-diamonds (Adámas Nanotechnologies, ~140 nm average diameter). The nano-diamonds are prepared in solution and allowed to evaporate onto the Gd foil to minimize the distance to the surface of our sample.

With no external field applied, all eight resonances of the NVs inside the nano-diamonds are found within our resolution to be at the zero-field splitting $D_{gs}$ for either para- and ferromagnetic phase of Gd, leading to a larger resonance contrast since we can drive all NVs with the same microwave frequency. Measuring the NV's spin relaxation time $T_1$ under these circumstances is equivalent to ascertaining the AC magnetic noise at ~2.87 GHz.

For this purpose, we utilize the following pulse sequence to measure $T_1$. First, we apply a 10 μs laser pulse to intialize the spin into the $|m_s=0\rangle$ state. After laser pumping, we let the spin state relax for a variable time τ, before turning on a second laser pulse to detect the spin state (signal bright). We repeat the exact same sequence once more, but right before spin detection, an additional NV π-pulse is applied to swap the $|m_s=0\rangle$ and $|m_s=±1\rangle$ populations (signal dark). The difference between signal bright and dark gives us a reliable measurement of the NV polarization (FIG. 32D top inset) after time τ. The resulting $T_1$ curve exhibits a stretched exponential decay $\propto e^{-(\tau/T_1)^\alpha}$, with α~0.65 (FIG. 26).

By sweeping the Peltier current over a range of ~3.5 A, we adjust the temperature of the sample from 273 K to 340 K, therefore determining the temperature dependence of $T_1$.

This procedure is performed on two different nano-diamonds on top of the Gd flake to confirm that the signal is not an artifact. Furthermore, this is contrasted with an additional measurement at a nano-diamond far away from the Gd foil, exhibiting no temperature dependence of $T_1$.

Theoretical Analysis of $T_1$

The depolarization time $T_1$ of NV centers shows a distinct drop when we decrease the temperature T to across the ferromagnetic phase transition of Gd, FIG. 32D. Assuming that Johnson noise is the main contribution, because we are working at a fixed small transition frequency (ω~2.87 GHz) and in the thermal limit ($\hbar\omega \ll k_B T$), we can consider the DC limit. In this case, we have $T_1 \propto \rho(T)/T$, where $\rho(T)=1/\tau(T)$ is the DC resistivity (K. Agarwal, et al., *Phys. Rev. B* 95, 155107 (2017)). Importantly, previously measurements of the resistivity curve for Gd show a kink at $T_C$, with a sharper temperature dependence below $T_C$ (66,67). However, this sudden change in slope is insufficient to explain our observations of $T_1$; in particular, given the magnitude of the resistivity, the change in temperature dominates the $T_1$ behavior. This implies that $T_1$ should increase in the ferromagnetic phase if the sole contribution is bulk Johnson noise, whereas observations indicate otherwise.

A hint to the resolution of this puzzle comes from two observations. First, NV centers drop-cast onto Gd samples are very close to the sample, and hence far more sensitive to the surface than the bulk. Second, the surface of Gd is well known to show a higher ferromagnetic transition temperature than the bulk; the drop in $T_1$ starts at a larger temperature (≈300 K) compared to the bulk $T_C$≈292 K. These observations strongly suggest that the NV is detecting a large drop of surface resisitivity as we lower T across the surface critical temperature, and this dominates over the small drop of bulk resistivity in the observed behavior.

In order to quantitatively estimate the relative contribution of the surface to the bulk, we provide, following K. Agarwal, et al., *Phys. Rev. B* 95, 155107 (2017), the contribution to the noise for a single two-dimensional layer at a distance z from the probe for a sample with conductivity σ(T)

$$\frac{1}{T_1} \propto N(\omega) = \frac{k_B T \mu_0^2 \sigma(T)}{16\pi z^2}. \qquad (37)$$

Here we have assumed that the optical conductivity has a smooth DC limit (true for typical metals) and taken the extreme thermal limit to neglect the small frequency dependence of σ. Gd has a hcp structure with c≈2a, so we approximate the sample as being composed of decoupled two-dimensional layers and add their individual contributions to the noise. If the distance from the surface to the probe is d, the surface thickness is D (infinite bulk thickness), and the surface and bulk conductivity are denoted by $\sigma_2$ and $\sigma_b$ respectively, then we have:

$$\frac{1}{T_1} \propto T\left[\int_d^{d+D} dz \frac{\sigma_s(T)}{z^2} + \int_{d+D}^{\infty} dz \frac{\sigma_b(T)}{z^2}\right] = \quad (38)$$

$$T\sigma_s(T)\left(\frac{1}{d} - \frac{1}{d+D}\right) + \frac{T\sigma_b(T)}{d+D}.$$

Eq. (38) makes it explicit that when D/d is an O(1) number (i.e. the surface thickness is of the order of sample-probe distance) the surface and bulk contributions are comparable. On the other hand, if D/d≪1, the bulk noise dominates. For our drop-cast nano-diamonds on the surface of Gd, we can estimate D≈10 nm, given the distinct surface signatures in the density of states even 6 layers deep (L. Oroszlány, A. Deák, E. Simon, S. Khmelevskyi, L. Szunyogh, *Phys. Rev. Lett.* 115, 096402 (2015)). We also estimate the average distance as approximately half the radius of a nano-diamond, d≈50 nm. Therefore, we see that, for our samples, a large rise in surface conductivity can cause a significant increase in magnetic noise, even if the bulk conductivity remains roughly constant across the transition to the ferromagnetic phase. Hence, we conjecture that an enhanced surface conductivity below the surface critical temperature $T_{c,s}$ is responsible for the observed drop in $T_1$.

From H. E. Nigh, S. Legvold, F. H. Spedding, *Phys. Rev.* 132, 1092 (1963); P. Jacobsson, B. Sundqvist, *Phys. Rev. B* 40, 9541 (1989); R. V. Colvin, S. Legvold, F. H. Spedding, *Phys. Rev.* 120, 741 (1960), we know that both the bulk residual resistivity and the phonon contribution to the resistivity is quite small, and electron scattering below the bulk $T_C$ is dominated by magnetic excitations. Since $T_C$=292 K is much larger than the Debye temperature $\Theta_D$≈170 K (P. Jacobsson, B. Sundqvist, *Phys. Rev. B* 40, 9541 (1989); V. Y. Bodryakov, A. A. Povzner, O. G. Zelyukova, *Phys. Solid State* 41, 1138 (1999)), the phonon contribution to scattering is expected to be linear in T near $T_C$. Above $T_C$, the slope dρ/dT for Gd is very small. Hence the majority of scattering below $T_C$ takes place due to magnetic correlations, which, below $T_C$, changes resistivity by $d\rho/dT \propto t^{2\beta-1}$ where $t=|T_C-T|/T_C$ (J. B. Kogut, *Rev. Mod. Phys.* 51, 659 (1979)). β can be significantly different from 1, leading to a cusp in ρ(T) at $T_C$. For the bulk, we can write:

$$\rho_b(T) = \rho_b(T_C) - \alpha_{ph}\left(\frac{T_C - T}{T_C}\right) - \alpha_{mag}\left(\frac{T_C - T}{T_C}\right)^{2\beta}\Theta(T_C - T) \quad (39)$$

Above $T_C$, the singularity in dρ/dT is of the form $t^{-\alpha}$. However, for both Heisenberg and Ising universality classes of ferromagnetic transitions, a is close to zero (α≈−0.1), and the surface enhancement of the surface density of states is negligible. Therefore, for $T>T_C$ we assume that the surface conductivity is identical to the bulk conductivity. Moreover, the scattering from uncorrelated core-spins should be constant at high temperatures away from $T_C$, so the slope dρ/dT is entirely from phonons for $T \lesssim T_c$. With this, we can estimate $\alpha_{ph}$≈27 μΩcm using the data for T between 350 and 400 K (R. V. Colvin, S. Legvold, F. H. Spedding, Phys. Rev. 120, 741 (1960)). Using the data for ρ at T=280 K in (H. E. Nigh, S. Legvold, F. H. Spedding, *Phys. Rev.* 132, 1092 (1963)) to extract $\alpha_{mo,o}$ and β≈0.35 for the three dimensional Heisenberg model, which is believed to describe the ordering of local moments in Gd (30), we obtain $\alpha_{mo,o}$:

$$\rho_b(T) - \rho_b(T_C) = \quad (40)$$

$$-4\mu\Omega \text{ cm} = -\alpha_{ph}\left(\frac{12}{292}\right) - \alpha_{mag}\left(\frac{12}{292}\right)^{0.7} \Rightarrow \alpha_{mag} \approx 27\mu\Omega \text{ cm}$$

This gives the bulk resistivity as a function of temperature, but it does not replicate the experimental observations (FIG. 28, see FIG. 27). To this end, we postulate a similar critical behavior at the surface but with surface critical exponent $\beta_s$ for the magnetization. Given the easy axis the surface magnetic phase transition is plausibly in the Ising universality class, with $\beta_s$=0.125 (J. B. Kogut, *Rev. Mod. Phys.* 51, 659 (1979)). Therefore, on the surface, we have:

In absence of evidence otherwise, we take $\alpha_{ph,s}=\alpha_{ph}$ (same value as in the bulk). However, $\alpha_{mag,s}$ can be significantly enhanced relative to the bulk value. Since this factor depends sensitively on surface details, we treat it as a free parameter in the fit. FIG. 28 shows a good fit to our data with the estimates $\alpha_{mag,s}=7\alpha_{mag}$≈189 μΩcm, surface thickness D=10 nm≈17c, and sample-probe distance d=50 nm (we have used an overall proportionality factor for the fit).

We note that spin-fluctuations in Gd can also cause the NV polarization to relax. Although such fluctuations are negligible in the paramagnetic phase as our sample-probe distance is much larger than the lattice spacing (K. Agarwal, et al., *Phys. Rev. B* 95, 155107 (2017)), gapless critical fluctuations and spin-wave modes can indeed have a larger contribution to magnetic noise. However, the magnon contribution is related to magnon occupancies and decreases with decreasing temperature (S. Chatterjee, J. F. Rodriguez-Nieva, E. Demler, *Phys. Rev. B* 99, 104425 (2019)), implying that $T_1$ should increase as one lowers temperature in the ferromagnetic phase. This is inconsistent with the behavior we observe. Bulk critical spin-fluctuations should make the largest contribution at $T_C$, which is also not observed.

Further Examples for Stress and Magnetic Measurements

According to some embodiments, there is utilized an ensemble of defects, such as NV centers (for example, ~1 ppm density) implanted, for example ~50 nm from the surface of the diamond anvil culet (FIGS. 29A and 29B). Referring to (FIGS. 29A and 29B), which illustrate a schematic of the DAC geometry, two opposing anvils are compressed by a nonmagnetic steel cell and cubic boron nitride backing plates. NV centers may be initialized and read out using a 532 nm laser focused to a diffraction-limited spot (~600 nm) which is scanned across the culet surface. Referring to FIG. 29B, the DAC sample chamber is defined by the gasket-anvil assembly (diagram not to scale), and the sample chamber is loaded with the sample of interest, a pressure-transmitting medium, and a single ruby microsphere (for pressure calibration). A ~50 nm layer of NV centers is embedded into the diamond anvil directly below the sample chamber.

Each NV center represents an atomic-scale defect (i.e. a substitutional nitrogen impurity adjacent to a vacancy) inside the diamond lattice and exhibits an S=1 electronic spin ground state [M. W. Doherty, et al., *Physics Reports* 528, 1 (2013)]. In the absence of external fields, the $|m_S=\pm 1\rangle$ spin sublevels are degenerate and separated by $D_{gs}=(27)\cdot 2.87$ Hz from the $m_s=0\rangle$ state. Both the nature and energy of these spin states are sensitive to local changes in stress, temperature, magnetic and electric fields (FIG. 29C) [V. Acosta, et al., *Phys. Rev. Lett.* 104, 070801 (2010); J. Maze, et al.,*Nature* 455, 644 (2008); F. Dolde, et al., *Nat. Phys.* 7, 459 (2011); P. Ovartchaiyapong, K. W. Lee, B. A. Myers, A. C. B. Jayich, *Nat. Commm.* 5, 4429 (2014); M. W. Doherty, et al., *Phys. Rev. Lett.* 112, 047601 (2014); M. S. J. Barson, et al., *Nano Letters* 17, 1496 (2017); L. G. Steele, et al., *Appl. Phys. Lett.* 111, 221903 (2017)]. Referring to FIG. 29C top, stress both shifts and splits the $m_s=\pm 1$ sublevels at first order; in particular, the shifting is characterized by $\Pi_2=\alpha_1(\sigma_{xx}+\sigma_{yy})+\beta_1\sigma_{zz}$, and the splitting is characterized by $\Pi_\perp^2=[\alpha_2(\sigma_{yy}-\sigma_{xx})+\beta_2(2\sigma_{xz})]^2+[\alpha_2(2\sigma_{xy})+\beta_2(2\sigma_{yz})]^2$. Referring to FIG. 29C bottom, an axial magnetic field splits the $m_s=\pm 1$ sublevels at first order, but a transverse magnetic field leads to shifts only at second order.

The spin states can be optically initialized and read out, as well as coherently manipulated via microwave fields. Their energy levels can be probed, for example, by performing ODMR spectroscopy where one measures a change in the NV's fluorescence intensity when an applied microwave field is on resonance between two NV spin sublevels (FIG. 29D), thus enabling sensing of a variety of external signals over a wide range of environmental conditions [G. Kucsko, et al., *Nature* 500, 54 EP (2013); F. Casola, T. van der Sar, A. Yacoby, *Nat. Rev. Mater.* 3, 17088 EP (2018); T. Mittiga, et al., *Phys. Rev. Lett.* 121, 246402 (2018)]. Referring to FIG. 29D, a representative ODMR spectrum from an NV center ensemble under an applied magnetic field is shown.

Examples of Stress and Magnetic Field Sensing

For the sensing of stress and magnetic fields, the NV is governed by the Hamiltonian [M. S. J. Barson, et al., *Nano Letters* 17, 1496 (2017); P. Udvarhelyi, V. O. Shkolnikov, A. Gali, G. Burkard, A. Pályi, *Phys. Rev. B* 98, 075201 (2018)], $H=H_0+H_B+H_S$, with $H_0=D_{gs}S_z^2$ (zero-field splitting), $H_B=\gamma_B \vec{B}\cdot\vec{S}$ (Zeeman splitting), and $$H_S=[\alpha_1(\sigma_{xx}+\sigma_{yy})+\beta_1\sigma_{zz}]S_z^2+[\alpha_2(\sigma_{yy}-\sigma_{xx})+\beta_2(2\sigma_{xz})](S_y^2-S_x^2)+[\alpha_2(2\sigma_{xy})+\beta_2(2\sigma_{yz})](S_xS_y+S_yS_x)$$

capturing the NV's response to the local diamond stress tensor, $\sigma$ (FIG. 29C). In the above, $\gamma_B(2\pi)\times 2.8$ MHz/G is the gyromagnetic ratio, $\{\alpha_{1,2}, \beta_{1,2}\}$ are the stress susceptibility coefficients [M. W. Doherty, et al., *Phys. Rev. Lett.* 112, 047601 (2014); M. S. J. Barson, et al., *Nano Letters* 17, 1496 (2017); L. G. Steele, et al., *Appl. Phys. Lett.* 111, 221903 (2017)], $\hat{z}$ is the NV orientation axis, and $\hat{x}$ is defined such that the xz-plane contains one of the carbon-vacancy bonds (FIG. 29E), where in FIG. 29E each pair of resonances in FIG. 29D corresponds to one of the four NV crystallographic orientations. In general, the resulting ODMR spectra exhibit eight resonances arises from the four possible crystallographic orientations of the NV (FIG. 29D). By extracting the energy shifting and splitting of the spin sublevels for each NV orientation group, one obtains an overconstrained set of equations enabling the reconstruction of either the (six component) local stress tensor or the (three component) vector magnetic field.

In the experiments, a miniature DAC such as in FIGS. 29A and 29B, was used consisting of two opposing anvils compressing either a beryllium copper or rhenium gasket [E. Sterer, M. P. Pasternak, R. D. Taylor, *Rev. Sci. Instrum* 61, 1117 (1998)]. The sample chamber defined by the gasket and diamond-anvil culets is filled with a pressure-transmitting medium (either a 16:3:1 methanol/ethanol/water solution or cesium iodide) to provide a quasi-hydrostatic environment. Microwave excitation was applied via a 4 μm thick platinum foil compressed between the gasket and anvil pavilion facets (FIGS. 8A-8B); scanning confocal microscopy as the light source (with a transverse diffraction-limited spot size ~600 nm, containing ~$10^3$ NVs) provided two-dimensional ODMR maps across the culet (chamber wall 112).

We begin by probing the stress tensor across the culet surface (up to P=48 GPa as shown in FIGS. 14A-14E using two different cuts of diamond (i.e. (111)-cut and (110)-cut culet). For a generic stress environment, the intrinsic degeneracy associated with the four NV orientations is not sufficiently lifted, implying that individual resonances cannot be resolved. In order to resolve these resonances while preserving the stress contribution, we sequentially tune a well-controlled external magnetic field to be perpendicular to each of the different NV orientations. For each perpendicular field choice, three of the four NV orientations exhibit a strong Zeeman splitting proportional to the projection of the external magnetic field along their symmetry axes. This enables one to resolve the stress information encoded in the remaining NV orientation, whereas the other three groups of NVs are spectroscopically split away. Using this method, sufficient information may be obtained to extract the full stress tensor, as depicted in FIGS. 30A and 30B, which show full tensorial reconstruction of the stresses in a (111)-cut diamond anvil. A number of intriguing features are observed at the interface between the culet and the sample chamber 110, which provide insight into both elastic (reversible) and plastic (irreversible) deformations.

At low pressures (P=4.9 GPa), the normal stress along the loading axis, $\sigma_{ZZ}$, is spatially uniform (FIG. 30A), whereas all shear stresses, $\{\sigma_{XY}, \sigma_{XZ}, \sigma_{YZ}\}$, are minimal (FIG. 30B). Referring to FIG. 30A, Spatially resolved maps of the loading stress (left) and mean lateral stress (right), $\sigma_\perp = \frac{1}{2}(\sigma_{XX}+\sigma_{YY})$, across the culet surface. In the inner region, where the culet surface contacts the pressure-transmitting medium (16:3:1 methanol/ethanol/water), the loading stress is spatially uniform, whereas the lateral stress is concentrated towards the center; this qualitative difference is highlighted by a linecut of the two stresses, and reconstructed by finite element analysis. The black pixels indicate where the NV spectrum was obfuscated by the ruby microsphere. Referring to FIG. 30B, there is provided a comparison of all stress tensor components in the fluid-contact region at P=4.9 GPa and P=13.6 GPa. At P=13.6 GPa, the pressure-transmitting medium has entered its glassy phase and we observe a spatial gradient in the loading stress $\sigma_{ZZ}$ (inset).

$\{\hat{X}, \hat{Y}, \hat{Z}\}$ corresponds to the lab frame while $\{\hat{x}, \hat{y}, \hat{z}\}$ corresponds to the NV frame (see FIGS. 29A and 29B). These observations are in agreement with conventional stress continuity predictions for the interface between a solid and an ideal fluid [G. Falkovich, *Fluid Mechanics* (Cambridge University Press, 2018), second edn]. Moreover, $\sigma_{ZZ}$ is consistent with the independently measured pressure inside the sample chamber (via ruby fluorescence), demonstrating the NV's potential as a built-in pressure scale [A. Dewaele, P. Loubeyre, M. Mezouar, *Phys. Rev. B* 70 (2004)].

In contrast to the uniformity of $\sigma_{ZZ}$, the field profile for the mean lateral stress, $\sigma_\perp \equiv \frac{1}{2}(\sigma_{XX}+\sigma_{YY})$, exhibits a concentration of forces toward the center of the culet (FIG. 30A). Using the measured $\sigma_{ZZ}$ as a boundary condition, finite element simulations were performed to reproduce this spatial pattern.

Upon increasing pressure (P=13.6 GPa), a spatial gradient in $\sigma_{ZZ}$ emerges (FIG. 30B, inset). This qualitatively distinct feature is consistent with the solidification of the pressure-transmitting medium into its glassy phase above $P_g \approx 10.5$ GPa [S. Klotz, J.-C. Chervin, P. Munsch, G. Le Marchand, *J Phys D Appl Phys.* 42, 075413 (2009)]. This demonstrates the ability to characterize the effective viscosity of solids and liquids under pressure. To characterize the sensitivity of our system, ODMR spectroscopy was performed with a static applied magnetic field and pressure under varying integration times and extract the frequency uncertainty from a Gaussian fit. A stress sensitivity of $\{0.023, 0.030, 0.027\}$ GPa/$\sqrt{Hz}$ was observed for hydrostatic, average normal, and average shear stresses, respectively. This is consistent with the theoretically derived stress sensitivity, $$\eta_S \sim \frac{\Delta \nu}{\xi C \sqrt{Nt}} = \{0.017, 0.022, 0.020\} \text{ GPa}/\sqrt{Hz},$$

respectively, where N is the number of NV centers, $\Delta \nu$ is the linewidth, $\xi$ is the relevant stress susceptibility, t is the integration time, and C is an overall factor accounting for measurement infidelity. In combination with diffraction-limited imaging resolution, this sensitivity opens the door to measuring and ultimately controlling the full stress tensor distribution across a sample.

Regarding the stress tensor, we have shown that for stress tensor imaging, we sequentially tune an external magnetic field to be perpendicular to each of the different NV orientations. For each perpendicular field choice, three of the four NV orientations exhibit a strong Zeeman splitting proportional to the projection of the external magnetic field along their symmetry axes. Crucially, this enables one to resolve the stress information encoded in the remaining NV orientation, while the other three groups of NVs are spectroscopically split away. Using this method, we obtain sufficient information to extract the full stress tensor.

Having characterized the stress environment, we now utilize the NV centers as an in situ magnetometer to detect phase transitions inside the high-pressure chamber. Analogous to the case of stress, a magnetic sensitivity of 12 $\mu T / \sqrt{Hz}$ is observed, in agreement with the theoretically estimated value, $$\eta_B \sim \frac{\delta \nu}{C \gamma_R B \sqrt{Nt}} = 8.8 \mu T/\sqrt{Hz}.$$

Assuming a point dipole located a distance d~5 µm from the NV layer, this corresponds to an experimentally measured magnetic moment sensitivity: $7.5 \times 10^{-12}$ emu/$\sqrt{Hz}$ (see FIG. 29F).

The magnetization of iron as it undergoes the pressure-driven $\alpha \leftrightarrow \epsilon$ phase transition from body-centered cubic (bcc) to hexagonal close-packed (hcp) crystal structures [R. Taylor, M. Pasternak, R. Jeanloz, *J. Appl. Phys* 69, 6126 (1991)] was directly measured. This structural phase transition is accompanied by the depletion of the magnetic moment, and it is this change in the iron's magnetic behavior that was imaged. Our sample chamber (presure change) is loaded with a ~10 µm polycrystalline iron pellet as well as a ruby microsphere (pressure scale), and an external magnetic field $B_{ext} \sim 180$ G was applied. As before, by performing a confocal scan across the culet, a two-dimensional magnetic resonance map is acquired (FIGS. 31A-31J). Regarding FIGS. 31A-31J, these drawings describe imaging iron's $\alpha \leftrightarrow \epsilon$ phase transition including applying an external magnetic field ($B_{ext} \sim 180$ G) induces a dipole moment in the polycrystalline iron pellet that generates a spatially varying magnetic field across the culet of the diamond anvil. By mapping the ODMR spectra across the culet surface, the local magnetic field which characterizes the iron pellet's magnetization is reconstructed.

FIGS. 31A-31C provide a comparison between the measured ODMR spectra (dark regions correspond to resonances) and the theoretical resonance positions (different shades correspond to different NV crystallographic orientations) across vertical spatial cuts (i.e. Y-position indicates location along the black-dashed line shown in the 2D scans below) at pressures 9.6 GPa, 17.2 GPa and 20.2 GPa, respectively (16:3:1 methanol/ethanol/water solution). FIGS. 31D-31F provide a map of the measured energy difference of a particular NV crystallographic orientation (FIGS. 31A-31C). Black pixels correspond to ODMR spectra where the splitting could not be accurately extracted owing to large magnetic field gradients (FIGS. 19A-19C). FIGS. 31G-31I provide a theoretical reconstruction of the energy differences shown in FIGS. 31A-31C. Data depicted in (FIGS. 31A-31C) are taken along the thin black dashed lines. FIG. 31J shows a measured dipole moment of the iron pellet as a function of applied pressure at room temperature, for both compression and decompression. Based on the hysteresis observed (~6 GPa), we find the critical pressure $P_C = 13.6 \pm 3.6$ GPa, in excellent agreement with previous studies [28].

At low pressures (FIG. 31A), near the iron pellet, significant shifts in the eight NV resonances were observed, owing to the presence of a ferromagnetic field from the iron pellet. As pressure was increased (FIG. 31B), these shifts begin to diminish, signaling a reduction in the magnetic susceptibility. Finally, at the highest pressures (P~22 GPa, FIG. 31C), the magnetic field from the pellet reduced by over two orders of magnitude.

To quantify this phase transition, the full vector magnetic field produced by the iron sample from the aforementioned two-dimensional NV magnetic resonance maps (FIGS. 31D-31F) was reconstructed. This information was then compared with the expected field distribution at the NV layer inside the culet, assuming the iron pellet generates a dipole field. This enables extraction of an effective dipole moment as a function of applied pressure (FIG. 31G). In order to identify the critical pressure, we fit the transition using a logistic function. This procedure yields the transition at P=16.7±0.7GPa (FIG. 31J).

In addition to changes in the magnetic behavior, another key signature of this first order transition is the presence of hysteresis. This was investigated by slowly decompressing the diamond anvil cell and monitoring the dipole moment; the decompression transition occurs at P=10.5±0.7 GPa (FIG. 31J), suggesting a hysteresis width of approximately ~6 GPa, consistent with a combination of intrinsic hysteresis and finite shear stresses in the methanol/ethanol/water pressure-transmitting medium [R. Taylor, M. Pasternak, R. Jeanloz, *J. Appl. Phys* 69, 6126 (1991)]. Taking the average of the forward and backward hysteresis pressures, a critical pressure of $P_c = 13.6 \pm 3.6$ GPa was found in excellent agreement with independent measurements by Mössbauer spectroscopy, where $P_c \approx 12$ GPa (FIG. 31J) [R. Taylor, M. Pasternak, R. Jeanloz, *J. Appl. Phys* 69, 6126 (1991)].

The integration of the disclosed platform into a cryogenic system allows for spatially resolved in situ measurements across the pressure-temperature (P-T) phase diagram of materials. Specifically, the magnetic P-T phase diagram of the rare-earth element gadolinium (Gd) was investigated up to pressures P≈8 GPa and between temperatures T=25–340 K. Owing to an interplay between localized 4f electrons and mobile conduction electrons, Gd represents an interesting playground for studying metallic magnetism. In particular, the itinerant electrons mediate RKKY-type interactions between the local moments, which in turn induce spin-polarization of the itinerant electrons [L. Oroszlány, A. Deák, E. Simon, S. Khmelevskyi, L. Szunyogh, *Phys. Rev. Lett.* 115, 096402 (2015)]. Moreover, much like its other rare-earth cousins, Gd exhibits a series of pressure-driven structural phase transitions from hexagonal close-packed (hcp) to samarium-type (Sm-type) to double hexagonal close-packed (dhcp) (FIG. 32A-FIG. 32D) [A. Jayaraman, Metals (Elsevier, 1978), vol. 1 of *Handbook on the Physics and Chemistry of Rare Earths*, pp. 707-747]. The interplay between these different structural phases, various types of magnetic ordering and metastable transition dynamics leads to a complex magnetic P-T phase diagram [L. Oroszlány, A. Deák, E. Simon, S. Khmelevskyi, L. Szunyogh, *Phys. Rev. Lett.* 115, 096402 (2015); A. Jayaraman, Metals (Elsevier, 1978), vol. 1 of *Handbook on the Physics and Chemistry of Rare Earths*, pp. 707-747; G. K. Samudrala, G. M. Tsoi, S. T. Weir, Y. K. Vohra, *High Press. Res.* 34, 385 (2014].

In analogy to our measurements of iron, the magnetic ordering of a Gd flake was monitored via the NV's ODMR spectra at two different locations inside the culet: close to and far away from the sample (the latter to be used as a control) (FIGS. 22A-22B). Because of thermal contraction of the DAC (which induces a change in pressure), each experimental run traces a distinct non-isobaric path through the P-T phase diagram (FIG. 32C). In addition to these DC magnetometry measurements, the NV sensors were also montiored in a complementary mode, i.e. as a noise spectrometer.

Gd's well-known ferromagnetic Curie transition at ambient pressure was characterized, which induces a sharp jump in the splitting of the NV resonances at $T_C$=292.2±0.1 K (FIG. 32D). As depicted in FIG. 32A, upon increasing pressure, the transition shifts to lower temperatures, and consonant with its second order nature, no hysteresis is observed. The data was fit and $T_C$ extracted by solving a regularized Landau free-energy equation. Combining all of the low pressure data (FIG. 32C), a linear decrease was found in the Curie temperature at a rate: $dT_C/dP$=−18.7±0.2 K/GPa, consistent with prior studies via both DC conductivity and AC-magnetic susceptibility [A. Jayaraman, Metals (Elsevier, 1978), vol. 1 of *Handbook on the Physics and Chemistry of Rare Earths*, pp. 707 747]. Surprisingly, this linear decrease extended well into the Sm-type phase. Upon increasing pressure above ~6 GPa (path [b] in FIG. 32C), the loss of ferromagnetic (FM) signal (FIG. 4B) was observed, indicating a first order structural transition into the paramagnetic (PM) dhcp phase [A. Jayaraman, Metals (Elsevier, 1978), vol. 1 of *Handbook on the Physics and Chemistry of Rare Earths*, pp. 707 747]. In stark contrast to the previous Curie transition, there is no revival of a ferromagnetic signal even after heating up (~315 K) and significantly reducing the pressure (<0.1 GPa).

The linear decrease of $T_C$ well beyond the ~2 GPa structural transition between hcp and Sm-type is consistent with the "sluggish" equilibration between these two phases at low temperatures [A. Jayaraman, Metals (Elsevier, 1978), vol. 1 of *Handbook on the Physics and Chemistry of Rare Earths*, pp. 707-747]. The metastable dynamics of this transition are strongly pressure and temperature dependent, suggesting that different starting points (in the P-T phase diagram) can exhibit dramatically different behaviors [A. Jayaraman, Metals (Elsevier, 1978), vol. 1 of *Handbook on the Physics and Chemistry of Rare Earths*, pp. 707-747]. To highlight this, two different transitions were probed out of the paramagnetic Sm-type phase by tailoring specific paths in the P-T phase diagram. By taking a shallow path in P-T space, a small change was observed in the local magnetic field across the structural transition into the PM dhcp phase at ~6 GPa (FIG. 32C, path [c], diamonds). By taking a steeper path in P-T space, one can also investigate the magnetic transition into the antiferromagnetic (AFM) Sm-type phase at ~150 K (FIG. 32C, path [d], triangle). In general, these two transitions are extremely challenging to probe via DC magnetometry because their signals arise only from small differences in the susceptibilities between the various phases (FIGS. 25A and 25B).

Regarding the magnetic field vector, we have shown we can apply a bias magnetic field, not perpendicular to any of the axes, to suppress the effect of the transverse stress in the splitting for each NV orientation. By analyzing the 4 different splittings of the NV resonances across the sample, we can determine the local magnetic field vector.

A complementary NV sensing modality based upon noise spectroscopy was demonstrated, which can probe phase transitions even in the absence of a direct magnetic signal [S. Chatterjee, J. F. Rodriguez-Nieva, E. Demler, *Phys. Rev. B* 99, 104425 (2019)]. Specifically, returning to Gd's ferromagnetic Curie transition, the NV's depolarization time, $T_1$, was monitored the phase transition was crossed (FIG. 32D). Normally, the NV's $T_1$ time is limited by spin-phonon interactions and increases dramatically as one decreases temperature. Here, a strikingly disparate behavior was observed. In particular, using nanodiamonds drop-cast on a Gd foil at ambient pressure, the NV $T_1$ was found to be nearly temperature independent in the paramagnetic phase, before exhibiting a kink and subsequent decrease the ferromagnetic phase was entered (FIG. 32D). Two intriguing observations were noted: first, one possible microscopic explanation for this behavior is that $T_1$ is dominated by Johnson-Nyquist noise from the thermal fluctuations of charge carriers inside Gd [S. Kolkowitz, et al., *Science* 347, 1129 (2015)]. Gapless critical spin fluctuations or magnons in the ordered phase, although expected, are less likely to cause this signal. Second, the Curie temperature was observed, as identified via $T_1$-noise spectroscopy, to be ~10 K higher than that observed via DC magnetometry (FIG. 32D). Similar behavior has previously been reported for the surface of Gd [L. Oroszlány, A. Deák, E. Simon, S. Khmelevskyi, L. Szunyogh, *Phys. Rev. Lett.* 115, 096402 (2015); H. Tang, et al., *Phys. Rev. Lett.* 71, 444 (1993)], suggesting that noise spectroscopy could be more sensitive to surface physics.

Further stress characterization of other fluids and solids using the platform described herein may provide insights into mechanical phenomena such as viscous flow, plastic deformation, and pressure-dependent yield strength. Such information is challenging to obtain via either numerical finite-element simulations or more conventional experimental methods and may ultimately allow control of the deviatoric-as well as normal-stress conditions in high pressure experiments [B. Feng, V. I. Levitas, R. J. Hemley, *Int. J. Plasticity* 84, 33 (2016)].

The high sensitivity and close proximity of the sensor enables probing signals in settings that are beyond the capabilities of existing techniques (FIG. 29F); such settings include for example, nuclear magnetic resonance (NMR) at picoliter volumes [P. Kehayias, et al., *Nat. Commm.* 8, 188

(2017)] and single grain remnant magnetism [D. R. Glenn, et al., *Geochem. Geophys.* 18, 3254 (2017)], as well as phenomena that exhibit spatial textures such as magnetic skyrmions [Y. Dovzhenko, et al., *Nat. Commm.* 9, 2712 (2018)] and superconducting vortices [L. Thiel, et al., *Nat. Nanotechnol*. 11, 677 (2016)].

Although as described above the high pressure device utilizes NV centers, the techniques developed here can be readily extended to other atomic defects. For instance, recent developments on all-optical control of silicon-vacancy centers in diamond may allow for microwave-free stress imaging with improved sensitivities [M. Atatu¨re, D. Englund, N. Vamivakas, S.-Y. Lee, J. Wrachtrup, *Nat. Rev. Mater.* 3, 38 (2018)]. In addition, one can consider defects in other anvil substrates beyond diamond; indeed, recent studies have shown that moissanite (6H silicon carbide) hosts optically active defects that show promise as local sensors [M. Atatu¨re, D. Englund, N. Vamivakas, S.-Y. Lee, J. Wrachtrup, *Nat. Rev. Mater.* 3, 38 (2018)]. In contrast to millimeter-scale diamond anvils, moissanite anvils can be manufactured at the centimeter-scale or larger, and therefore support larger sample volumes that ameliorate the technical requirements of many experiments. Finally, the suite of sensing capabilities previously demonstrated for NV centers (i.e. electric, thermal, gryroscopic precession etc.) can now straightforwardly be extended to high pressure environments, opening up a large range of experiments for quantitatively characterizing materials at such extreme conditions.

Gasket

FIG. 33 illustrates an ultra-high pressure cell 200 according to some embodiments. The high pressure cell 200 includes a pair of opposing diamonds 115 and a gasket material 116. Additionally the cell includes an insulasting material 119 between a region of the gasket material 116 and the diamond 115. Beneficially, the insulasting material 119 may prevent electrical contact between a wire, for example electrode 162 in FIGS. 5, 8A and 8B, and a conducting gasket material.

The insulating material 119 may be, for example, a mixture of epoxy and cubic boron nitride, diamond power, or alumina, for example. The gasket material 116 may be, for example, rhenium.

FIG. 36 illustrates a Rabi time trace using the high pressure cell of FIG. 33.

Higher Pressure Cell

For higher pressure measurements, an excitation source with a higher photon energy may be used. Studies of the $NV^-$ center have detailed a shift of the zero-phonon line (ZPL) at 5.5 meV/GPa. The application of pressure, therefore, causes an increase in the energy difference in the electronic ground and excited states. Crucially, the ZPL is predicted to cross 532 nm at pressures of 60 GPa. Above these pressures, the electronic spin of the $NV^-$ center can no longer be accessed using green laser excitation. Consequently, to extend NV sensing to megabar pressure regimes, higher excitation energy may be used. Adhering to the off-resonant excitation scheme to optically pump and read out the $NV^-$ spin, we have used a broadband laser at 405 nm to observe electron spin resonance at high pressures. FIGS. 34 and 35 are ODMR measurements which show an improvement in signal contrast using the higher excitation energy 405 nm as compared to 532 nm for pressures of 4.26 and 103.97 GPa, respectively.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

What is claimed is:

1. A diamond anvil cell comprising a diamond culet, said diamond culet comprising a sensor integrated therein, wherein said sensor integrated in said diamond culet comprises at least one diamond crystal defect, and
    wherein said at least one diamond crystal defect is a nitrogen-vacancy (NV) atomic defect in which two adjacent carbon atoms are replaced by a nitrogen atom and a lattice vacancy.

2. The diamond anvil cell according to claim 1, wherein said sensor integrated in said diamond culet is at least one of a pressure sensor, a temperature sensor, a sensor for use in measuring magnetic fields from samples under pressure, a sensor for use in measuring electric fields from samples under pressure, a sensor for use in determining stress in a high pressure sample chamber, or a sensor for use in determining elastic and/or plastic deformations of a material.

3. A pressure device comprising:
    a pressure chamber having a chamber wall, said chamber wall comprising a sensor integrated within said chamber wall;
    an electromagnetic radiation source arranged to provide electromagnetic radiation to the defects:
    a detector arranged to detect electromagnetic radiation from the defects; and
    a processor controller arranged to control the electromagnetic radiation source to provide electromagnetic radiation to the defects, and to receive a signal from the detector based on electromagnetic radiation detected from defects,
    wherein said sensor integrated in said chamber wall comprises defects.

4. The pressure device according to claim 3, wherein said sensor integrated in said chamber wall is at least one of a pressure sensor, a temperature sensor, a sensor for use in measuring magnetic fields from samples under pressure, a sensor for use in measuring electric fields from samples under pressure, a sensor for use in determining stress gradients of a material in the pressure chamber, or a sensor for use in determining elastic and/or plastic deformations of a material.

5. The pressure device according to claim 3, wherein said defects comprise optical defects.

6. The pressure device according to claim 3, wherein said chamber wall comprises a diamond culet, and said defects comprise diamond crystal defects.

7. The pressure device according to claim 6, wherein the NV atomic defects are formed by at least one of nitrogen implantation, growth of diamond containing nitrogen, or electron irradiation.

8. The pressure device according to claim 3, wherein the sensor is arranged to sense properties of a material within the pressure chamber caused by a pressure within the pressure chamber.

9. The pressure device according to claim 3, wherein the processor controller is configured to determine a property of a material within the pressure chamber caused by a pressure within the pressure chamber.

10. The pressure device according to claim 3, further comprising:
   a radio frequency (RF) source arranged to provide an RF magnetic field to the defects.

11. The pressure device according to claim 10, wherein the processor controller is arranged to control the electromagnetic radiation source and the RF source to perform at least one of optically detected magnetic resonance measurements, quantum coherence measurements or depopulation measurements.

12. The pressure device according to claim 10, wherein the processor controller is arranged to control the electromagnetic radiation source and the RF source to perform wide field measurements.

13. The pressure device of claim 3, wherein the chamber wall includes a first portion comprising the defects, and a second portion comprising a gasket material contacting the first portion.

14. A pressure device comprising:
   a pressure chamber having a chamber wall, said chamber wall comprising a sensor integrated within said chamber wall, wherein said sensor integrated in said chamber wall comprises defects
   wherein said chamber wall comprises a diamond culet, and said defects comprise diamond crystal defects, and
   wherein said diamond crystal defects are nitrogen-vacancy (NV) atomic defects in which two adjacent carbon atoms are replaced by a nitrogen atom and a lattice vacancy.

15. A pressure device comprising:
   a pressure chamber having a chamber wall, said chamber wall comprising a sensor integrated within said chamber wall,
   wherein said sensor integrated in said chamber wall comprises defects, and
   wherein the chamber wall comprises silicon carbide and said defects comprise silicon carbide atomic defects.

16. A pressure device comprising:
   a pressure chamber having a chamber wall, said chamber wall comprising a sensor integrated within said chamber wall,
   wherein said sensor integrated in said chamber wall comprises defects,
   wherein the chamber wall includes a first portion comprising the defects, and a second portion comprising a gasket material contacting the first portion, and
   wherein the first portion is part of a diamond material, and further comprising a conducting material, and an insulating material disposed between the gasket material and the conducting material.

* * * * *